United States Patent [19]
Ueda et al.

[11] Patent Number: 5,739,887
[45] Date of Patent: Apr. 14, 1998

[54] LIQUID CRYSTAL DISPLAY DEVICE WITH REDUCED FRAME PORTION SURROUNDING DISPLAY AREA

[75] Inventors: Shiro Ueda, Mobara, Japan; Shunichi Kumaoka, Cupertino, Calif.; Masumi Sasuga, Mobara, Japan; Katsuhiko Shibata, Mobara, Japan; Yoichi Igarashi, Mobara, Japan; Naoto Kobayashi, Mobara, Japan

[73] Assignees: Hitachi, Ltd., Tokyo; Hitachi Device Engineering Co., Ltd., Chiba-ken, both of Japan

[21] Appl. No.: 542,962

[22] Filed: Oct. 13, 1995

[30] Foreign Application Priority Data

| Oct. 21, 1994 | [JP] | Japan | 6-256426 |
| Oct. 21, 1994 | [JP] | Japan | 6-256427 |
| Oct. 21, 1994 | [JP] | Japan | 6-256428 |

[51] Int. Cl.[6] .............................................. G02F 1/1345
[52] U.S. Cl. ........................... 349/149; 349/151; 349/152
[58] Field of Search ................................ 349/149, 150, 349/151, 190, 152, 189, 154, 153; 345/204

[56] References Cited

U.S. PATENT DOCUMENTS

| 4,394,067 | 7/1983 | Spruijt et al. ............... 350/334 |
| 5,016,986 | 5/1991 | Kawashima et al. ......... 349/150 |
| 5,200,847 | 4/1993 | Mawatari et al. ............ 349/151 |
| 5,212,576 | 5/1993 | Yoshioka ..................... 349/150 |
| 5,398,128 | 3/1995 | Tajima et al. ................ 349/150 |
| 5,448,387 | 9/1995 | Kurokawa et al. ........... 349/150 |
| 5,453,858 | 9/1995 | Yamazaki .................... 349/151 |

FOREIGN PATENT DOCUMENTS

| 60-180132 | 9/1985 | Japan . |
| 60-238817 | 11/1985 | Japan . |
| 61-80226 | 4/1986 | Japan ........................... 349/151 |
| 1-6926 | 11/1989 | Japan . |
| 2-132418 | 5/1990 | Japan ........................... 349/150 |
| 2-248926 | 10/1990 | Japan . |
| 2-287434 | 11/1990 | Japan . |
| 3-29923 | 2/1991 | Japan . |
| 3-191330 | 8/1991 | Japan ........................... 349/149 |
| 3-271791 | 12/1991 | Japan ........................... 349/150 |
| 4-50819 | 2/1992 | Japan ........................... 349/150 |
| 4-62946 | 2/1992 | Japan ........................... 349/149 |
| 5-100240 | 4/1993 | Japan ........................... 349/150 |
| 2 160 693 | 12/1985 | United Kingdom ........... 349/149 |

*Primary Examiner*—William L. Sikes
*Assistant Examiner*—James A. Dudek
*Attorney, Agent, or Firm*—Antonelli, Terry, Stout, & Kraus, LLP

[57] ABSTRACT

A liquid crystal display device. The liquid crystal display device has a peripheral circuit including a liquid crystal display having drive ICs COG-packaged on a transparent substrate, and a foldable multi-layered flexible substrate having two or more conductor layers, so that the compact packaging can be realized to reduce EMI noise and the number of parts. The liquid crystal display device may also include a display controller having two or more display control integrated circuit elements packaged therein, and drive ICs mounted by a chip-on-glass packaging on two sides of a liquid crystal display panel, usually, on the longer sides, so that the display controller excellent in the temperature resistance and advantageous in compact and a video signal line driving circuit board are uniformly arranged at the upper and lower sides of a screen. As a result, the vertical positioning of the screen can be made proper to take an advantage in the compact packaging. Further, the liquid crystal display device may have a peripheral circuit board positioned in an outer periphery of a seal port recessed to avoid the projection of the seal port and in which a fluorescent tube has its two lamp cables arranged around four sides of a liquid crystal display element, so that the substrate at the seal port side and the lamp cable of a side light type back light can be compactly packaged.

17 Claims, 44 Drawing Sheets

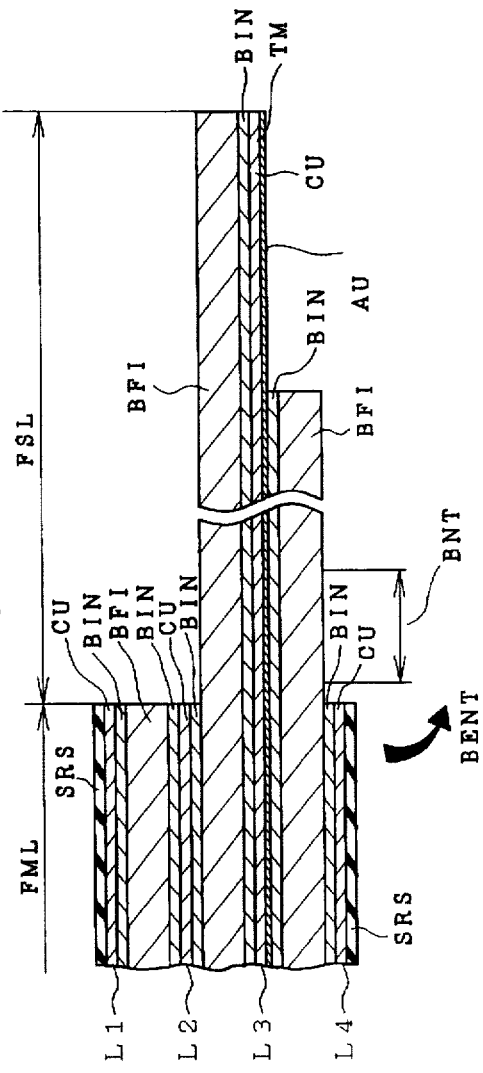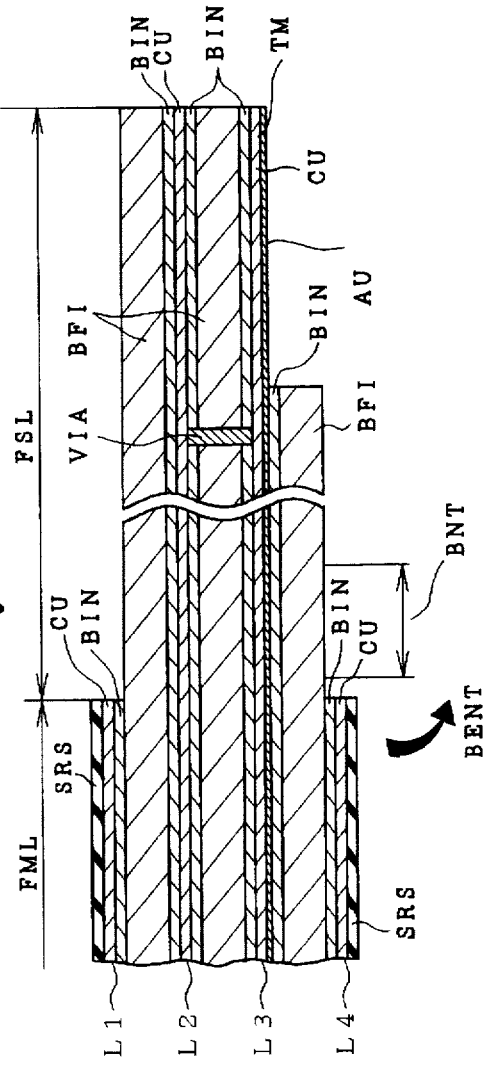

FIG. 11A
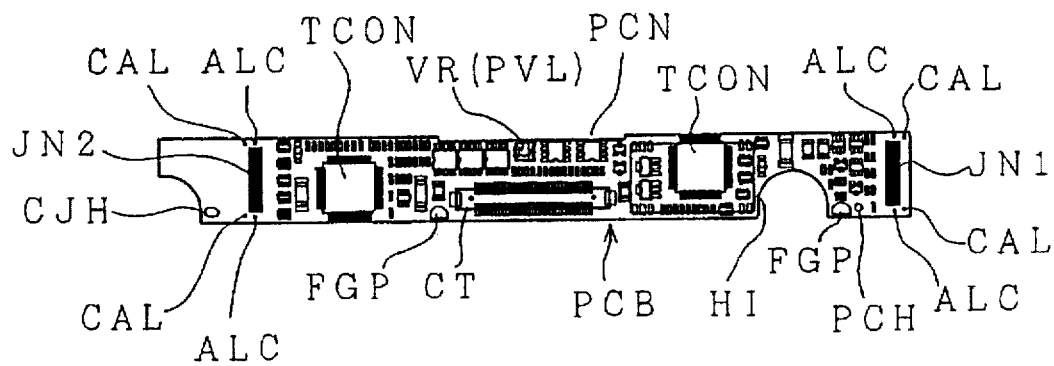
FIG. 11B(1)    FIG. 11B(2)
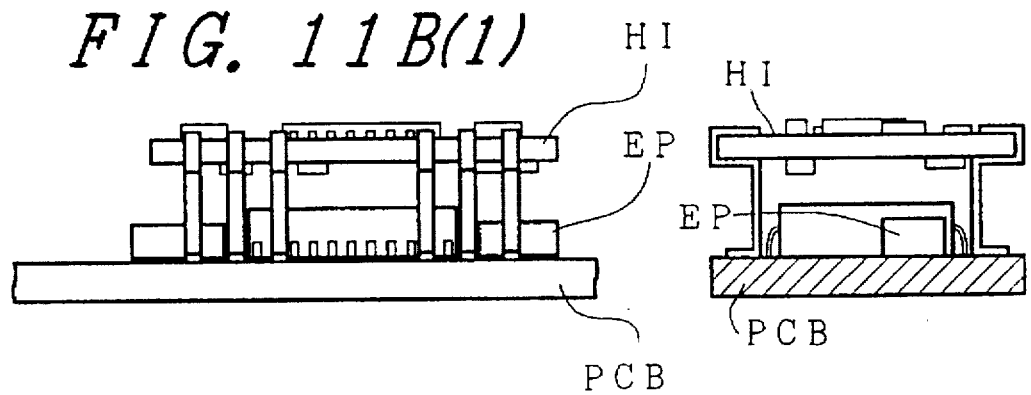
FIG. 11C
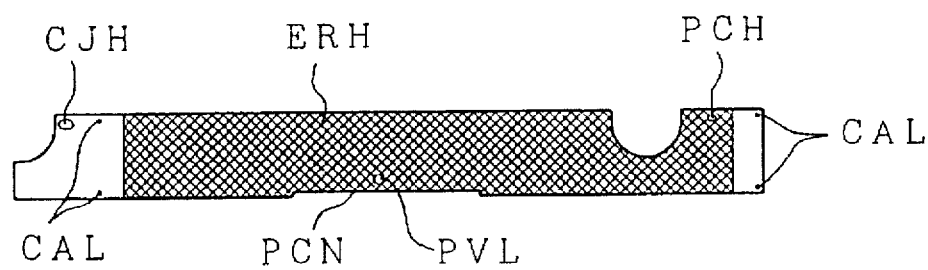

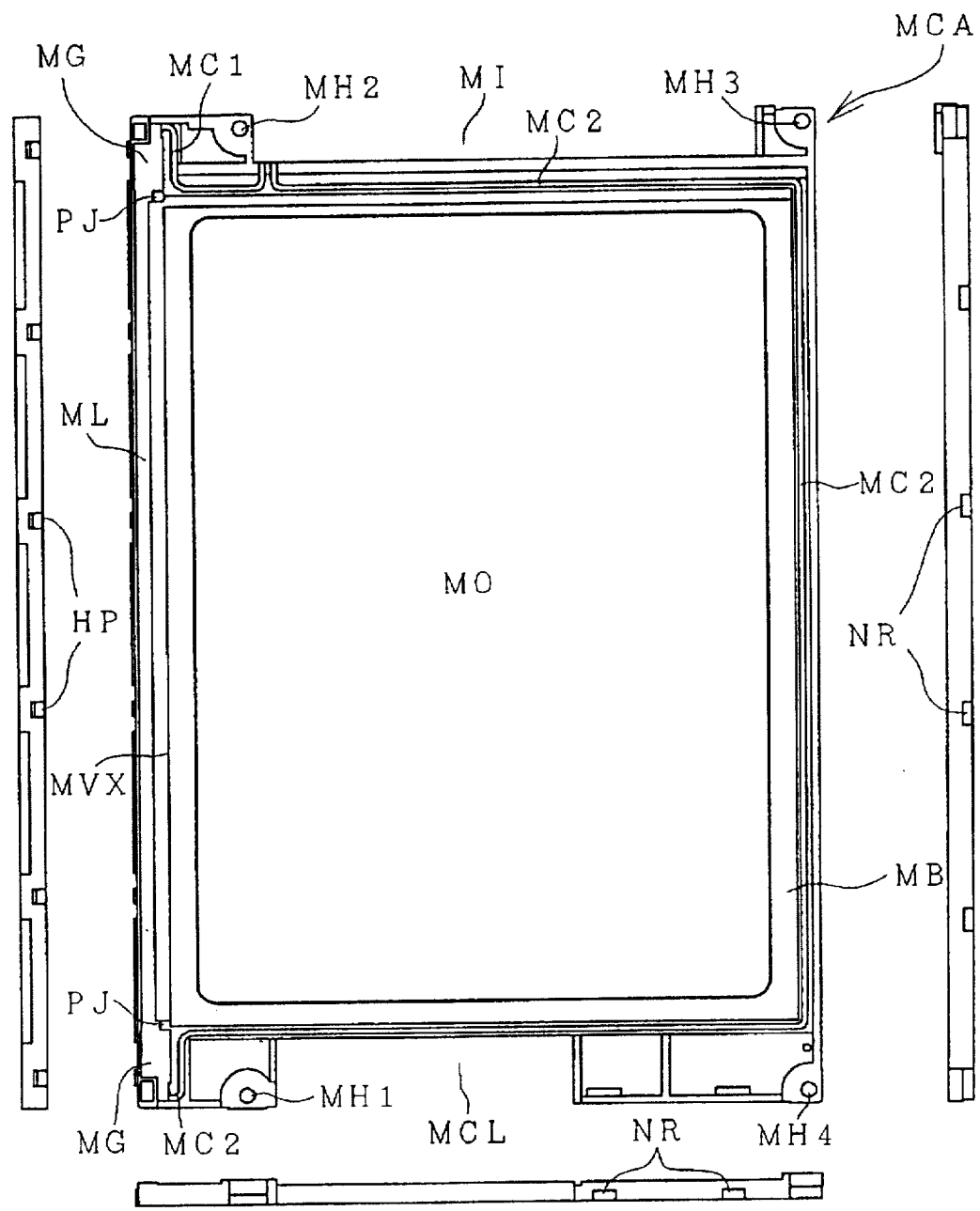

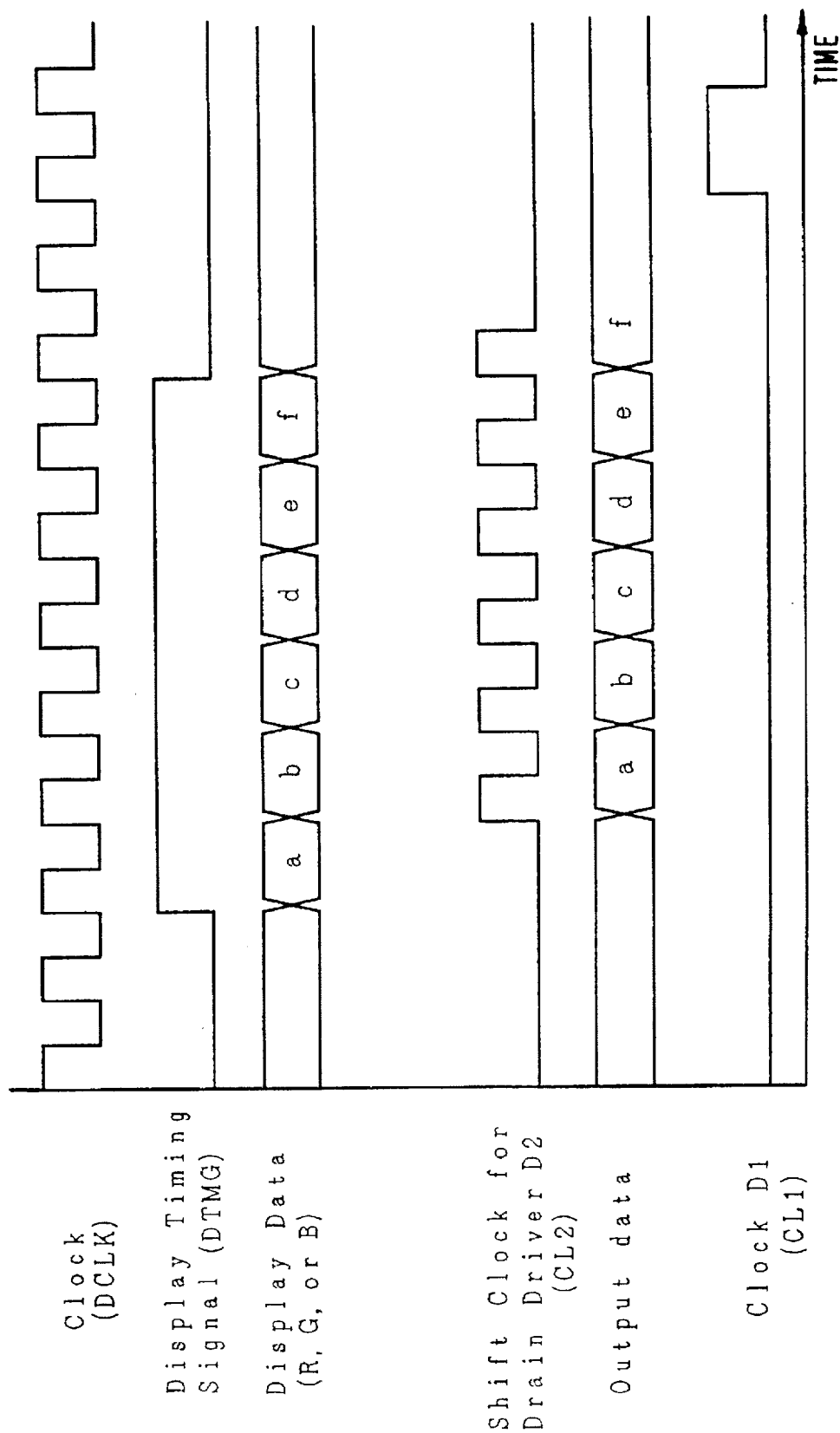

LIQUID CRYSTAL DISPLAY DEVICE WITH REDUCED FRAME PORTION SURROUNDING DISPLAY AREA

BACKGROUND OF THE INVENTION (1) Field of the Invention

The present invention relates to a liquid crystal display device suited for reducing the frame portion surround a display area and, more particularly, to a liquid crystal display device having a chip-on-glass type liquid crystal display element in which a driving integrated circuit chip is mounted on one of two superposed transparent insulating substrates. Also, the present invention relates to a data processing device having said liquid crystal display device assembled as a display unit.

(2) Description of the Prior Art

The active matrix type liquid crystal display device is equipped with switching elements individually for a plurality of pixel electrodes arrayed in a matrix shape. Since the liquid crystal in each pixel is, in principle, driven at all times, the active matrix type is better in contrast than the simple matrix type adopting the time-division drive method and is a technique indispensable for the color display.

The active matrix type liquid crystal display device of the prior art is constructed in the liquid crystal display element (i.e. the liquid crystal display panel) which is formed with thin-film transistors (TFT) and which has a liquid crystal sealed, by connecting drive ICs (or driver ICs) for driving the liquid crystal display element as the tape carrier package (TCP) mounted on a tape carrier, with vertical scanning lines and horizontal signal lines through an anisotropic conductive film (or anisotropic connector), by wiring peripheral circuits, which are used to generate and transmit liquid crystal display data necessary for the drive ICs and timing signals to the individual drive ICs, in a printed board, and by arranging the peripheral circuits around the tape carrier package (TCP) and soldering the same to the tape carrier package (TCP).

Incidentally, the active matrix type liquid crystal display device using the thin-film transistors is known, as disclosed in Japanese Patent Laid-Open No. 309921/1988 or on pp. 193 to 210 of "12.5 Size Active Matrix Type Color Liquid Crystal Display adopting Redundancy Construction" of Nikkei Electronics issued on Dec. 15, 1986 by Nikkei McGRAW-Hill.

SUMMARY OF THE INVENTION

The liquid crystal display device of the prior art uses a printed board in a peripheral circuit board, and the signals to be inputted to each pixel are connected from the printed board through the cables or the TCP with the liquid crystal display element. With an increase in the pixel number, therefore, the liquid crystal display device of the prior art increases the number of connections between the liquid crystal display element and the TCP so that it is troubled by a problem that the probability of electric connection failure increases. With an increase in the display color number, moreover, the data line number of the display data has a tendency to increase, together with the enlargement of the outermost shape of the liquid crystal display device, thereby to raise a problem that the external size of a data processor, such as a personal computer or word processor having the liquid crystal display device assembled is enlarged.

In the liquid crystal display device of the prior art, moreover, the signals and the power supply necessary for the drive ICs are fed through the display data controller and the horizontal and vertical driving peripheral circuits on the basis of the control signals, clocks and display data sent from a host computer. With an increase in the display color number or the pixel number of the liquid crystal display device, therefore, the necessary signals have their frequencies raised to increase the electric interference of the signals between the wiring lines. As a result, the potential for generating the unnecessary radiation electric waves for causing the EMI (i.e., Electro Magnetic Interference) has a tendency to rise thereby to cause a problem that the data processing device, such as the personal computer or word processor having the liquid crystal display device assembled therein, fails to satisfy its environmental using conditions.

Moreover, the liquid crystal display device of the prior art uses a printed board as the substrate for the display data controller and the power supply unit or as the peripheral driver substrate for horizontal and vertical scannings, and the signals and the power supply between the substrates are electrically connected with a joiner, such as a flat cable. With an increase in the display color number of the liquid crystal display device, therefore, the number of wiring lines necessary in a limited area of the joiner is increased to make it necessary to connect the narrow pitch highly reliably and efficiently.

In the liquid crystal display device of the prior art, moreover, the display data are converted by a display controller, and the signals and the power supply necessary for the drive ICs are fed through the horizontal and vertical driving peripheral circuits on the basis of the control signals, clocks and display data sent from a host computer. In this case, the data for one pixel of red (R), blue (B) and green (G) dots are usually processed during a unit time by the display controller. For a high resolution display, however, there arises a defect that the transfer rate is highly raised. One method for eliminating the defect is to input the data of two pixels simultaneously to the display controller. However, the package of the display control integrated circuit element TCON is large-sized, and the power consumption is concentrated at only one integrated circuit element. In the worst case, there arises a problem that an allowable loss is exceeded.

With an increase in the display color number or the pixel number of the liquid crystal display device, therefore, the frequency of the aforementioned necessary signals and the data for one pixel are increased to raise a problem that the data processing device, such as the personal computer or word processor having the liquid crystal display block assembled therein, cannot satisfy the restrictions upon the using temperature conditions and the external shape.

In the liquid crystal display device of the prior art, moreover, an epoxy resin EPX is applied in a projection to a seal port in case the liquid crystal is sealed between two superposed transparent insulating substrates. In case, therefore, the peripheral circuit board is arranged in the outer periphery of the seal port, it is spaced in its entirety by about 1 to 2 mm from the projection of the seal port so that the seal port may be kept away from the mechanical stress such as vibration or impulse. As a result, there arises a problem that the liquid crystal display device has its outermost shape accordingly enlarged.

In the liquid crystal display device of the prior art, moreover, in a side light type back light for irradiating the liquid crystal display element from the back, two lamp cables LPC of a fluorescent tube LP are led out from the outer periphery which is in parallel with the side for accommodating the fluorescent tube LP. This raises a problem that the outermost shape of the liquid crystal display module MDL becomes larger at the side accommodating the fluorescent tube than at the opposite side. Especially in a high resolution liquid crystal display element, the terminal pitch is so reduced as to make it necessary to arrange the drive ICs at the two opposed sides and to lead out the terminals of the video signal lines to the two sides. In this case, especially the wiring area of the lamp cables LPC have to be uniformly reduced as much as possible with respect to the aforementioned two sides.

A first object of the present invention is to reduce the sizes of the liquid crystal display device and the data processing device by reducing the area of peripheral driver circuits while retaining the accurate connection reliability even if the pixel number and the display color number are increased to increase the connection wiring line number with the liquid crystal display element and the data line number of the display data.

A second object of the present invention is to provide a data processing device having a liquid crystal display device which is low at the EMI level and excellent in the environmental resistance even if the display color number and the pixel number are increased to increase the frequencies and wiring number of control signals, clocks and display data.

A third object of the present invention is to reduce the parts number of the liquid crystal display device and to attain the highly reliable connection among the peripheral substrates and the liquid crystal display element.

A fourth object of the present invention is to provide a data processing device having a liquid crystal display device which is constructed of an area spacing display control integrated circuit excellent in the temperature resistance even if the display color number and the pixel number are increased to increase the frequencies and wiring number of control signals, clocks and display data thereby to increase the data for one pixel.

A fifth object of the present invention is both to reduce the area of peripheral driver circuits while retaining the accurate connection reliability even if the display color number and the pixel number are increased to increase the connection wiring line number with the liquid crystal display element thereby to reduce the connection pitch, and to provide a data processing device having a liquid crystal display device which is constructed of an area spacing display control integrated circuit excellent in the temperature resistance even if the display color number and the pixel number are increased to increase the frequencies and wiring number of control signals, clocks and display data thereby to increase the data for one pixel.

A sixth object of the present invention is to reduce the outermost shape of a liquid crystal display device at the side of a seal port.

A seventh object of the present invention is to reduce the outermost shape of a liquid crystal display device by arranging the wiring area of a lamp cable LPC in an area uniformly as small as possible for the two opposed sides.

In order to achieve the above-specified first object, according to the present invention, there is provided a liquid crystal display device comprising: a chip-on-glass type liquid crystal display element having drive ICs mounted on one of two superposed transparent insulating substrates; and a multi-layered flexible substrate arranged in the outer periphery of at least one side of the liquid crystal display element and having two or more conductor layers electrically connected with the input terminal pattern of the drive ICs.

Alternatively, there is provided a liquid crystal display device comprising: a chip-on-glass type liquid crystal display element having drive ICs mounted on one of two superposed transparent insulating substrates; and a multi-layered flexible substrate arranged in the outer periphery of the two sides, i.e., one shorter side and one longer side of the four sides of the liquid crystal display element and having two or more conductor layers electrically connected with the input terminal pattern of the drive ICs at the two sides.

Alternatively, there is provided a liquid crystal display device comprising: a chip-on-glass type liquid crystal display element having drive ICs mounted on one of two superposed transparent insulating substrates; and a multi-layered flexible substrate arranged in the outer periphery of two opposed longer sides and one shorter side of the four sides of the liquid crystal display element and having two or more conductor layers electrically connected with the input terminal pattern of the drive ICs at the two longer sides and the one shorter side.

Moreover, the multi-layered flexible substrate has its pattern portion made of either two or less conductor layers and this portion is electrically connected with the input terminal pattern to the drive ICs on the transparent insulating substrate through an anisotropic conductive film.

Moreover, the multi-layered flexible substrate is arranged in the outer periphery of one side of the liquid crystal display element, and wiring lines for a display control circuit and a power supply circuit are made of a multi-layered printed board.

Moreover, the multi-layered flexible substrate is made foldable to have a foldable portion having two or less conductor layers.

Moreover, electronic parts are mounted on one side of the portion of the multi-layered flexible substrate, and this portion is composed of three or more conductor layers.

Moreover, electronic parts mounted only one side at the portion of the multi-layered flexible substrate, this portion is composed of two or more conductor layers, and the electronic parts are positioned in an opening of a shield casing.

Moreover, the foldable portion of the multi-layered flexible substrate, which has two or less conductor layers, is bent by 180 degrees and the portion of the folded multi-layered flexible substrate, which has two or more conductor layers, is adhered to the back of the transparent insulating substrate mounting the drive ICs of the liquid crystal display element.

In order to retain the connection reliability with the liquid crystal display panel, moreover, the portions, composed of two or less conductor layers in the multi-layered flexible substrate, which are electrically connected with the input wiring pattern to the drive ICs formed on the transparent insulating substrate, are projected separately to the individual drive ICs.

Moreover, there is provided a liquid crystal display device comprising: a transparent insulating substrate having an input wiring pattern to drive ICs formed thereon; and a multi-layered flexible substrate having its portion connected electrically with the input wiring pattern, and this portion is composed of two or less conductor layers and is projected separately to the individual drive ICs, wherein the projection is formed therein with marks for alignment with the input wiring pattern on the transparent insulating substrate.

In order to achieve the aforementioned second object, according to the present invention, there is provided a liquid crystal display device, wherein the multi-layered flexible substrate includes a pad pattern portion for packaging parts, via holes for electric connections, and a surface conductor layer formed of a solid or mesh-shaped pattern portion fixed at a DC power supply voltage, such as 5 volt or at the ground.

Alternatively, there is provided a liquid crystal display device, wherein a first substrate is made of the multi-layered flexible substrate including a pad pattern portion for packaging parts, via holes for electric connections, and a surface conductor layer formed of a solid or mesh-shaped pattern portion fixed at the ground, wherein a second substrate is made of the multi-layered wiring substrate for a display data controller and a power supply unit including electric connecting via holes, a surface conductor layer formed of a solid or mesh-shaped pattern portion fixed at the ground, and a surface conductor layer of an opposite side, having electronic parts mounted on the side, and wherein the surface conductor layers of the first substrate and the second substrate, having their solid or mesh-shaped pattern portions fixed at the ground, are connected electrically with the ground pads of a common metallic shield casing.

In order to achieve the above-specified third object, a plurality of multi-layered flexible substrates for peripheral circuits have their wiring lines electrically connected with each other through a metallic wiring pattern on the transparent insulating substrate.

Alternatively, the multi-layered flexible substrate for a peripheral driver and the multi-layered wiring substrate for the display controller and the power supply unit are electrically connected through an anisotropic conductive film.

In order to achieve the above-specified fourth object, according to the present invention, there is provided a liquid crystal display device comprising a display controller having two or more display control integrated circuit elements mounted thereon and adapted to act by a common control signal input.

Alternatively, there is provided a liquid crystal display device having a liquid crystal display element comprising: two superposed transparent insulating substrates confining a liquid crystal inbetween; and row and column wiring lines in a matrix shape, wherein the improvement comprises: drive ICs mounted in a row on the two opposed sides of the transparent insulating substrate for driving the column wiring lines of the liquid crystal display element; and two display control integrated circuit elements adapted to act by a common control signal input for driving the drive ICs on the two sides in parallel.

Moreover, the liquid crystal display element is the liquid crystal display element of active matrix type, wherein the row wiring lines are composed of gate wiring lines, and wherein the column wiring lines are drain wiring lines.

In order to achieve the above-specified fifth object, according to the present invention, there is provided a liquid crystal display device comprising a chip-on-glass type liquid crystal display element having drive ICs mounted on one of two superposed transparent insulating substrates, wherein the drive ICs are mounted in a row on the two opposed sides of the transparent insulating substrates and are driven in parallel by two display control integrated circuit elements to be operated by a common control signal input.

In order to achieve the above-specified sixth object, according to the present invention, there is provided a liquid crystal display device having a liquid crystal display element comprising: two superposed transparent insulating substrates confining a liquid crystal inbetween; and a seal port having a sealing resin applied in a projection, wherein a peripheral circuit board positioned in the outer periphery of the seal port is recessed to avoid the projection of the seal port.

In order to achieve the above-specified seventh object, according to the present invention, there is provided a liquid crystal display device comprising: a liquid crystal display element having two superposed transparent insulating substrates confining a liquid crystal inbetween; and a side light type back light for illuminating the liquid crystal display element from the back, wherein the fluorescent tube of the back line has its lamp cable guided along the outer periphery in parallel with the four sides of the liquid crystal display element below and inside the liquid crystal display element.

Alternatively, there is provided a liquid crystal display device comprising: a liquid crystal display element having two superposed transparent insulating substrates confining a liquid crystal inbetween; and a side light type back light for illuminating the liquid crystal display element from the back, wherein the fluorescent tube of the back line has its lamp cable guided along the outer periphery in parallel with the four sides of the liquid crystal display element below and inside the liquid crystal display element, such that the cable for a higher voltage side is positioned in parallel with a fluorescent tube side and is led out to a connector for an inverter in a shorter way and whereas the cable for a lower voltage side is positioned in parallel with the remaining three sides of said liquid crystal display element and is led out to a connector for an inverter in a longer way, wherein both said cables are accommodated in groove portions of a lower casing.

According to the present invention, the peripheral driver has its wiring substrate made of the multi-layered flexible substrate so that the wiring density can be enhanced while allowing the folding to take an advantage in the size reduction. Moreover, the ground pattern of the conductor layer fixed at a DC voltage can be formed over the surface layer to take an advantage for counter-measures against the EMI. Still moreover, the multi-layered flexible substrate is used in place of the TCP to make the joiner unnecessary between the peripheral circuit boards and the liquid crystal panel so that the parts number of the liquid crystal display device, such as the TCP can be reduced.

According to the present invention, moreover, even in case the pixel number is increased to reduce the terminal pitch and to make it impossible to lead out the terminals of the video signal lines of the liquid crystal display panel from one side so that they are led out from the two opposed sides, the area of the frame portion around the display block can be reduced by arranging the multi-layered flexible circuit board and driver ICs as chip-on-glass packaged for driving the video signal lines to be connected with those terminals at the two sides of the display panel, usually at the two longer sides and by folding that flexible circuit board by 180 degrees. As a result, when the liquid crystal display element having a large number of pixels like a high resolution XGA (Extended Graphic Array) display panel is packaged in the data processing device, such as a personal computer or word processor, the liquid crystal display device and the data processing device having the display device assembled therein can be reduced in size and weight, and the sides arranged with the circuit board for driving the video signal lines can be uniformly arranged at the upper and lower sides of the screen so that the screen can be properly positioned in the vertical direction.

According to the present invention, moreover, the liquid crystal display device is enabled to accommodate a slender fluorescent tube in an efficient use of the space by arranging the fluorescent tube in the space below the multi-layered flexible substrate packaged in the outer periphery of the liquid crystal display element. As a result, the device can have its external size and its weight reduced.

Thanks to the construction of the display control device having two or more display control integrated circuit elements, the temperature resistance is improved to take an advantage for the compactness.

According to the present invention, moreover, even in case the pixel number is increased to reduce the terminal pitch so that the video signal lines have their terminals led out at the two sides of the liquid crystal display panel, the drive ICs are chip-on-glass packaged on the two sides of the liquid crystal display panel, usually on the longer two sides, so that the frame area around the display block can be sufficiently reduced. As a result, when the liquid crystal display element having a large number of pixels like a high resolution XGA (Extended Graphic Array) display panel is packaged in the data processing device, such as the personal computer or word processor, the liquid crystal display device and the data processing device having the display device assembled therein can be reduced in size and weight, and the sides arranged with the circuit board for driving the video signal lines can be uniformly arranged at the upper and lower sides of the screen so that the screen can be properly positioned in the vertical direction.

In the liquid crystal display device of the present invention, moreover, the drive ICs, as chip-on-glass packaged on the two sides of the liquid crystal display panel, usually on the longer two sides, are driven in parallel by the two display controllers thereby to improve the temperature resistance and to take an advantage in compactness, so that the sides arranged with the circuit board for driving the video signal lines can be uniformly arranged at the upper and lower sides of the screen so that the screen can be properly positioned in the vertical direction. As a result, the device can have its external size reduced to reduce its size and weight.

In the liquid crystal display device of the present invention, the peripheral circuit board, as positioned in the outer periphery of the seal port, is recessed to avoid the projection of the seal port so that it can be narrowed by a length of the projection usually of about 1 mm.

According to the present invention, the lamp cable of the slender fluorescent tube is arranged around the four sides in the space below the multi-layered flexible substrate packaged in the outer periphery of the liquid crystal display element, so that it can be accommodated by using the space efficiently. As a result, the device can have its external size reduced to reduce its size and weight.

The foregoing and other objects, advantages, manner of operation and novel features of the present invention will be understood from the following detailed description when read in connection with the accompanying drawings.

BRIEF DESCRIPTION OF THE DRAWINGS

FIGS. 4–4E presents a top plan view, a front side, a rear side, a right side and a left side of a shield casing SHD, respectively;

FIG. 7A is a section of a foldable multi-layered flexible substrate used in the present embodiment having its projection FSL formed of one conductor layers, and FIG. 7B is a section of a multi-layered flexible substrate having its projection FSL formed of two conductor layers according to another embodiment of the present embodiment;

FIGS. 11A, 11C and 11B (1) and 11B (2) are a bottom plan view and a top view of an interface circuit board used in the present embodiment and having the functions of a controller unit and a power supply unit, and a side elevation and a front elevation of a hybrid integrated circuit having the substrate mounted thereon;

FIGS. 19A–19E presents a top plan view, a front side, a rear side, a right side and a left side of a lower casing MCA, respectively;

FIG. 32 is a diagram showing the timings of the display data to be inputted to the display controller and the display data to be outputted to the drain drive ICs in the timing chart of FIG. 31;

DESCRIPTION OF THE PREFERRED EMBODIMENTS

Figure 1:
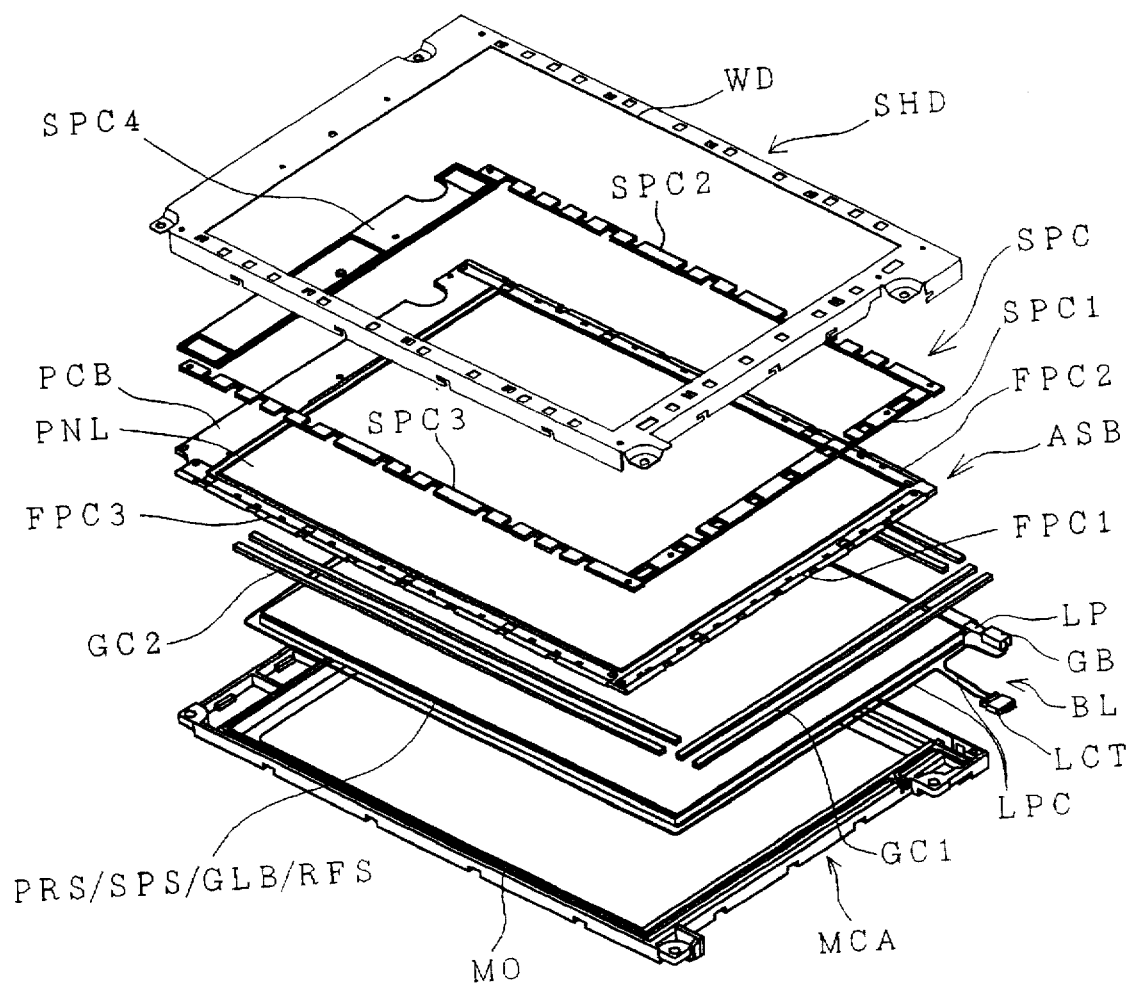
FIG. 1 is an exploded perspective view showing a liquid crystal display module (i.e., a liquid crystal display device) according to the present invention.

FIG. 1 is an exploded perspective view of a liquid crystal display module MDL.

Reference letters SHD designate a shield casing (or metal frame) made of a metal sheet; letters WD a display window; characters SPC1 to SPC4 insulating spacers; characters FPC1 to FPC3 folded multi-layered flexible circuit boards (of which characters FPC1 designate the circuit board at the gate side, and characters FPC2 and FPC3 designate the circuit boards at the drain side); letters PCB an interface circuit board; letters ASB a circuit board assembly integrated with the liquid crystal display panel PNL; letters PNL a liquid crystal display element having drive ICs mounted on one of two superposed transparent insulating substrates; characters GC1 and GC2 rubber cushions; letters PRS a prism sheet; letters SPS a diffusive sheet; letters GLB a light guide plate; letters RFS a reflective sheet; letters MCA a lower casing (or mold casing) formed by an integral molding; letters LP a fluorescent tube; letters LPC lamp cables;

letters LCT a connector for an inverter; and letters GB rubber bushes for supporting the fluorescent tube LP. These components are stacked in the shown vertical arrangement to assemble the liquid crystal display module MDL.

Figure 2:
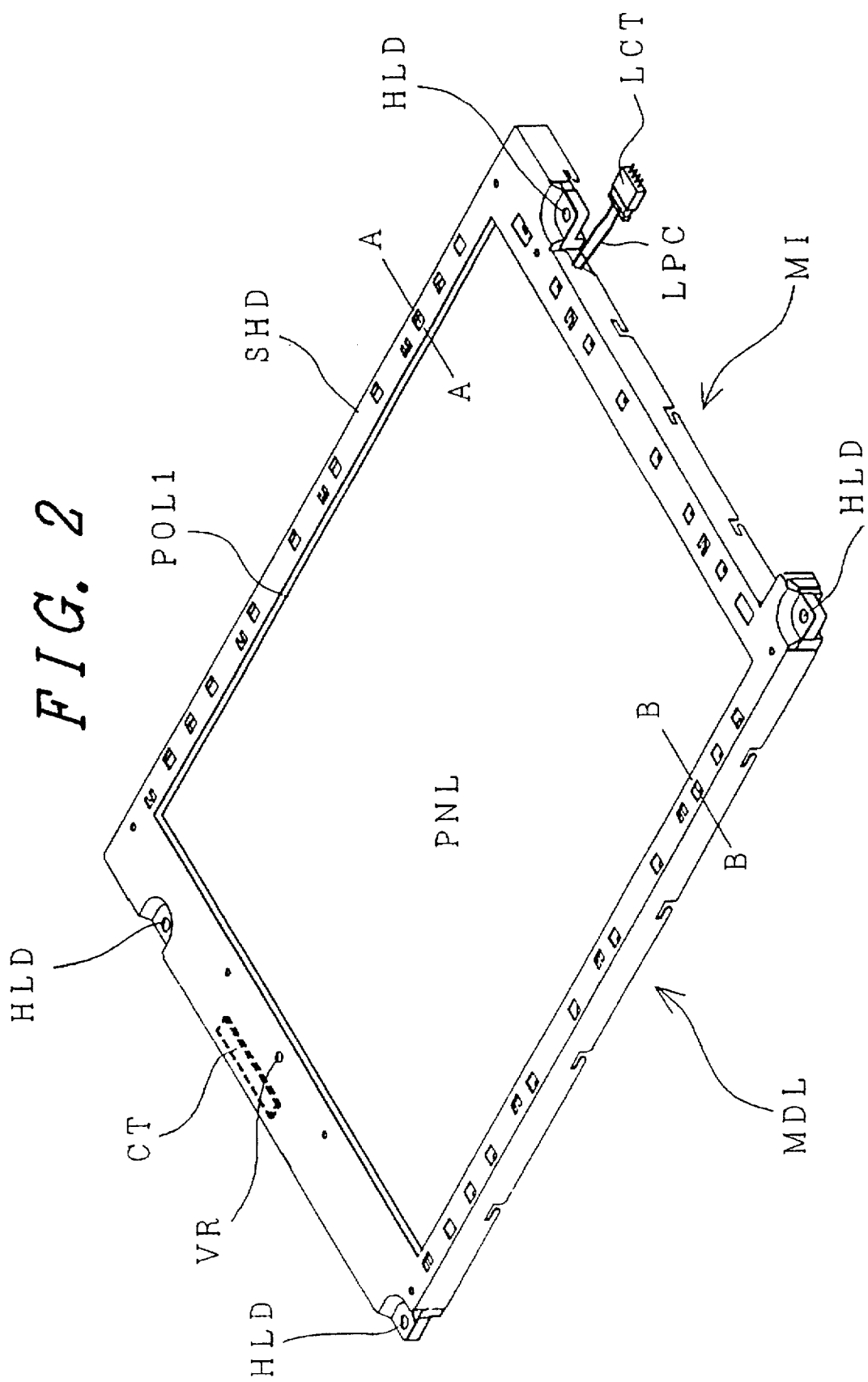
FIG. 2 is a perspective view of the assembled liquid crystal display module of FIG. 1, as taken from the surface side thereof.

FIG. 2 is a perspective view showing the assembled liquid crystal display module MDL, as taken from the surface of the liquid crystal display element.

The module MDL is composed of two kinds of mounting/ holding members of the lower casing MCA and the shield casing SHD.

Figure 4:
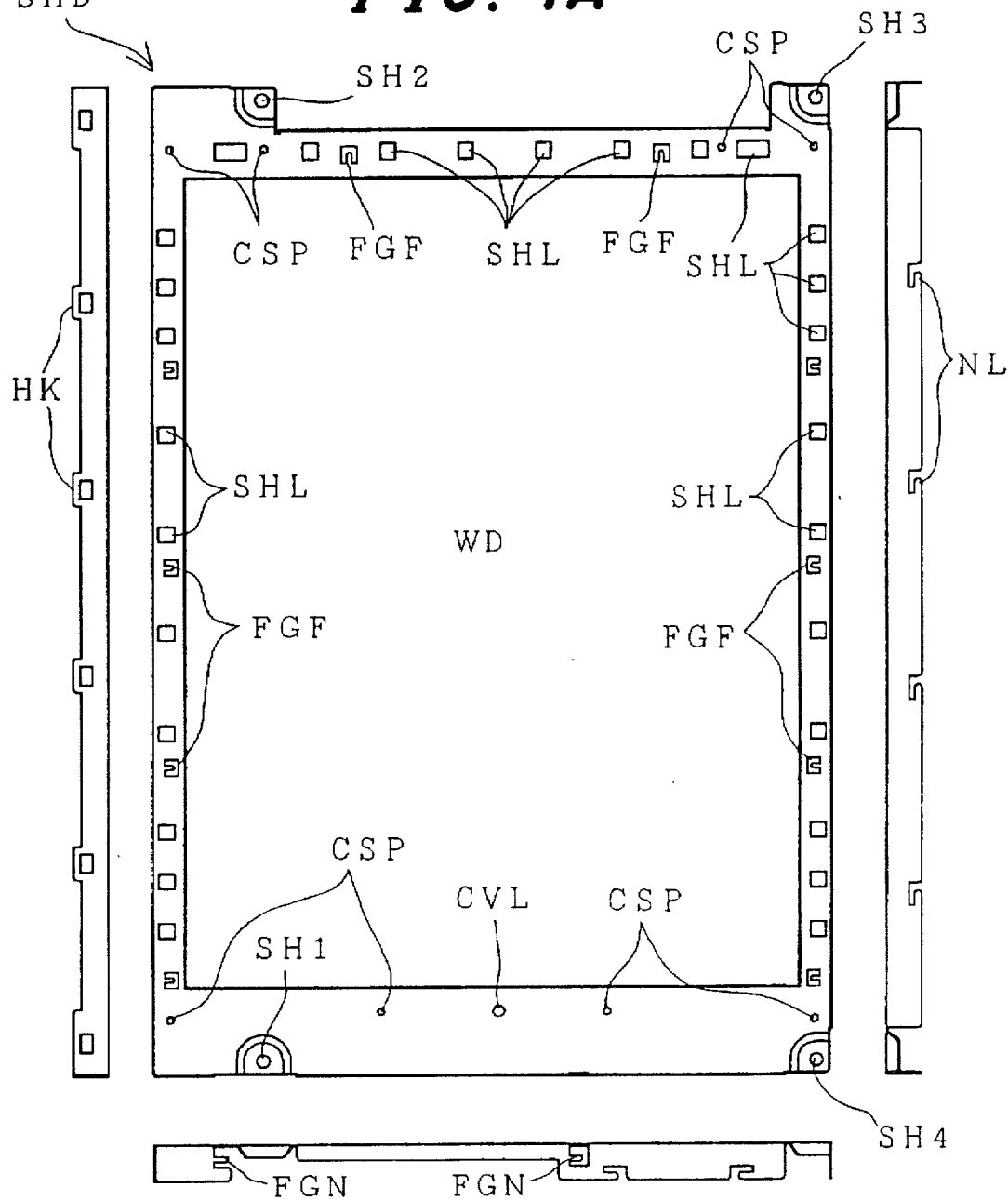

Letters HLD designate four mounting holes for mounting the module MDL as the display block in the data processing device such as the personal computer or word processor. The lower casing MCA is formed with mounting holes MH1 to MH4, and the shield casing SHD is also formed with mounting holes SH1 to SH4 which are aligned to the mounting holes MH1 to MH4 (as shown in FIGS. 4 and 19). The liquid crystal display device is fixed and mounted to the data processing device by fastening screws into the mounting holes of the two. The module MDL is equipped with a brightness adjusting volume VR, and the inverter for the back light is arranged in the MI portion so that the power is supplied to the back light BL through the connector LCT and the lamp cables LPC. The signals from the host computer (or host) and the necessary power are supplied to the controller and the power supply unit of the liquid crystal display module MDL through an interface connector CT positioned at the back of the module.

Figure 3:
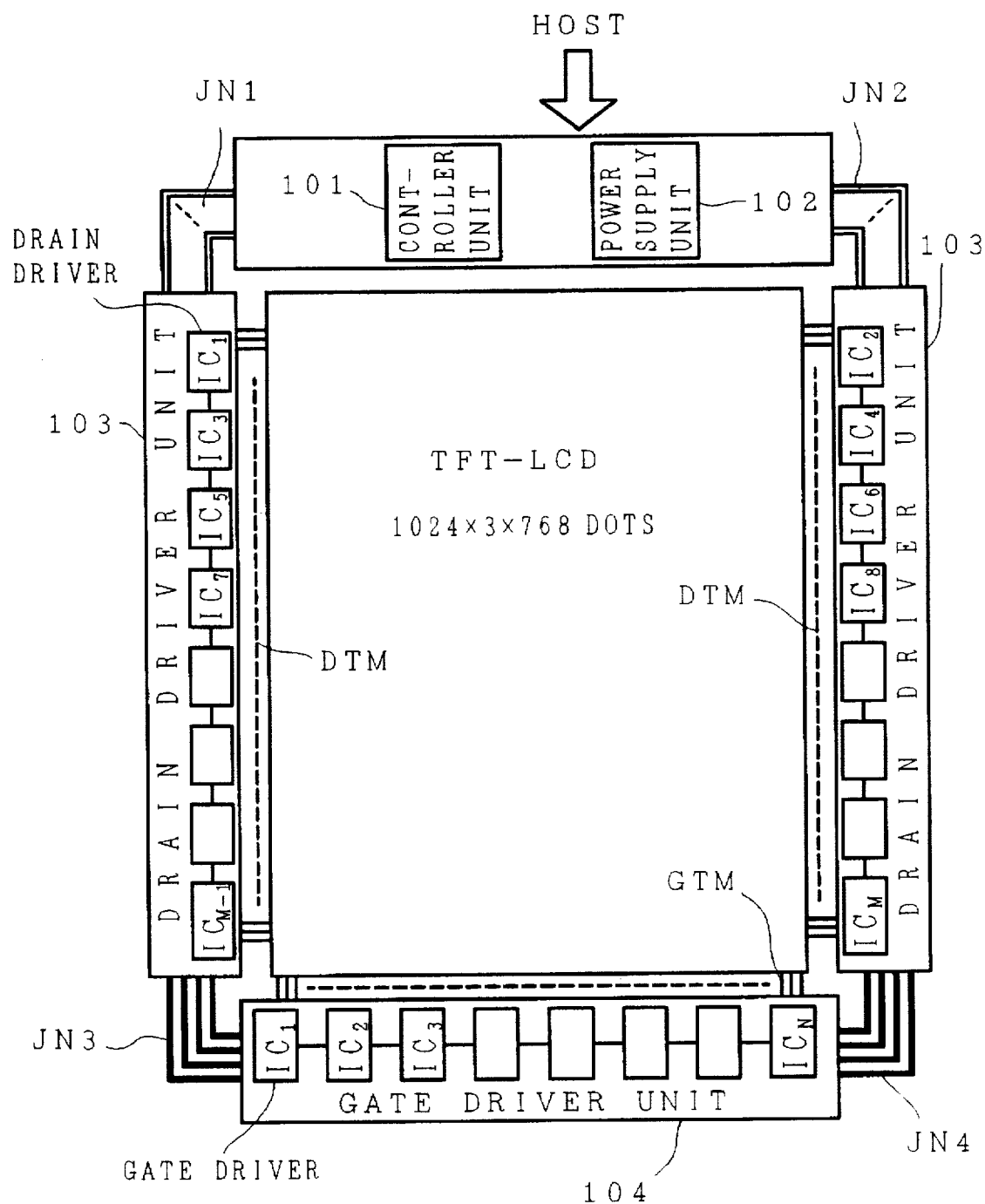
FIG. 3 is a block diagram showing a liquid crystal display panel of the liquid crystal display module according to the embodiment of the present invention and the circuits arranged around the display panel.

FIG. 3 is a block diagram showing the TFT liquid crystal display element of the TFT liquid crystal display module according to the embodiment of FIG. 1 and the circuits arranged around the TFT liquid crystal display element. In the present invention, although not shown, drain drivers IC1 to ICM and gate drivers IC1 to ICN are chip-on-glass packaged (i.e., COG packaged) by connecting these drivers to drain side lead-out lines DTM and gate side lead-out lines GTM formed over one transparent insulating substrate of the liquid crystal display element through an anisotropic conductive film or an ultraviolet hardening resin. In the present embodiment, the liquid crystal display element has effective dots of 1,024×3×768 according to the XGA specifications. As a result, the transparent insulating substrate of the liquid crystal display element is COG-packaged with eight drain drive ICs having 192 outputs at each of the longer sides (M=16) and eight gate drive ICs having 100 outputs at each shorter side (N=8). The liquid crystal display element is arranged with drain driver units 103 at its upper and lower sides, a gate driver unit 104 at its one side, and a controller unit 101 and a power supply unit 102 at its other side. These controller unit 101, power supply unit 102, drain driver unit 103 and gate driver unit 104 are individually connected to one another by electric joint means JN1 to JN4.

The specific constructions of the individual components will be described in detail in connection with the individual members with reference to FIGS. 4 to 20.

<<Metallic Shield Casing SHD>>

FIG. 4 presents the upper side, front side, rear side, right side and left side of the shield casing SHD, and a perspective view, as taken obliquely from above the shield casing SHD, is shown in FIG. 1.

The shield casing (or metal frame) SHD is fabricated by punching and folding a metal sheet by the pressing technique. Letters WD designate a window for exposing the display panel PNL to the field of view, as will be called the "display window".

Letters NL designate fixing pawls (totally ten in number) for fixing the shield casing SHD and the lower casing MCA, and letters HK also designate fixing hooks (totally six in number) integrally formed in the shield casing SHD. Before the fixing pawls NL shown in FIGS. 1 and 4 are folded, the shield casing SHD and the circuit board assembly ASB are stacked while sandwiching the spacers SPC. After this, the fixing pawls NL are folded inward and inserted into the rectangular fixing recesses NR (as shown at the individual side elevation of FIG. 19) which are formed in the lower casing MCA. The fixing hooks HK are individually fitted on the fixing projections HP (as shown at the side elevation of FIG. 19) formed in the lower casing MCA. As a result, the shield casing SHD holding/mounting the circuit board assembly ASB integrated with the liquid crystal panel PNL, and the lower casing MCA holding/mounting the light guide plate GLB and the fluorescent tube LP are firmly fixed. On the other hand, such four sides of the lower side of the display panel PNL, as will exert no influence upon the display, have their edges equipped with the thin and long rubber cushions GC1 and GC2 (which may also be called the "rubber spacers", as shown in FIG. 1) having a rectangular shape. On the other hand, since the fixing pawls NL and the fixing hooks HK can be easily removed (merely by straightening the fixing pawls NL and removing the fixing hooks HK), these two members can be easily disassembled/ assembled so that they can be easily repaired to facilitate the replacement of the fluorescent tube LP of the back light BL. In the present embodiment, moreover, one side is fixed by the fixing pawls NL while the other side is fixed by the fixing hooks HK, as shown in FIG. 4, so that the disassembly can be effected merely by removing not all but some of the fixing pawls NL at the one side. As a result, the repair and the replacement of the back light can be facilitated.

Figure 5:
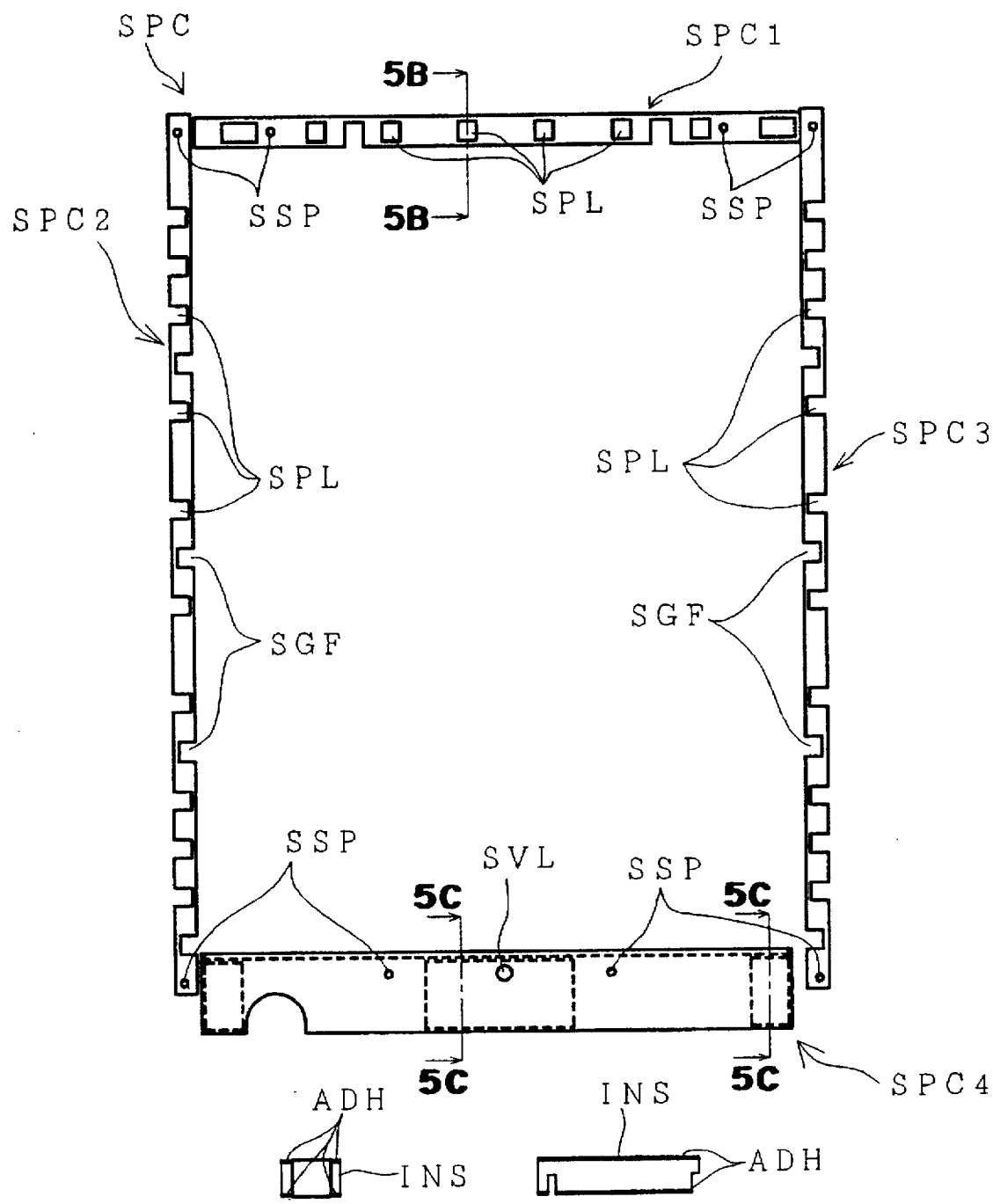
FIGS. 5A–5C presents a top plan view, a section of line 5B—5B and a section of line 5C—5C of a spacer SPC, respectively.

Letters CSP designate common through holes which are formed in common plane positions shared with the holes SSP (as shown in FIG. 5) of the insulating spacers SPC1 to SPC 4. In manufacturing steps, the shield casing SHD and the insulating spacers SPC1 to SPC4 are sequentially packaged by fitting the individual common through holes on fixed upright pins, so that they may be accurately positioned relative to each other. The insulating spacers SPC1 to SPC4 can fix the shield case SHD and the circuit board assembly ASB integrated with the liquid crystal panel PNL, while being reliably spaced from the insulating spacers, because an adhesive material ADH (as shown in FIG. 5) is applied to the two sides of an insulator INS. Moreover, the common through holes CSP can be used as positioning references when the module MDL is to be packaged in a data processing device such as a personal computer.

Figure 6:
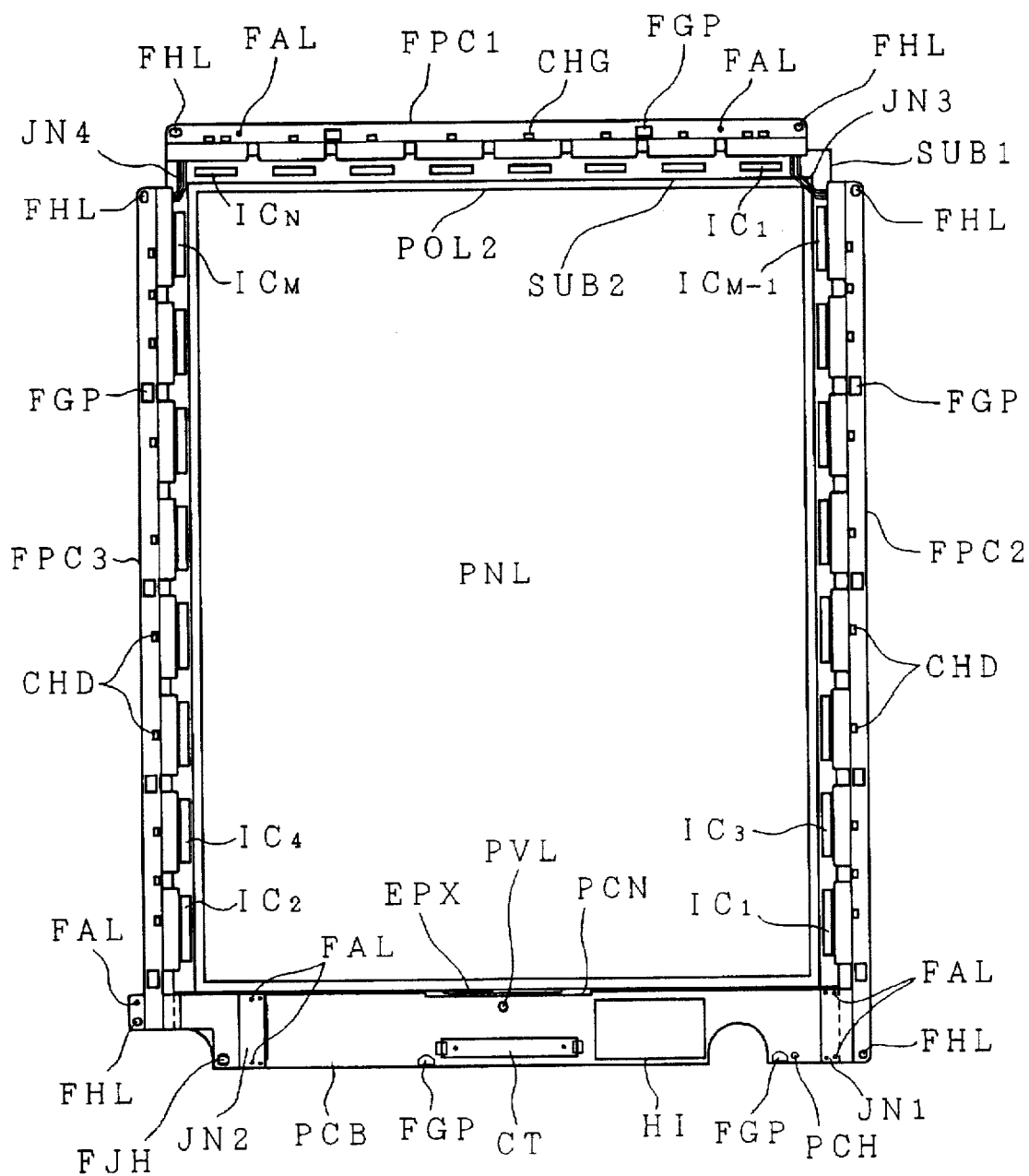
FIG. 6 is a bottom view of the state in which a multi-layered flexible substrate and a multi-layered printed board are packaged in the outer periphery of the liquid crystal display panel of the present embodiment.

Letters FGF designate totally ten frame ground pawls formed integrally with the metallic shield casing SHD. These frame ground pawls FGF are constructed of rectangular projections extending into square openings, i.e., the C-shaped openings which are formed in the side of the shield casing SHD. These slim projections are individually folded at their roots inward of the device and are soldered and connected to the frame ground pads FGP (as shown in FIG. 6) which are connected with the ground wiring lines of the multi-layered flexible substrates FPC1 to FPC3 and the interface substrate PCB through the notches SGF of the insulating spacers SPC1 to SPC3. Incidentally, since the pawls FGN are formed on the side of the shield casing SHD, the works of folding the pawls FGN into the device and soldering the same to the frame ground pads FGP can be effected with the shield casing SHD having its inner side (or lower side) being directed upward, after the circuit board assembly ASB integrated with the liquid crystal display panel PNL have been packaged in the shield casing SHD and fixed by the spacers, so that the workability is satisfactory. Moreover, the pawls FGN are free, when folded, from abutment against the circuit board assembly ASB, so that the folding works are satisfactory. In the soldering works, moreover, the soldering iron can be applied from the inner side of the opened shield casing SHD so that the soldering works are satisfactory. As a result, the reliability of the connections between the pawls FGN and the frame ground pads FGP of the multi-layered flexible substrates FPC1 to FPC3 can be improved.

Square openings SHL, as formed in the surface of the shield case SHD, are portions for accommodating capacitors CHD and CHG as electronic circuit parts packaged on the multi-layered flexible substrates FPC1 to FPC3 of the circuit board assembly ASB, and are individually ten in number at the side of the drain substrate and ten in number at the gate substrate. The insulating spacers SPC1 to SPC3 are formed with notches SPL (as shown in FIG. 5) in planarly common positions. According to the present means, the thickness of the module MDL can be further reduced.

A round opening CVL, as opened in the surface of the shield case SHD, is formed for controlling the brightness adjusting volume VR, and the insulating spacer SPC4 is also formed with a common through hole SVL (as shown in FIG. 5).

<<Insulating Spacer>>

FIG. 5 is a top plan view of an insulating spacer SPC. A perspective view, as taken obliquely from above, of this insulating spacer SPC is shown in FIG. 1. FIG. 5 also presents a section of the opening SPL of the SPC1, as taken along line A—A, and a section of the SPC4, as taken along line B—B.

As described before, the insulating spacer SPC retains not only the insulation between the shield case SHD and the circuit board assembly ASB but also the positional accuracy of the shield casing SHD and fixes the circuit board assembly ASB and the shield casing SHD.

<<Multi-Layered Flexible Substrates FPC1 to FPC3>>

FIG. 6 is a bottom view showing the state in which the multi-layered flexible substrates FPC1 to FPC3 and the multi-layered printed board PCB are packaged around the display panel PNL. In the present embodiment, the multi-layered flexible substrates FPC1 to FPC3 are folded after a subsequent step.

Figure 13:
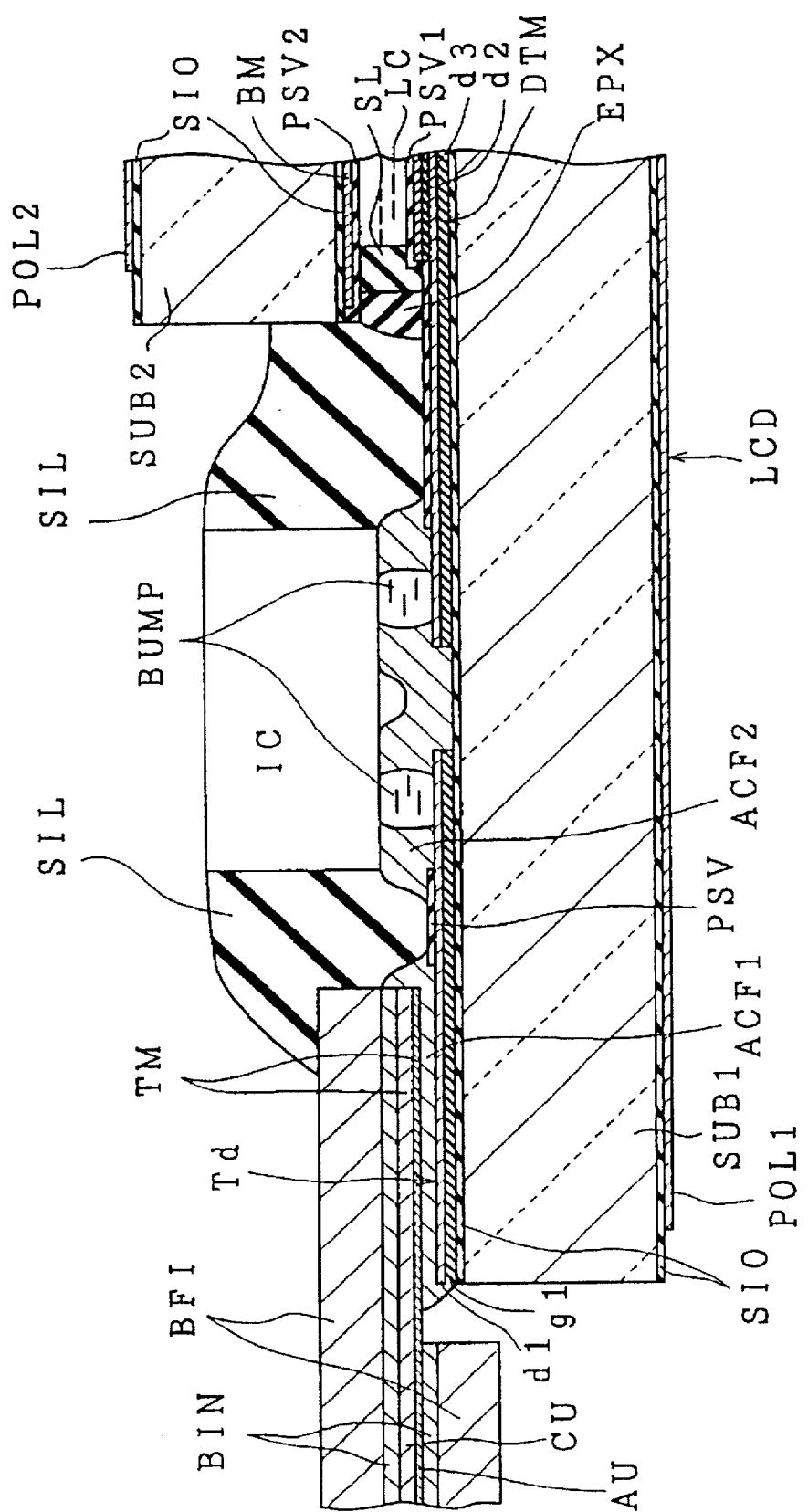
FIG. 13 is a section taken along line A—A of the perspective view of FIG. 12B.

The eight elements at the upper side of FIG. 6 are drive IC chips at the side of the vertical scanning circuit, and the individual eight elements at the left and right sides are drive IC chips at the side of the video signal drive circuit. These IC chips are chip-on-glass (COG) packaged on the transparent insulating substrate by using an anisotropic conductive film or an ultraviolet hardening agent. In the method of the prior art, the tape carrier package (TCP), which have the drive IC chips packaged therein by the tape automated bonding (TAB) method, is connected with the display panel PNL by using the anisotropic conductive film. The COG packaging eliminates the aforementioned TAB step thereby to shorten the process because it uses the drive ICs directly, and has an effect to lower the production cost because it eliminates the tape carrier. Moreover, the COG packaging is suitable for the packaging technique of the highly precise/ dense display panel PNL. In the present embodiment, the XGA panel is designed as the TFT liquid crystal display panel having a 10-inch screen size of 1,024×3×768 dots. As a result, each of the red (R), green (G) and blue (B) dots has a size of 207 μm (i.e., the gate line pitch)×69 μm (i.e., the drain line pitch) so that one pixel has a square of 207 μm in combination of the red (R), green (G) and blue (B) dots. As a result, if the drain lead-out lines DTM are 1,024×3 in number at one side, their pitch is less than 69 μm so that it is below the connection pitch limit of the TCP packaging to be used at present. In the COG packaging, the minimum value usable at present is about 70 μm in terms of the pitch of the bump BUMP (as shown in FIG. 13) of the drive IC chip and a square of about 50 μm in terms of the intersection area with the surfacing wiring lines, although depending upon the material of the anisotropic conductive film to be used. In the present embodiment, therefore, the pitch of the drain line lead-out DTM is set to 69×2 μm by arraying the drain drive ICs in a row at the two opposed longer sides of the liquid crystal panel and by leading out the drain lines alternately to the two longer sides. As a result, the drive IC chips can have their bump BUMP (as shown in FIG. 13) pitch designed to about 100 μm and their intersection area with the surfacing wiring lines designed to a square of about 70 μm, to effect a more highly reliable connection with the surfacing wiring lines. Since the gate line pitch has a sufficiently high value of 207 μm, the gate line lead-out GTM is led out at one shorter side. For a higher resolution display, however, the gate line lead-out lines GTM can be alternately led out to the two opposed shorter sides as in the case of the drain lines.

The method of leading out the drain lines or the gate lines alternately makes it easy to connect the lead-out lines DTM or GTM and the output side BUMP of the drive ICs, as described hereinbefore. However, the peripheral circuit boards have to be arranged around the two opposed longer sides of the liquid crystal panel PNL, thus raising a problem that the external size becomes larger than that of the one-side leading-out case. Especially with an increase in the number of display colors, the data line number of the display data increases to enlarge the outermost shape of the data processing device. In the present invention, therefore, that problem of the prior art is solved by using the foldable multi-layered flexible substrate. On the other hand, if the XGA panel has a screen size more than 10 inches, the pitch of the drain line lead-out DTM grows about 100 μm or more so that the drain driver ICs can be arranged at one longer side by the COG packaging. In this case, too, the foldable multi-layered flexible substrate of the present invention can be used.

FIG. 7A is a section of the multi-layered flexible substrate used in the present embodiment.

In the present embodiment, two or more conductor layers, e.g., four conductor layers L1 to L4 have their portions FML arranged in parallel with the sides of the liquid crystal panel PNL, and the peripheral circuit wiring lines and the electronic parts are mounted on those portions. Then, this mounting can be achieved by increasing the number of layers while retaining the substrate contour even if the number of data lines is increased. The individual conductor layers are electrically connected through via holes VIA (as shown in FIG. 14). The conductor layers L1 to L4 are made of copper CU wiring lines, but only the conductor layer L3 is prepared by plating the copper CU with gold AU. As a result, it is possible to reduce the connection resistance between output terminals TM and input terminal wiring lines Td (as shown in FIG. 13) to the drive ICs. The individual conductor layers are fixed by an adhesive agent BIN while sandwiching intermediate layers of polyimide films BFI as the insulating layers. The conductor layers are coated excepting the output terminals TM with the insulating layers. In the multi-layered wiring line portion FML, a solder resist SRS is applied to the uppermost and lowermost layers so as to ensure the insulations.

The advantage of the multi-layered flexible substrate is that the conductor layer L3 containing the connecting terminal portion TM necessary for the COG packaging can be integrated with other conductor layers thereby to reduce the number of parts.

Thanks to the construction of two or more conductor layers, moreover, the portion FML can be less deformed and hard so that it can have a positioning hole FHL arranged therein. This portion is hardly deformed, even when the multi-layered flexible substrate is folded, so that this folding can be reliable and accurate. Still moreover, a solid or mesh-shaped conductor pattern ERH can be arranged over the surface layer L1, as will be described hereinafter, so that the remaining one or more conductor layers can be wired with the conductor pattern for packaging the parts and the peripheral wiring lines.

Moreover, the projection FSL need not be the single conductor layer L3 but may be formed of the two conductor layers L2 and L3, as exemplified in FIG. 7B by another embodiment of the present invention. This construction of the two conductor layers L2 and L3 is effective for the case, in which the input terminal wiring lines Td to the drive ICs have their pitch narrowed. That is to say, the terminal wiring lines Td and the connecting terminal portion TM have their pattern staggered into a plurality of wiring line groups, which are electrically connected with each other through an anisotropic conductive film or the like. Then, that construction is effective in case one wiring group is connected with another conductive layer L2 through the via hole VIA at the time of leading out the connecting terminal portion TM in the conductor layer L3 or in case the peripheral wiring lines are partially arranged in the conductor layer L2 of the projection FSL.

Since the projection FSL is thus formed of the two or less conductor layers, the heat conduction can be improved to apply the pressure uniformly at the thermal contact bonding of the heat tool, so that the electric reliability of the connecting terminal portion TM and the terminal wiring lines Td can be improved. Moreover, the multi-layered flexible substrate can be accurately folded without imparting any bending stress to the connecting terminal portion TM. Moreover, since the projection FSL is semitransparent, the pattern of the conductor layer can be observed from the upper surface of the multi-layered flexible substrate, thus raising an advantage that the pattern inspection of the connecting state can also be made from the upper surface.

Figure 8A:
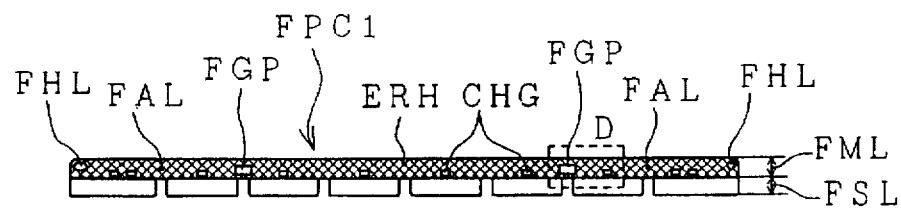
FIGS. 8A and 8B are a top plan view and a bottom view of the multi-layered flexible substrate used in the present embodiment for driving gate driver ICs, and FIGS. 8C, 8D an enlarged view of an essential portion of a conductor pattern.
Figure 8B:
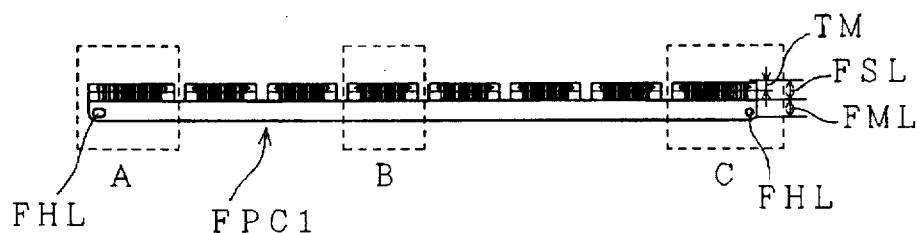
Figure 8C:
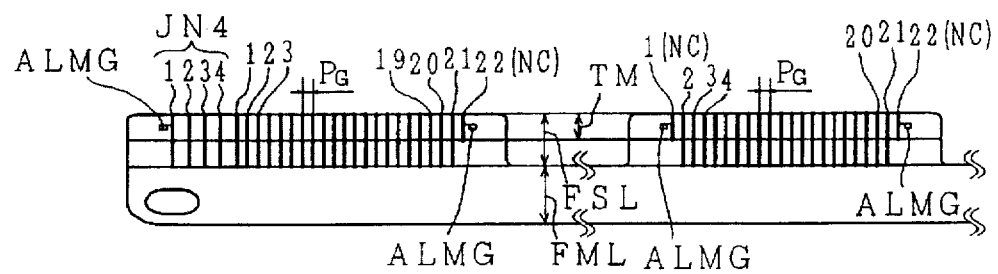
Figure 8D:
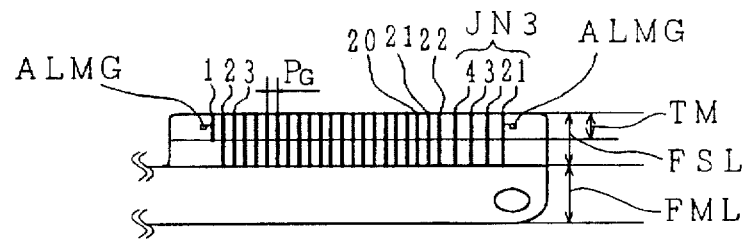
Figures 9A, 9B, 9C:
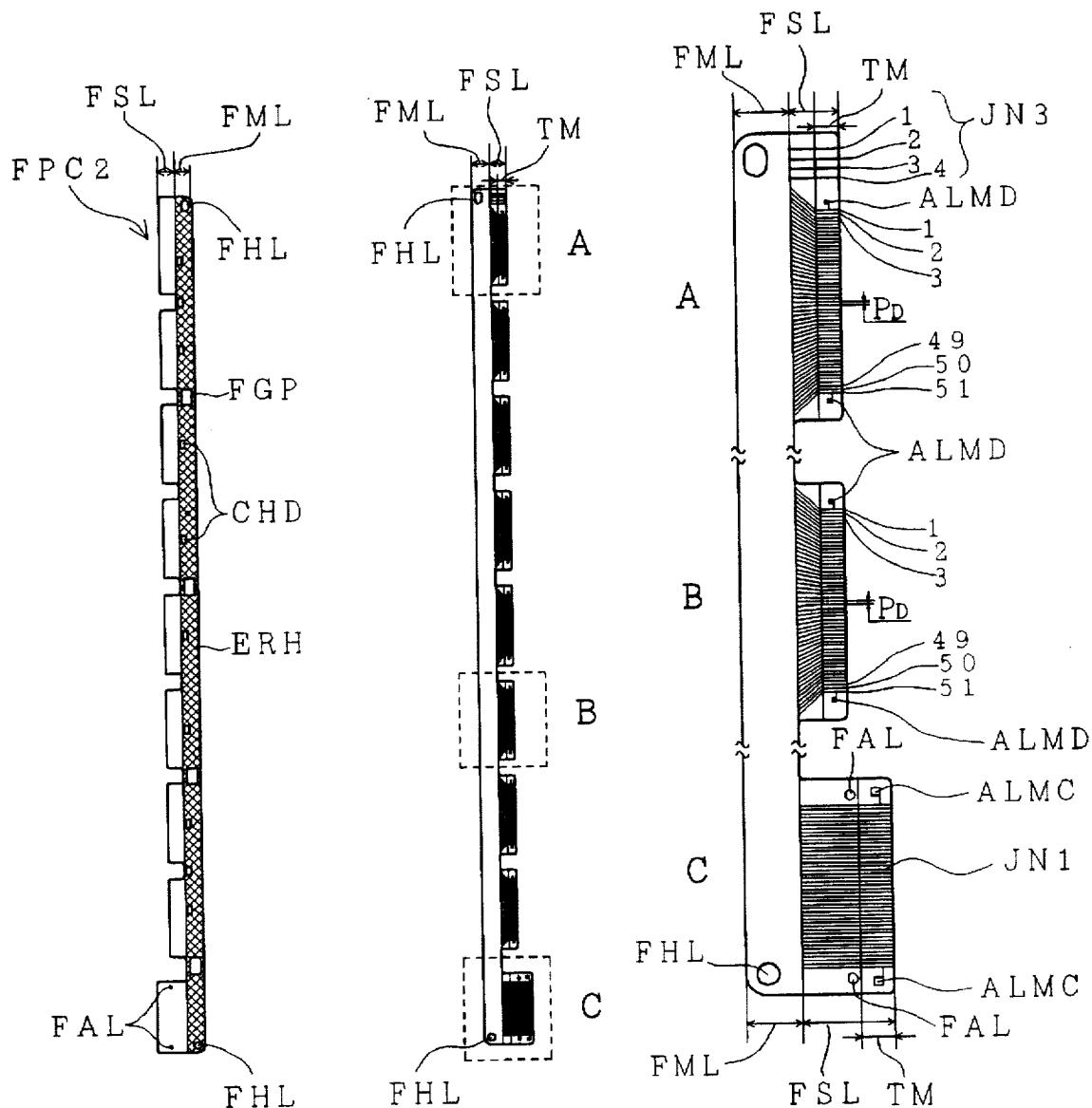
FIGS. 9A, 9B and 9C are a top plan view and a bottom view of the multi-layered flexible substrate used in the present embodiment for driving drain driver ICs at one side, and an enlarged view of an essential portion of the conductor pattern.
Figures 10A, 10B, 10C:
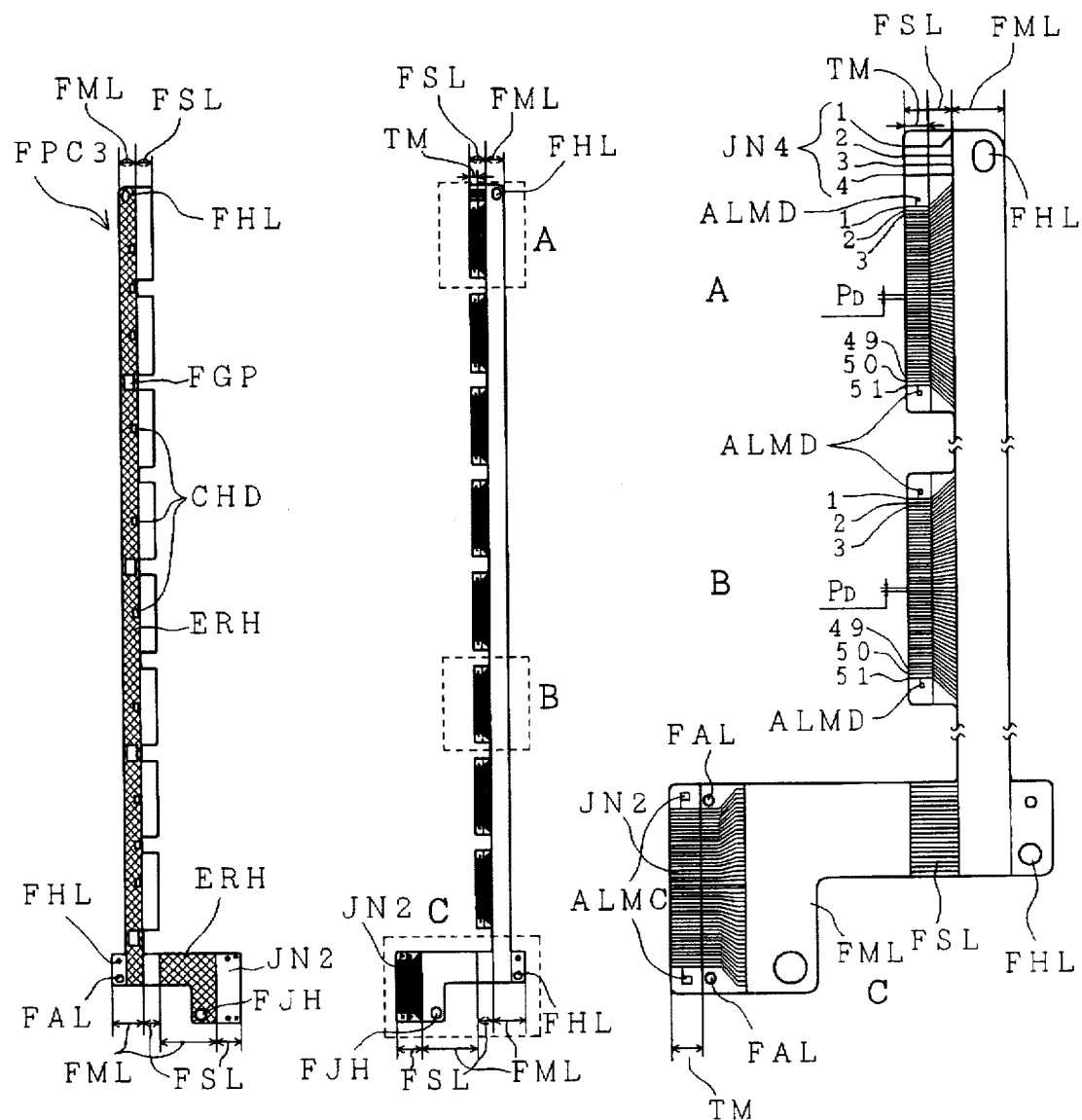
FIGS. 10A, 10B and 10C are a top plan view and a bottom view of the multi-layered flexible substrate used in the present embodiment for driving drain driver ICs at the other side, and an enlarged view of an essential portion of the conductor pattern.

FIGS. 8A and 8B are a top plan view and a bottom view of the multi-layered flexible substrate FPC1 for driving the gate drive ICs, and FIG. 8C is an enlarged view of an essential portion of the conductor patterns of the portions A, B and FIG. 8D is an enlarged view of portion C in the multi-layered flexible substrate. FIGS. 9A and 9B are a top plan view and a bottom view of the multi-layered flexible substrate FPC2 for driving the drain drive ICs, and FIG. 9C is an enlarged view of an essential portion of the conductor pattern of the portions A, B and C on the multi-layered flexible substrate. FIGS. 10A and 10B are a top plan view and a bottom view of the multi-layered flexible substrate FPC3 for driving the drain drive ICs, and FIG. 10C is an enlarged view of an essential portion of the conductor pattern of the portions A, B and C in the multi-layered flexible substrate.

Here will be described the alignment mark on the flexible substrate.

In the flexible substrates FPC1 to FPC3 shown in FIGS. 8 to 10, the connecting terminal portion TM has its length ordinarily designed to about 2 mm so as to ensure the connection reliability. However, since the flexible substrates FPC1 to FPC3 have their longer sides elongated to 170 to 240 mm, even a slight positional displacement including the rotation in the direction of the longer axis may lead to a positional displacement between the input terminal wiring lines Td and the connecting terminal portion TM to cause a connection failure. The liquid crystal panel PNL and the flexible substrates FPC1 to FPC3 can be aligned by fitting the openings FHL opened in the two ends of each substrate on the stationary pins and then by aligning the input terminal wiring lines Td and the connecting terminal portion TM at several points. In the present embodiment, however, alignment marks are formed to improve the alignment accuracy.

Figure 24:
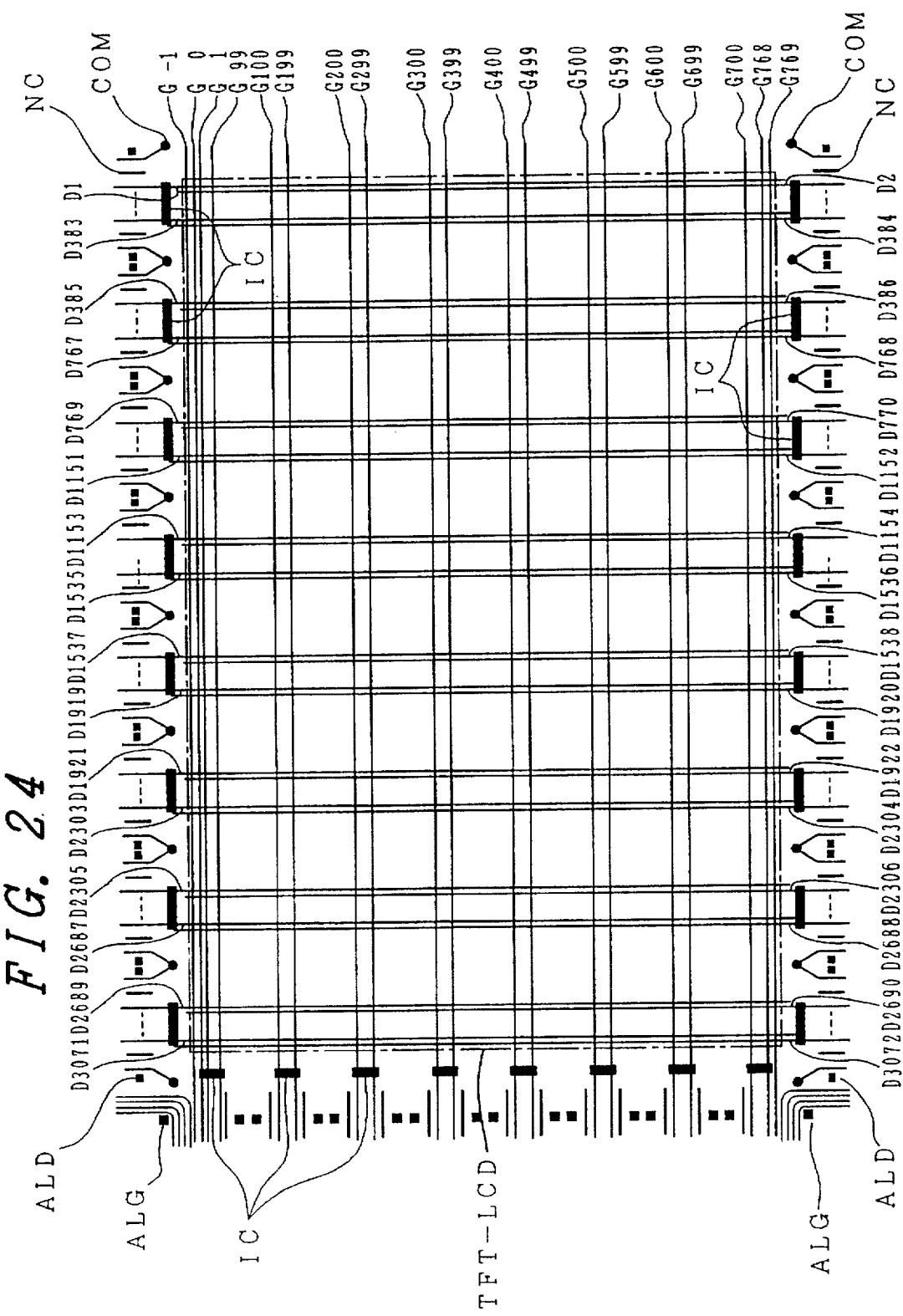
FIG. 24 is a top plan view showing the construction of the gate lines and drain lines and the periphery of the line lead-out portion of the TFT liquid crystal display panel of the present embodiment.
Figure 37:
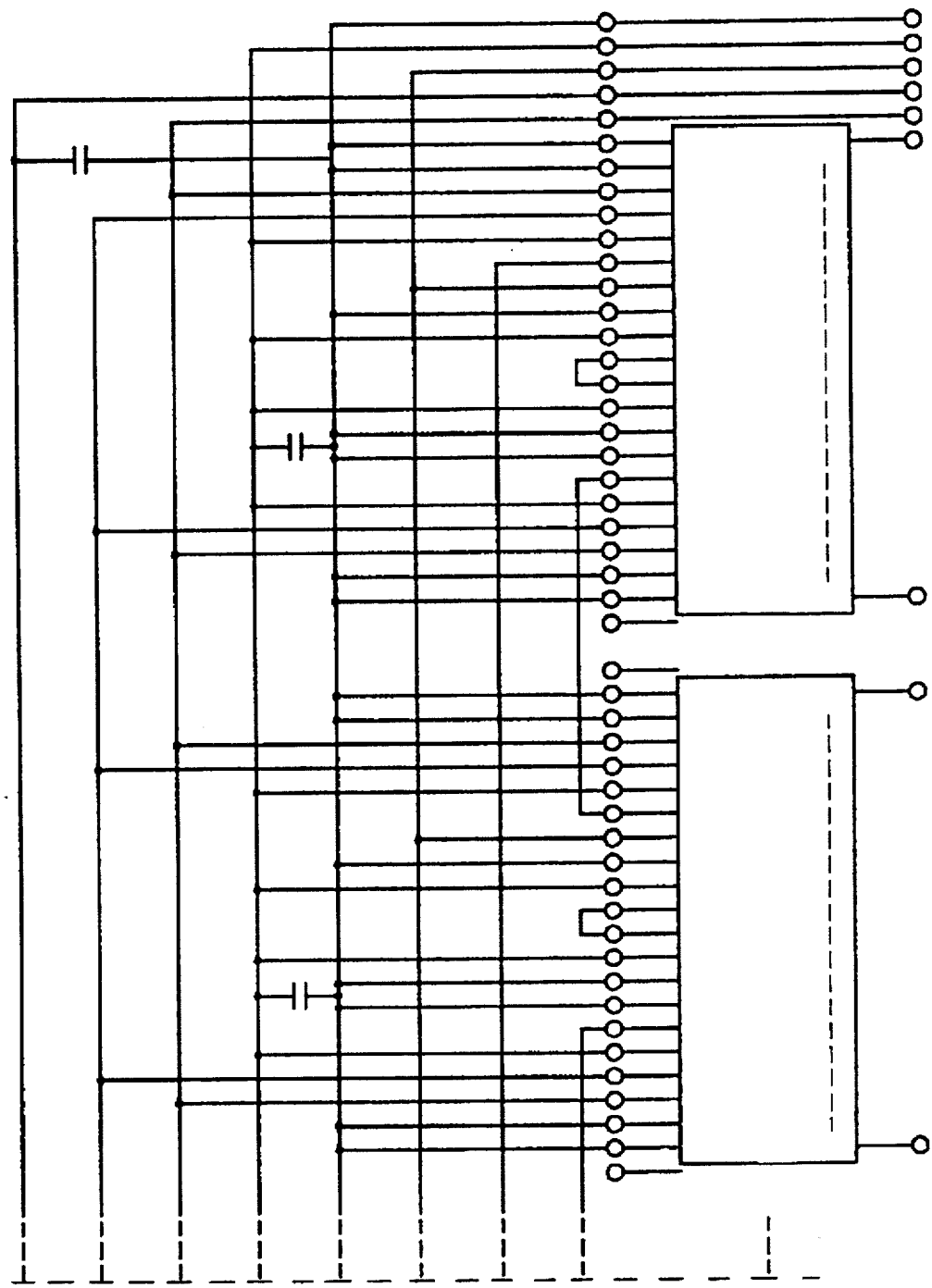
FIG. 37 is a diagram showing the connecting portion between the signals inputted to and outputted from the gate drive ICs and the input signals from the drain driver substrate in the TFT liquid crystal display module of the present embodiment.
Figure 38:
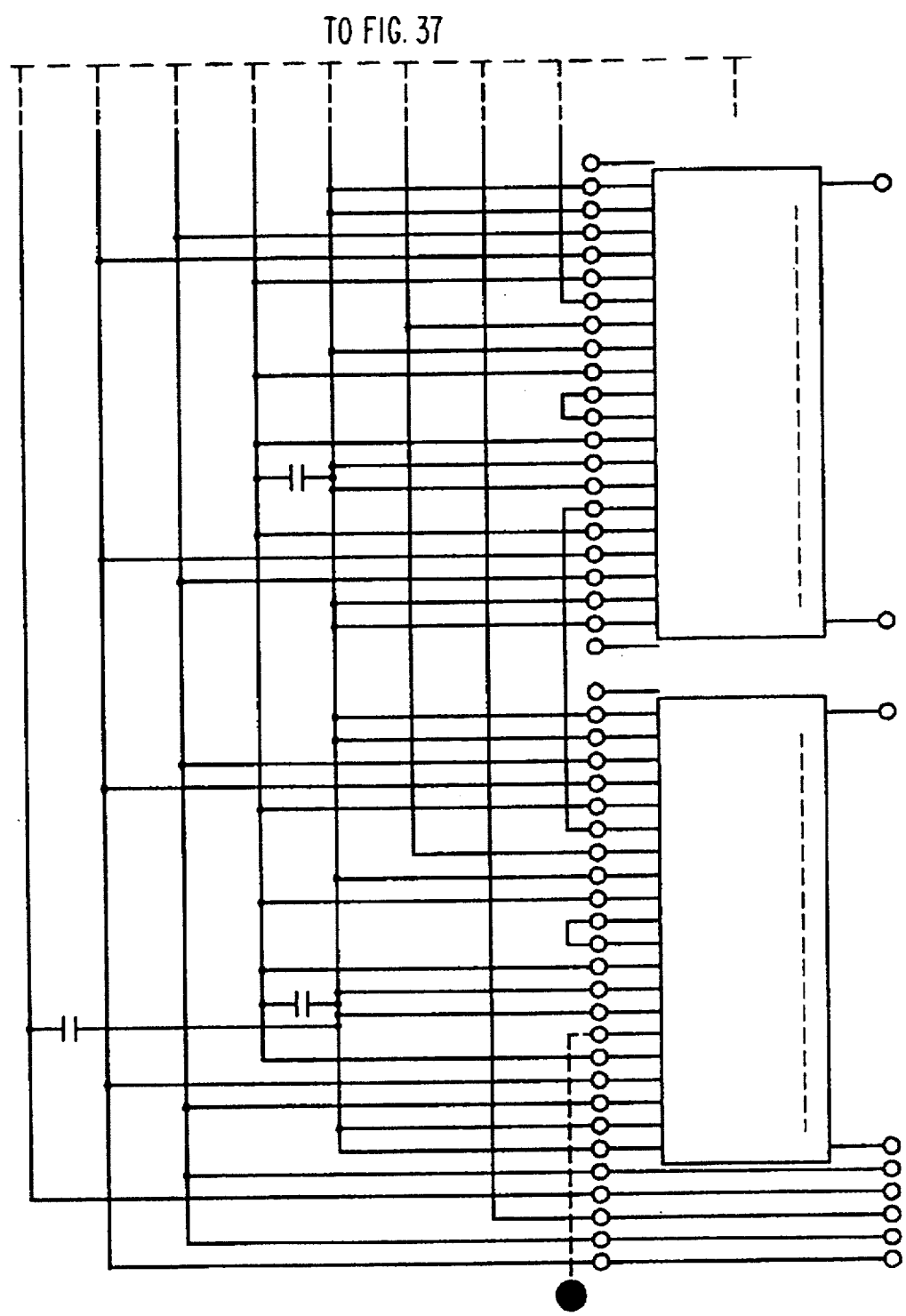
FIG. 38 is a diagram showing the connecting portion between the signals to be inputted to and outputted from the gate drive ICs and the signals to be inputted from the drain driver substrate in the TFT liquid crystal display module of the present embodiment.
Figure 39:
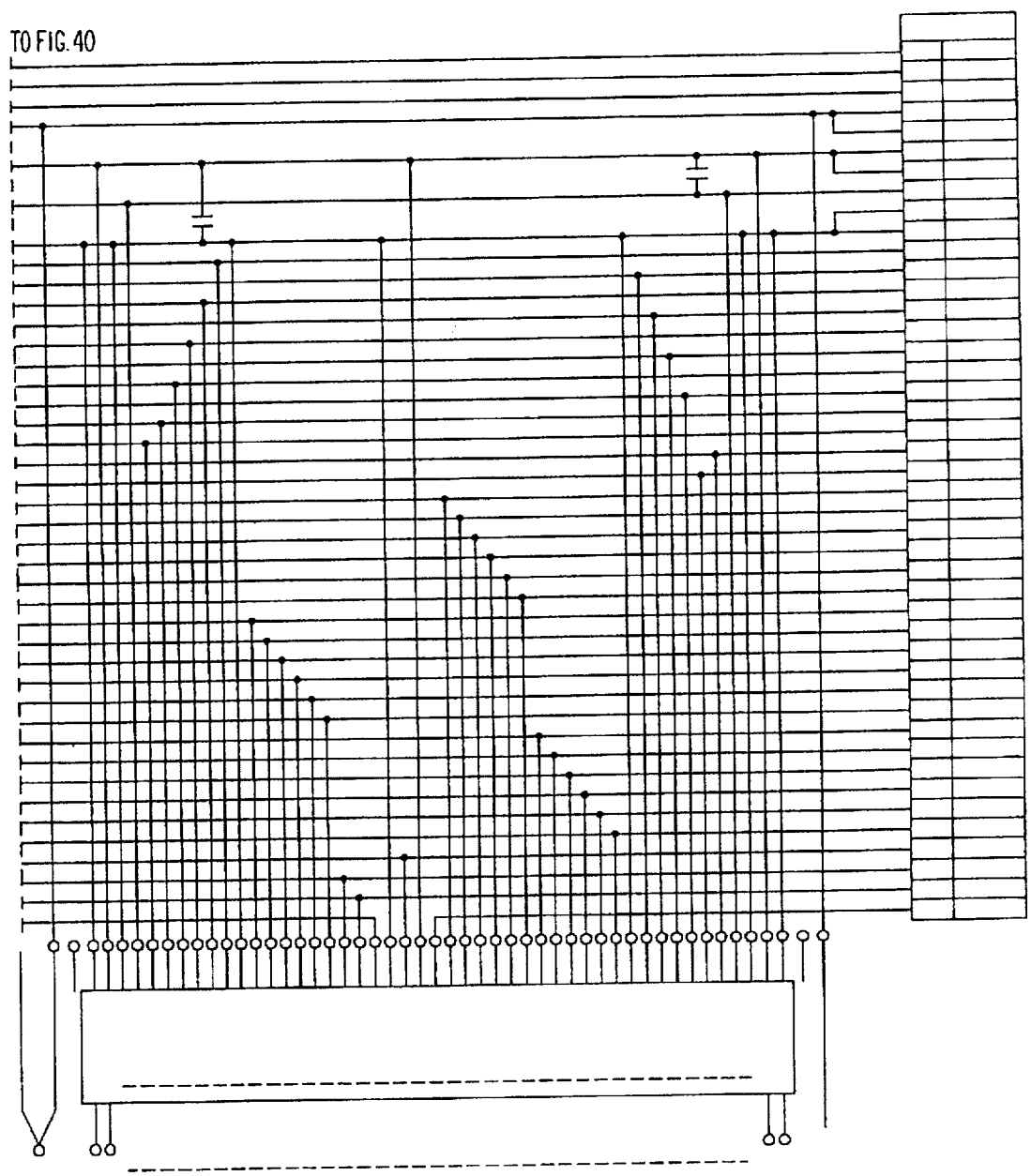
FIG. 39 is a diagram showing the connecting portion between an interface I/F4 and the signals to be inputted to the drain drive IC and of the outputs from the drain drive IC in the TFT liquid crystal display module of the present embodiment.
Figure 40:
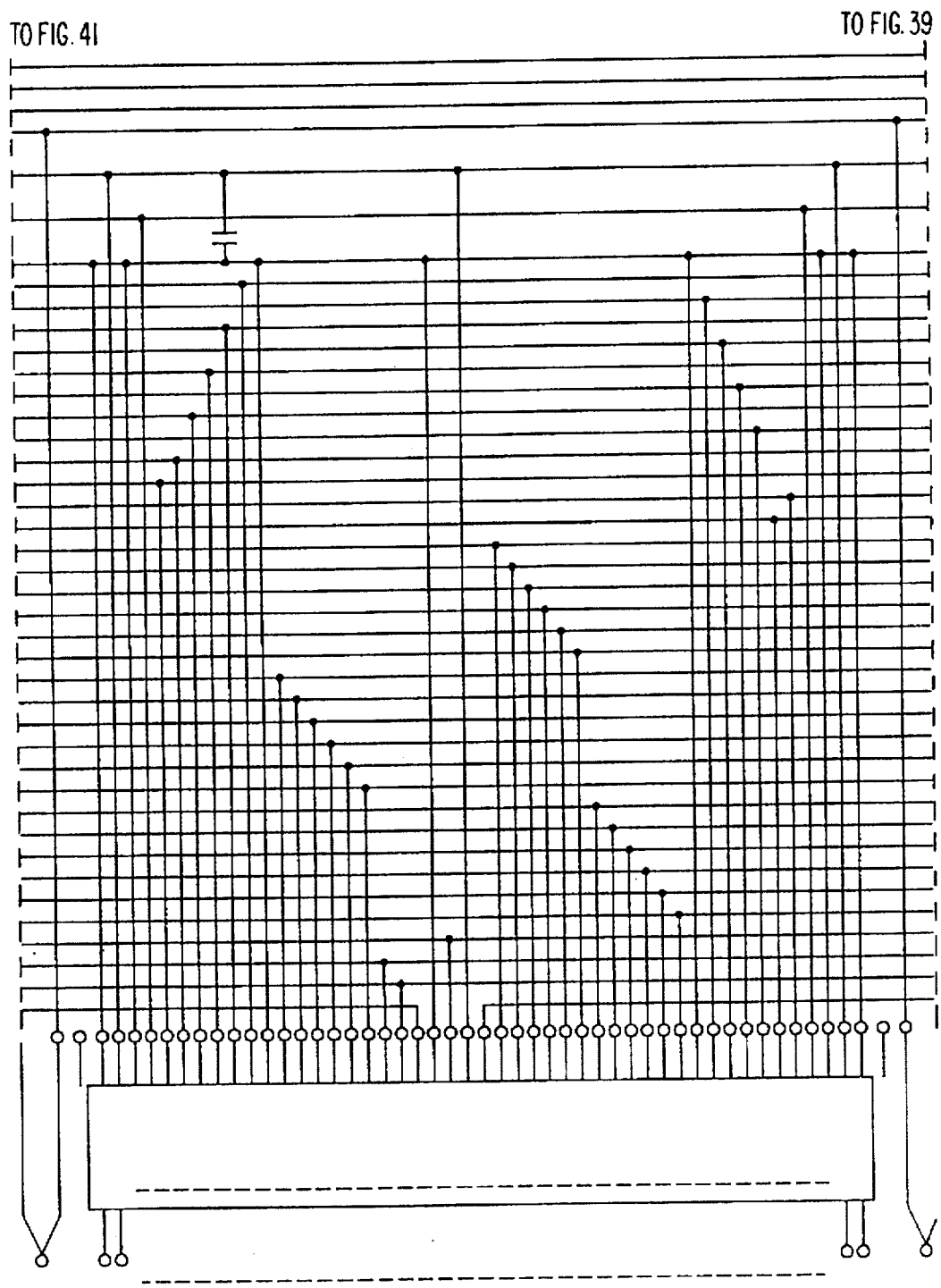
FIG. 40 is a diagram showing the connecting portion between an interface I/F4 and the signals to be inputted to the drain drive IC and of the outputs from the drain drive IC in the TFT liquid crystal display module of the present embodiment.
Figure 41:
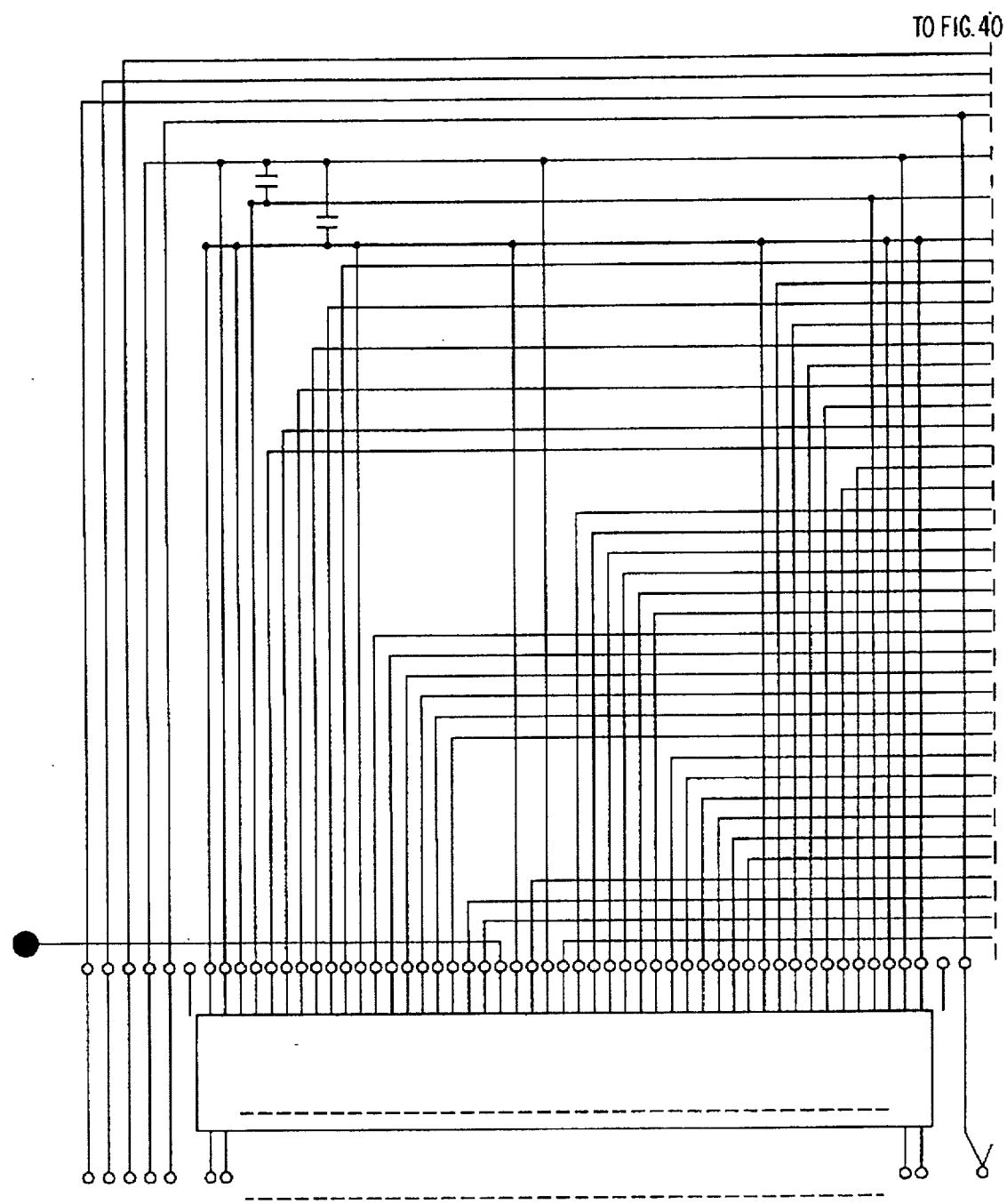
FIG. 41 is a diagram showing the connecting portion between an interface I/F4 and the signals to be inputted to the drain drive IC and of the outputs from the drain drive IC and the outputs to the gate driver substrate in the TFT liquid crystal display module of the present embodiment.
Figure 42:
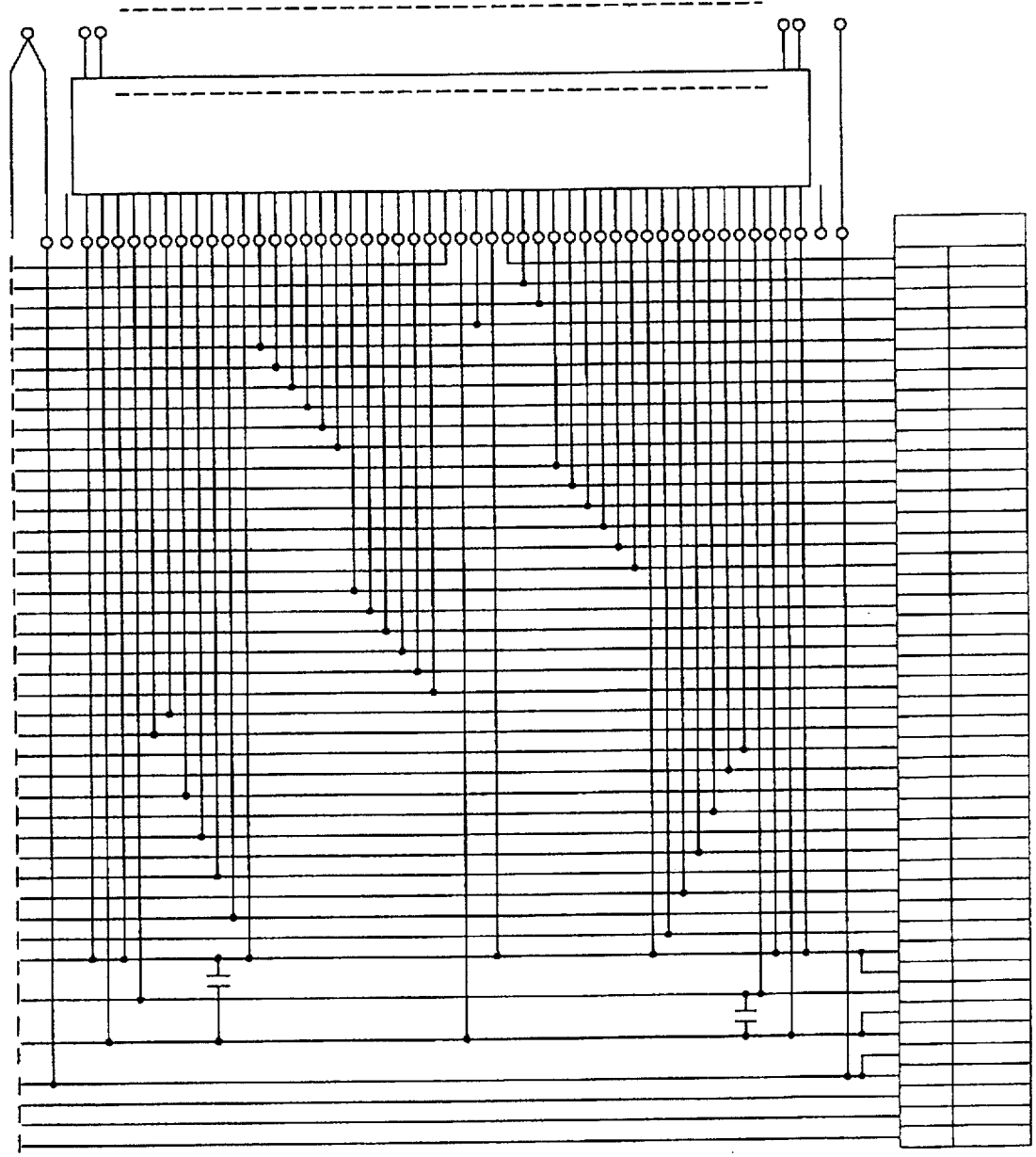
FIG. 42 is a diagram showing the connecting portion between an interface I/F5 and the signals to be inputted to the drain drive IC and of the outputs from the drain drive IC in the TFT liquid crystal display module of the present embodiment.
Figure 43:
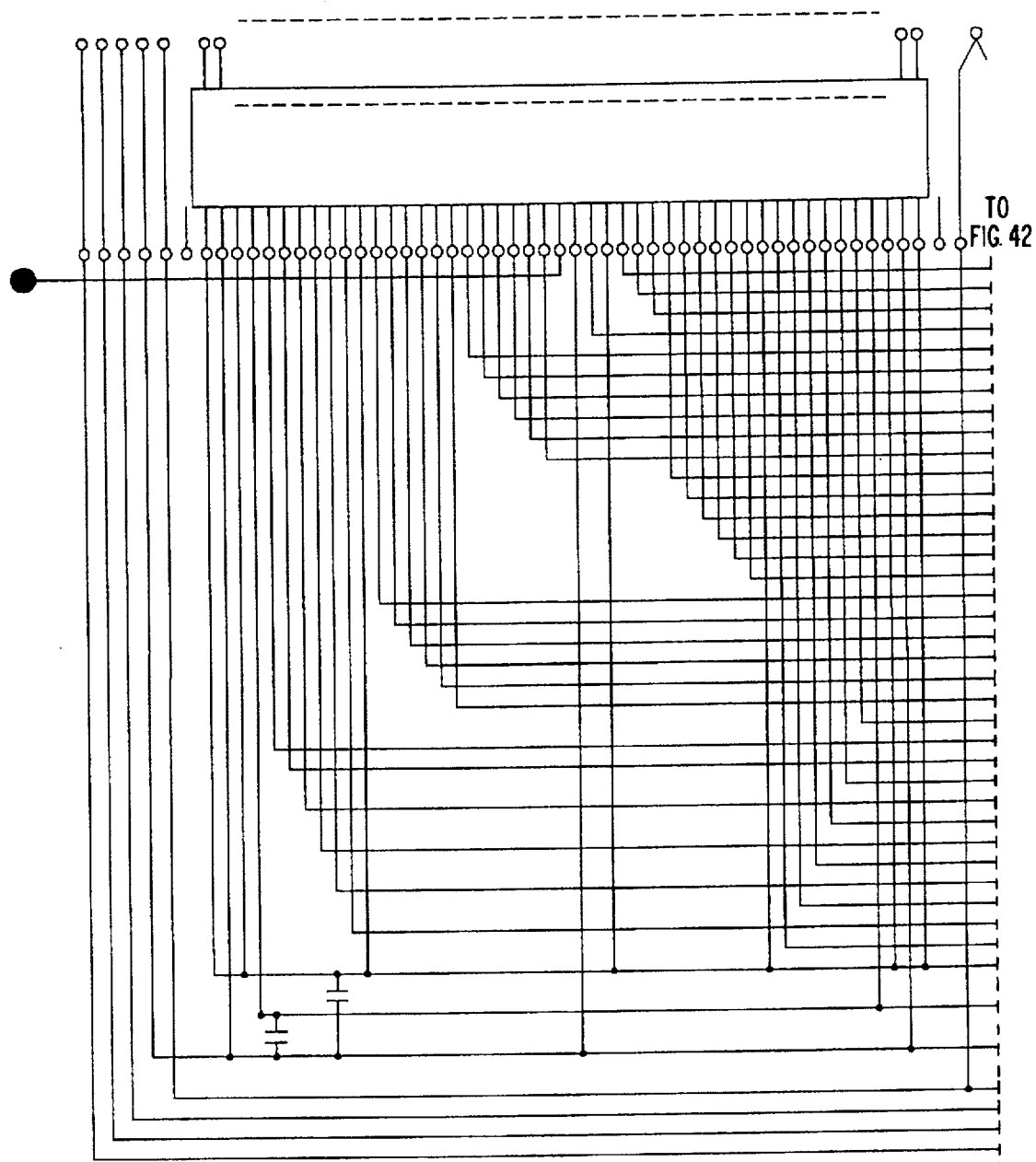
FIG. 43 is a diagram showing the connecting portion between an interface I/F5 and the signals to be inputted to the drain drive IC and of the outputs from the drain drive IC and the outputs to the gate driver substrate in the TFT liquid crystal display module of the present embodiment.

As shown in FIGS. 37 and 38, the gate driver drive ICs have totally twenty inputs V1R to V1L, which are electrically connected with the connecting terminal portions TM Nos. 2 to 21 of FIG. 8, respectively. The terminals TM have a pitch PG of about 600 µm. Alignment marks ALMG are positioned near the aforementioned twenty terminals TM to the individual drive ICs to improve the positioning accuracy with the pattern of the input terminal wiring lines Td and to inspect the connections. In order to improve this connection reliability, in the present embodiment, dummy lines (for the terminal Nos. 1 and 22) are arranged adjacent to the twenty input terminals TM, and the square alignment marks ALMG are connected in their pattern with the aforementioned dummy lines NC so that square solid patterns ALG (as shown in FIG. 24) on the opposed transparent substrate SUB1 are just fitted in the squares. In the present embodiment, moreover, the two ends of the FPC1 are formed with the joint patterns JN3 and JN4 for connecting the drain driver substrates FPC2 and FPC3 so that the alignment marks ALMG are connected in their pattern with the No. 1 in the outer most wiring line pattern JN4 or in the pattern JN3.

Figure 22:
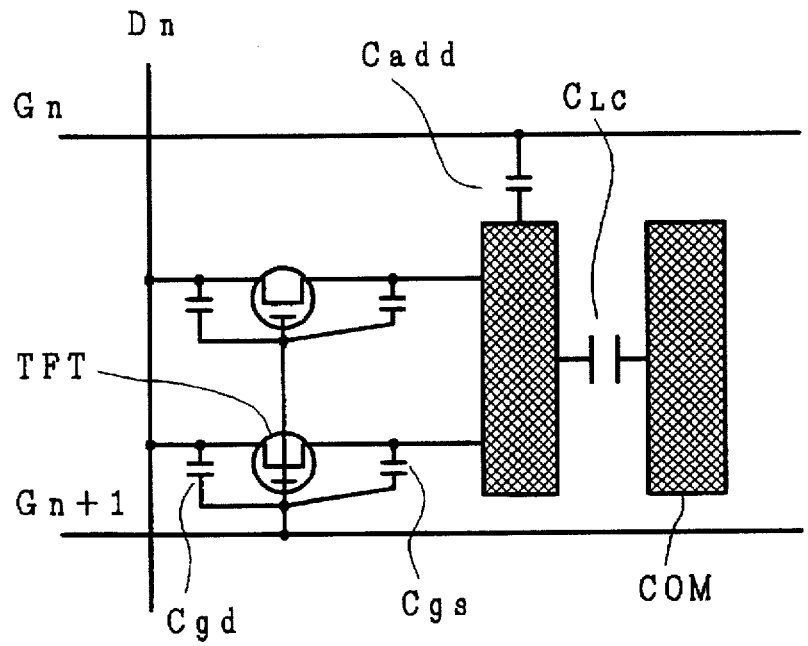
FIG. 22 is a diagram showing an equivalent circuit of one dot of the TFT liquid crystal display panel shown in FIG. 21.

Although shown in FIGS. 39 to 43, the drain driver drive ICs have totally forty seven inputs between terminals AVDD to AVDD, and these inputs are electrically connected with the connecting terminal portions TM Nos. 3 to 49, as shown in FIGS. 9 and 10. The terminals TM have a pitch PD of about 370 µm. In the present embodiment, alignment marks ALMD are arranged with the connection reliability improving dummy lines NC (having terminal Nos. 2 to 50) adjacent to the aforementioned forty seven input terminals TM. Outside of the dummy lines NC, the terminals (Nos. 1 and 51) shown in FIGS. 9 and 10 are arranged to apply the voltage to a common transparent pixel electrode COM (as shown in FIG. 22), which is arranged as the opposed electrode of a liquid crystal capacitor C1c, inside of a transparent insulating substrate SUB2. Thus, the common voltage is applied through the wiring line Td pattern on the transparent insulating substrate SUB1 from the conductive beads or paste to the common transparent pixel electrode COM at the side of the transparent insulating substrate SUB2.

The alignment marks ALMD are connected in their pattern with the terminals (Nos. 1 and 51) which are electrically connected with that electrode COM, and are aligned with square solid pattern ALD (as shown in FIG. 4) on the transparent substrate SUB1. In the present embodiment, moreover, there are formed the jointing patterns JN3 and JN4 for connections with the gate driver substrate FPC1 at the upper end portions of the FPC2 and FPC3 of FIGS. 9 and 10. Moreover, the lower end portions of the FPC2 and FPC3 are formed over the multi-layered printed board for the power supply circuit and the controller circuit with the jointing wiring patterns JN1 and JN2, and an alignment mark ALMC is connected in its pattern with the outermost wiring line.

Here will be described the shape of the conductor layer portion FSL having two or less layers.

The portion FSL, as formed of single or two conductor wiring layers, is given a protrusion of about 4.5 mm in the present embodiment because it is formed with the folded portion BNT (as shown in FIG. 7). In the structure having no folding, however, the portion FSL can be made shorter.

The portion FSL is bulged separately to the individual drive ICs. As a result, it is possible to prevent the phenomenon that the flexible substrate is thermally expanded in the direction of its longer axis at the thermal contact bonding time by the heat tool to change the pitch PG or PD of the terminals TM thereby to cause the peel from or insufficient connection with the connection terminals Td. In short, thanks to the separate bulges to each drive IC, the deviation of the pitches PG and PD of the terminals TM can be almost equivalent to the amount arising from the thermal expansion of the length of the period of each drive IC. In the present embodiment, thanks to the bulging shape as divided into eight in the direction of the longer axis of the flexible substrate, the thermal expansion can be reduced to about one eighth to contribute to the damping of the stress to the terminals TM thereby to improve the reliability of the liquid crystal module MDL against the heat.

As described above, by providing the alignment marks of ALMG and ALMD and the projection of the portion FSL separately to the individual drive ICs, the peripheral drivers can be reduced while retaining the accuracy and the connection reliability even if the numbers of the connection wiring lines and the display data increase.

Here will be described the conductor layer portion FML having two or more layers.

In the conductor layer portions FML of the FPC1 to FPC3, there are packaged the chip capacitors CHG and CHD. Specifically, the gate side substrate FPC1 is soldered at totally ten portions C41 to C50, as shown in FIGS. 37 and 38, between a ground potential Vss (at 0 V) and a power supply Vdg (at 10 V) or between a power supply Vsg (at 5 V) and the power supply Vdg. Moreover, the drain side FPC2 and FPC3 are soldered, as shown in FIGS. 39 to 43, such that the substrate FPC2 is soldered at totally ten portions C21 to C30 between the ground potential Vss and a power supply Vdd (at 5 V) or between the ground potential Vss and a power supply Vdp (at 2.5 V) whereas the substrate FPC3 is soldered at totally ten portions C31 to C40. These capacitors CHG and CHD are provided to reduce the noise to be superposed on the power supply line. Incidentally, in order to enhance the soldering accuracy, small holes FAL can be formed in the substrates FPC1 to FPC3 to mount the chip capacitors automatically over the substrates.

The present embodiment is so designed that those chip capacitors are soldered to only the surface conductor layer L1 at one side and are all located at the side of the shield casing SHD, after folded, to take planarly common portions with the openings SHL of the shield casing SHD. As a result, the power noise smoothing capacitors can be mounted on the substrates FPC1 to FPC3 while retaining the thickness of the liquid crystal module MDL constant.

Here will be described a method of reducing the high-frequency noise to be generated from the data processing device.

Since the metal shield casing SHD is located at the surface side of the liquid crystal module MDL and at the front side of the data processing device, the EMI (electromagnetic interference) noise from that side will cause serious problems in the circumstance of using the external devices.

Figure 14A:
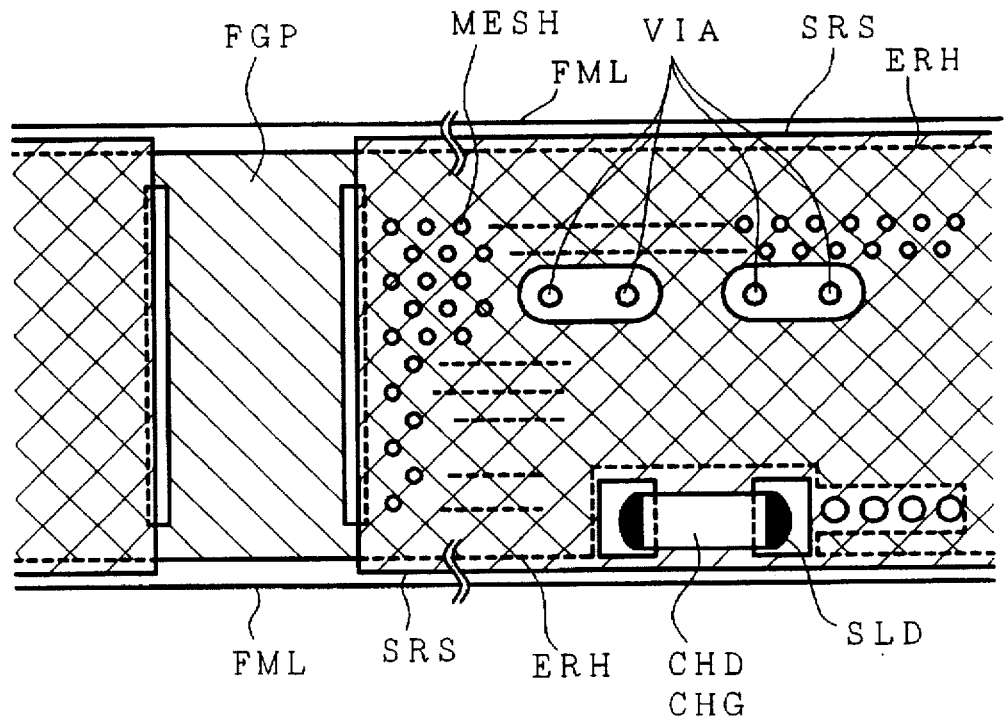
FIG. 14A is a top plan view showing the pattern of the surface conductor layer in the two or more layered portion of the multi-layered flexible substrate used in the present embodiment.

In the present embodiment, therefore, the conductor layer portion FML has its surface layer L1 coated as much as possible with the solid or mesh-shaped pattern ERH. FIG. 14A is a top plan view showing the pattern construction of the FML portion in the portion D of FIG. 8. The mesh MESH is formed with a number of holes formed in the surface conductor layer L1 to have a diameter of 300 μm, and this mesh-shaped pattern ERH covers the substantially whole surface excepting the via holes VIA and the capacitor parts CHD and CHG.

Moreover, the patterns FGP, in which the pattern ERH is exposed from the solder resist SRS, are arranged at two portions in the gate side substrate FPC1 and at four portions individually in the drain side substrates FPC2 and FPC3 and are soldered to the FGF ground of the shield casing SHD thereby to reduce the EMI noises. In case the peripheral circuit is divided into a plurality of substrates, as in the present embodiment, no electric problem will arise in a DC manner if at least one portion of the driver substrate is connected with the frame ground. In the high-frequency region, on the contrary, if the grounded portions are less, the potential for generating the unnecessary radiation waves to cause the EMI is caused by the reflection of the electric signals or by the shaking of the potential of the ground wiring lines due to the difference in the characteristic impedance of the individual driver substrates. Especially the active matrix type module MDL using the thin fill transistors is difficult to eliminate the EMI because it uses a high-speed clock. In order to prevent this difficulty, in at least one portion of each circuit substrate, the ground wiring line (at the AC ground potential) is connected with the common frame (i.e., the shield casing SHD) having a sufficiently low impedance. As a result, the ground wiring lines are strengthened in the high-frequency region, so that the radiation electric field intensity is drastically improved in the case of the present embodiment having the ten portions connected than in case only one portion is connected with the shield casing SHD.

Though, in the present embodiment, the conductor layer portion FML has been formed with four conductor layers, it can be formed with only two layers in minimum in case that the necessary wiring is not so many and the necessary clocks are relatively low in frequency. Specifically, the wiring in a peripheral substrate FPC1 for driving gate drive ICs can be formed with only two conductor layers.

<<Interface Circuit Board PCB>>

FIG. 11A is a bottom view of the interface circuit board PCB having the functions of the controller unit and the power supply unit; FIG. 11B presents a side elevation and a front elevation of a hybrid in tegrated circuit HI mounted on the interface circuit board PCB; and FIG. 11C is a top plan view of the interface circuit board PCB.

The present embodiment adopts the eight-layered printed board made of a glass epoxy material as its substrate PCB. Although the multi-layered flexible substrate could be used, the relatively inexpensive multi-layered printed board is used because that portion does not adopt the folding structure.

All the electronic parts are mounted on the lower side of the substrate PCB or the back side, as viewed from the data processing device. Two integrated circuit elements TCON are arranged as the display controller at the right and left sides of the substrate. The interface connector CT is located at the central portion of the substrate, on which are further mounted a plurality of resistors and capacitors. The brightness adjusting volume VR can have its knob portion adjusted from the outside through the hole CVL of the shield casing SHD, which is planarly in the same position as the hole PVL of the substrate PCB, as described hereinbefore.

The reason why the two integrated circuit elements TCON are used is to reduce the external size of the PCB substrate, to disperse the power consumption and to feed the signals efficiently to the drain driver ICs arranged in one row in the two longer sides of the liquid crystal panel PNL. This TCON division method will be described in more detail in connection with the item of <<Division of Display Control Integrated Circuit Element TCON>>.

In the present embodiment, moreover, the substrate PCB is arranged around the seal port EPX (as shown in FIG. 6) of the liquid crystal panel PNL so that it can be kept away contact with the projection of the seal port EPX by arranging a recess PCN in the vicinity of the center of the substrate PCB. As a result, the substrate PCB can be brought closer by about 1 mm to the liquid crystal panel PNL thereby to make the external shape of the module MDL advantageously compact. Likewise in case the seal port EPX is positioned not at the center of the liquid crystal panel PNL but at or close to the corner portion, the recess PCN can be arranged to avoid the projection of the seal port EPX.

Moreover, the hybrid integrated circuit HI is partially integrated into a hybrid structure, in which mainly a plurality of integrated circuits and electronic parts for making the power supply unit are packaged on the upper and lower sides of the small circuit board, and is mounted on the interface circuit board PCB. As shown, the hybrid integrated circuit HI has its leads elongated to package a plurality of electronic parts EP including the TCON on the circuit board PCB between the circuit board PCB and the hybrid integrated circuit HI. Incidentally, the substrate PCB is formed with four holes CAL for automating the packaging the parts.

On the other hand, the electric connection between the drain driver substrates FPC2 and FPC3 and the interface circuit board PCB is effected in the present embodiment by an anisotropic conductive film ACF1.

Figure 12A:
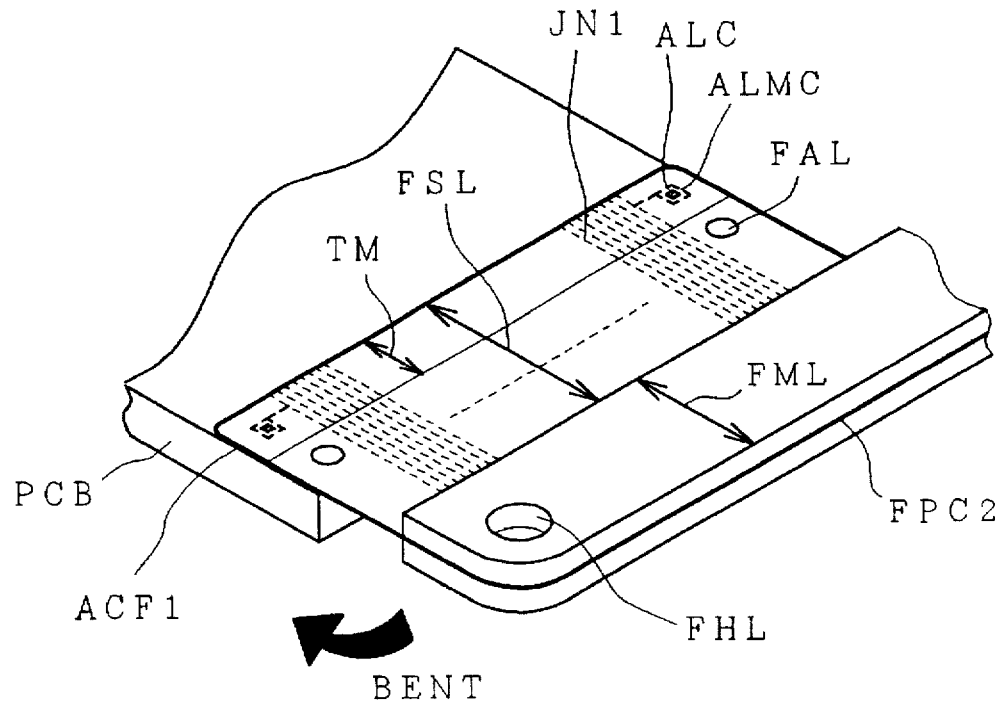
FIG. 12A is a perspective view showing the state in which the multi-layered flexible substrate and the multi-layered printed board used in the present embodiment are electrically connected through an anisotropic conductor film.

FIG. 12A is a perspective view showing the state in which the multi-layered flexible substrate FPC2 is electrically connected with the multi-layered printed board PCB through the anisotropic conductive film ACF1.

This electric connection is performed by adhering an anisotropic conductive film ACF to the connection portions JN1 and JN2 of the substrate PCB, by temporarily fixing the holes FHL of the substrates FPC2 and FPC3 on the positioning pins of a jig, and by coarsely aligning a hole CJH and a hole FJH of the FPC3. In order to improve the alignment accuracy, the substrate PCB is arranged with a square solid pattern ALC. The flexible substrate is temporarily thermally contact-bonded by means of a heat tool while that pattern ALC is positionally adjusted to be registered with the square alignment pattern ALMC at the FPC2 and FPC3 side. After no positional displacement has been confirmed, the proper thermal contact-bonding is effected to fix the substrates FPC2 and FPC3 on the substrate PCB.

The reason for using the anisotropic conductive film ACF is required by the restriction on the external shape, i.e., the substrate PCB having a width of about 20 mm. As a result, the connection portions JN1 and JN2 have their width reduced to about 15 mm, in which about forty four (as indicated at I/F4 and I/F5 in FIGS. 39 and 42) signal lines and power supply lines have to be wired so that the wiring line pitch decreases to about 340 μm. Therefore, the soldering in the prior art is difficult to effect the highly reliable electric connections. As a result, the interface substrate can be electrically connected in a highly reliable manner according to the present means even if the numbers of pixels and display colors are increased to narrow the wiring line pitch.

Figure 14B:
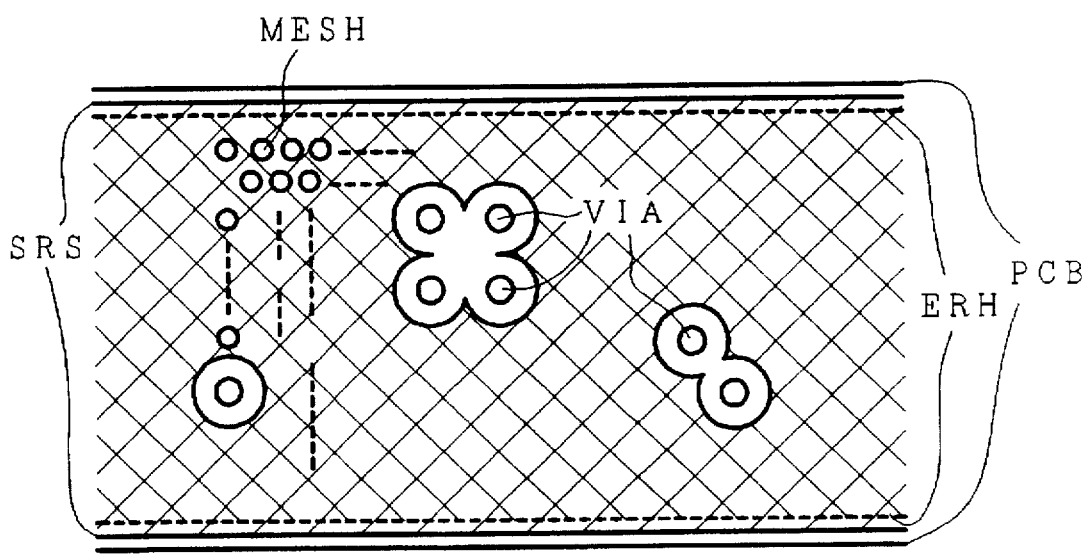
FIG. 14B is a top plan view showing the state in which the surface is substantially wholly covered with a mesh-shaped pattern fixed at a DC voltage.

The substrate PCB has its upper side located at the surface side, as viewed from the data processing device, that is, in the direction to have the highest potential for irradiating the EMI noises. In the present embodiment, therefore, the top surface conductor layer is coated substantially all over its surface with the ground solid or mesh-shaped pattern ERH, as shown in FIG. 11C. FIG. 14B is an enlarged front elevation of the pattern ERH. The mesh-shaped pattern ERH of a copper conductor below the solder resist SRS is coated all over its surface excepting the via holes VIA. This pattern ERH is enabled to reduce the EMI noise radiation by soldering the lower side pattern FGP of the substrate PCB and the FGN ground of the shield casing SHD.

As described before, the flexible substrates FPC1 to FPC3 also have their surface conductor layers coated with the pattern ERH, and the liquid crystal panel PNL has its four sides fixed therearound at the DC potential so that the EMI noise radiation from the inside of the substrates can be effectively reduced.

<<Circuit Board Assembly ASB Integrated with Liquid Crystal Display Panel PNL>>

Figure 16:
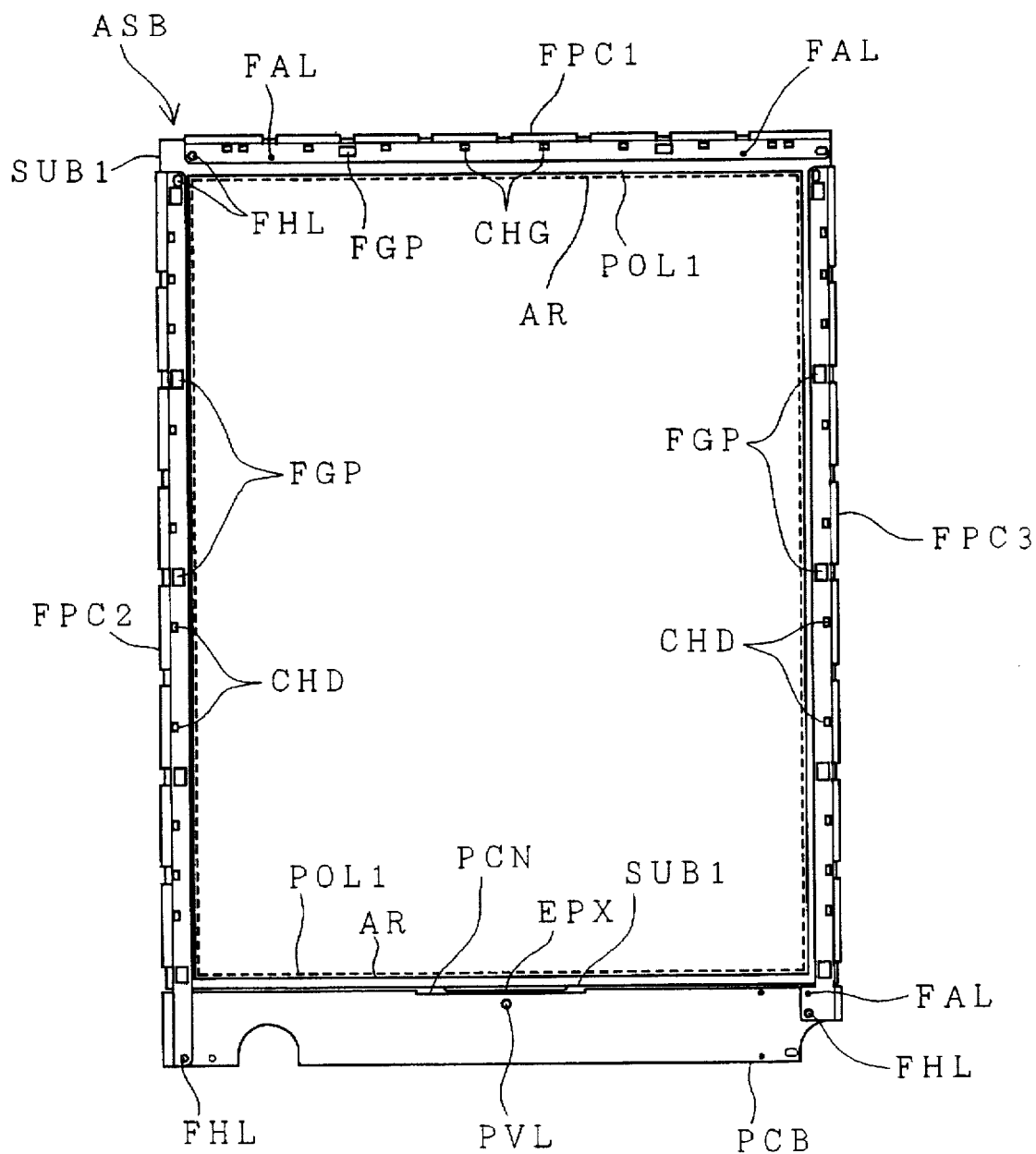
FIG. 16 is a top plan view of a circuit board assembly ASB integrated with the liquid crystal display panel PNL after the multi-layered flexible substrates have been folded by 180 degrees.

FIG. 16 is a top plan view of a circuit board assembly ASB integrated with the liquid crystal display panel PNL.

To the side of the transparent insulating sub strate SUB1, as opposed to the side formed with pixel pattern, there are folded and adhered the flexible substrates FPC1 to FPC3. Just (e.g., about 1 mm) outside of an effective pixel area AR, there is disposed a polarizing plate POL1, which is spaced by about 1 to 2 mm from the FML end portions of the substrates FPC2 and FPC3. The distance from the end of the transparent insulating substrate SUB1 to the leading ends of the folded projections of the FPC1 to FPC3 is as small as about 1 mm so that a compact packaging can be achieved. In the present embodiment, therefore, the distances from the effective pixel area AR to the leading ends of the folded protrusions of the substrates FPC1 to FPC3 are about 10 mm at the drain side and about 12 mm at the gate side.

Here will be described the method of folding and packaging the flexible substrates.

Figure 12B:
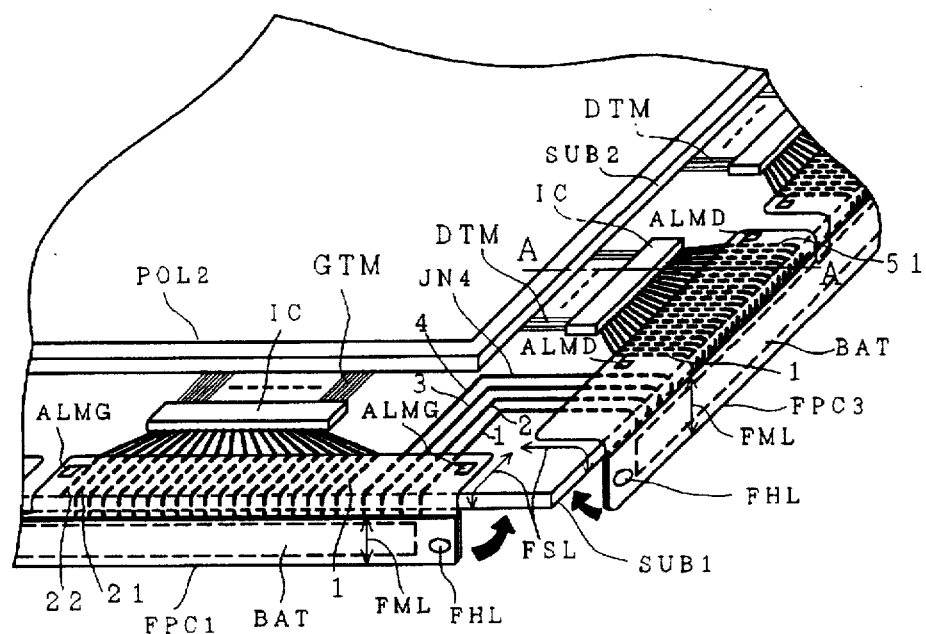
FIG. 12B is a perspective view showing a method of folding the foldable multi-layered flexible substrate used in the present embodiment.

FIG. 12B is a perspective view showing a method of folding and packaging the multi-layered flexible substrate. The drain driver substrates FPC2 and FPC3 and the gate driver substrate FPC1 can be connected by using a flexible substrate as a joiner and can be folded and packaged, if necessary, at that portion. In the present embodiment, however, the inter-substrate electric connection patterns JN3 and JN4 are formed on the transparent insulating substrate SUB1 so as to reduce the parts number and facilitate the folding/packaging.

In the present embodiment, moreover, the input wiring portion for feeding the input signals to a plurality of drive ICs formed over the liquid crystal display panel at the gate and drain sides is formed on in a direction substantially normal to the substrate cut face. Moreover, the common wiring portion for feeding the supply voltage and the clock between the drive ICs is formed in the foldable multi-layered conductor layer portion FML of the flexible substrate so that the wiring lines are generally in parallel with the substrate cut face. As a result, the input wiring portion on the liquid crystal display panel can be reduced to the minimum size, and the wiring resistance of the common wiring portion can also be reduced to raise no driving problem.

First of all, in order to coarsely position the flexible substrates FPC1 to FPC3 and the liquid crystal panel PNL, the liquid crystal panel PNL is fixed in a predetermined position of the jig, and the holes FHL are inserted on the fixing pins of the jig to fix the substrates FPC1 to FPC3 tentatively. The liquid crystal panel PNL, as having an anisotropic conductive film ACF2 applied thereto, is more accurately positioned by the aforementioned alignment marks and is tentatively thermally contact-bonded by the heat tool. After no positional displacement has been confirmed again, the proper thermal contact bonding is performed to fix the flexible substrates FPC1 to FPC3 on the liquid crystal panel PNL.

Next, a double-coated tape is adhered to that face of the conductor layer portion FML of the flexible substrate, which has no parts mounted on its surface side, and the flexible substrate is folded at the conductor layer portion BNT by using a jig.

Figure 15:
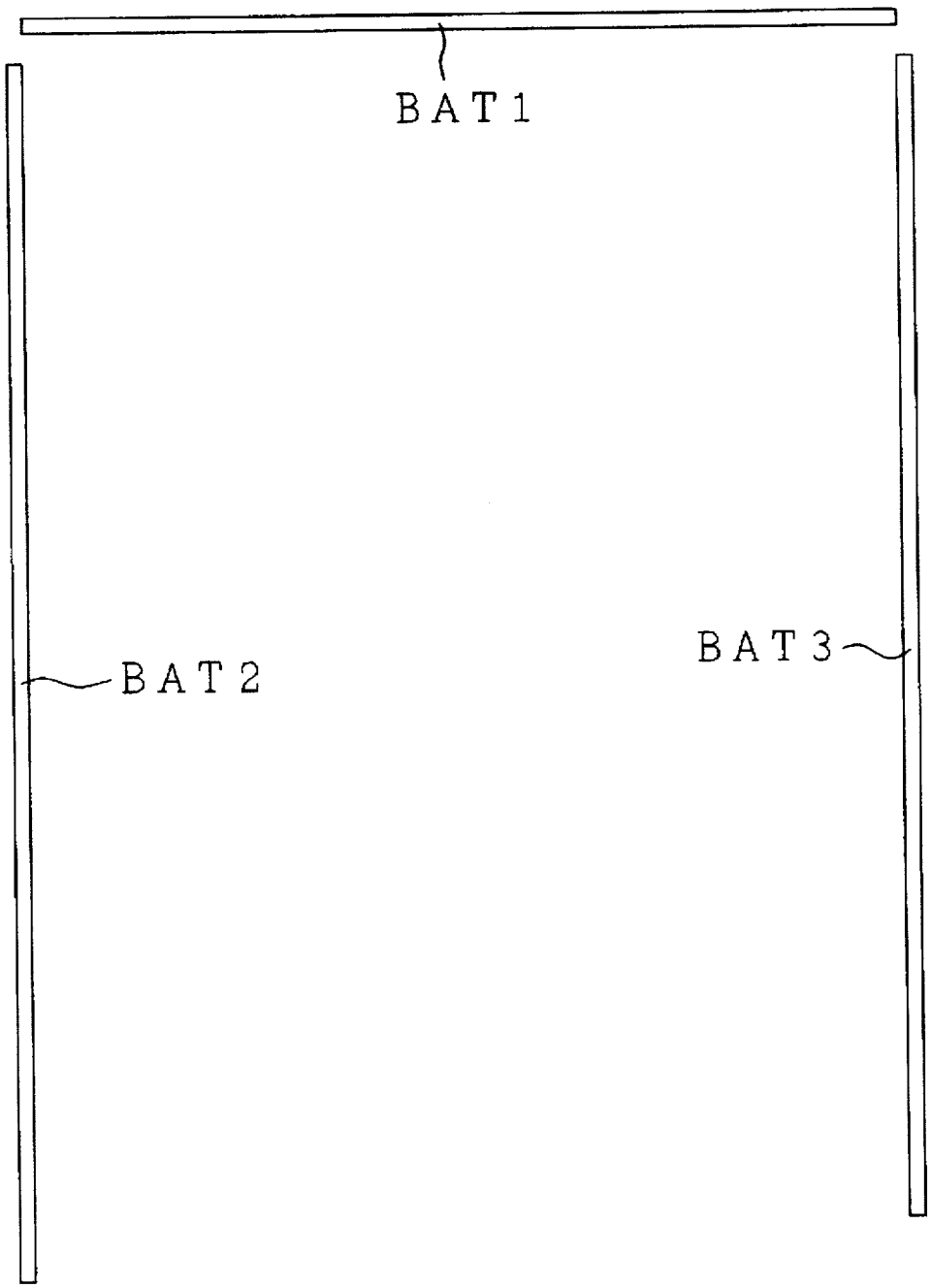
FIG. 15 is a top plan view of adhesive tapes.

FIG. 15 shows the double-coated tapes BAT1 to BAT3, as used. These tapes are elongated to have a width of 3 mm and a length of 160 to 240 mm but may be composed of several shorter ones to be applied, if they retain the adhesiveness. On the other hand, the double-coated tapes BAT1 to BAT3 may be applied in advance to the transparent insulating substrate SUB1.

As described above, the multi-layered flexible substrate can be accurately folded by using the jig and adhered to the surface of the transparent insulating substrate SUB1.

<<Electric Connection Patterns JN3 and JN4>>

The folding/packaging can be easily effected with the reduced number of parts by arranging the electric connection patterns JN3 and JN4.

Figure 26:
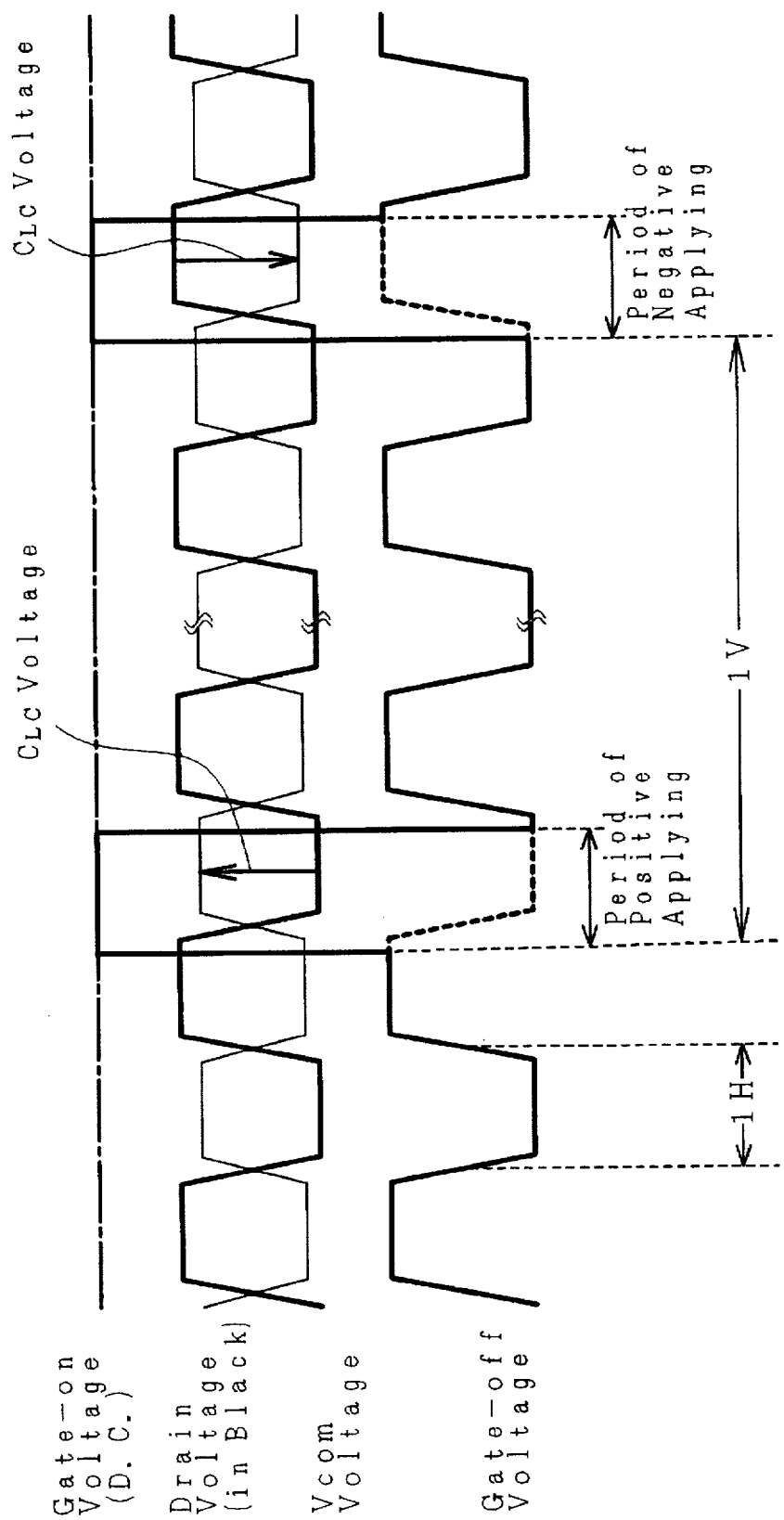
FIG. 26 is a diagram illustrating the levels and waveforms of a common voltage to be applied to a common electrode, a drain voltage to be applied to a drain electrode, and a gate voltage to be applied to a gate electrode in the TFT liquid crystal display module of the present embodiment.
Figure 31:
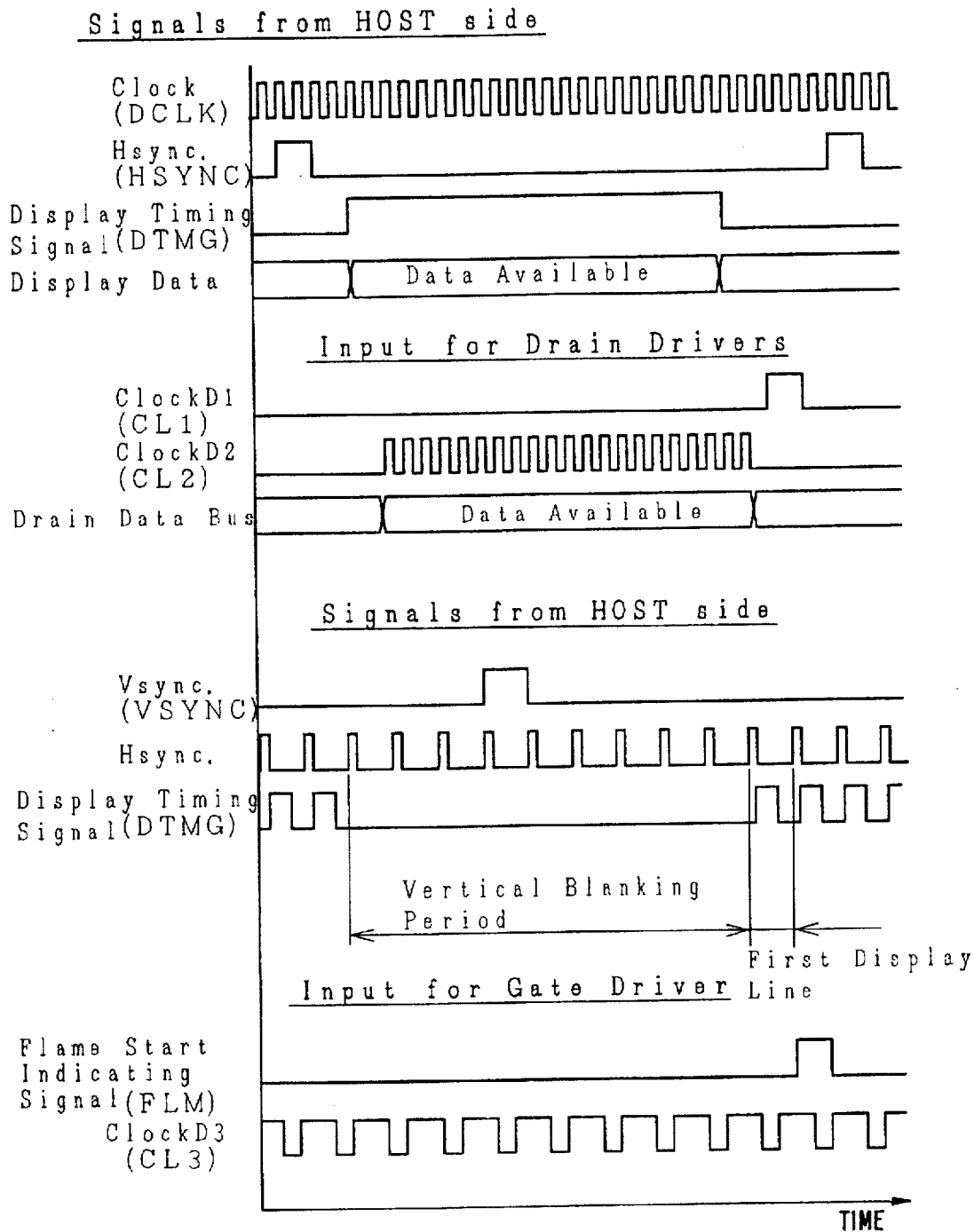
FIG. 31 is a timing chart of the display data to be inputted from a host computer to the display controller and the signals to be outputted from the display controller to the gate and drain drive ICs in the TFT liquid crystal display module of the present embodiment.

These electric connection patterns JN3 and JN4 are formed simultaneously with the pixel pattern of the liquid crystal panel PNL. In the present embodiment, the pattern JN3 is composed of four wiring lines (as shown in FIG. 37) which are arranged to have gradually lower voltages of Vdg (of 10 V), Vsg (of 5 V), CL3 (of the gate scanning clock) and Vss (of the ground) inward from the frame periphery of the substrate SUB1. Incidentally, the gate scanning clock CL3 (as shown in FIG. 31) is a low-frequency clock pulse having its level changing between 5 to 10 V for one horizontal period of about 20 sec (about 50 KHz). The pattern JN4 is also composed of four wiring lines (as shown in FIG. 38) which are arranged to have gradually smaller absolute voltages of Vee (of −17 V), Veg (of the gate-off voltage), FLM (of the frame start indicating signal) and Vss (of the ground) inward from the frame periphery. The voltage Veg (as shown in FIG.26) is a low-frequency clock pulse having its level changing between −17 to −11 V for two horizontal periods (of about 25 KHz). The voltage FLM (as shown in FIG. 31) is a low-frequency pulse having its level changing between 5 to 10 V for a period of 60 Hz. Thus, these AC signals raise no problem as the EMI noises because they have the low frequencies.

Moreover, the totally eight power supply and signal lines intersect in the multi-layered wiring lines of the gate driver substrate FPC1 and are connected with the input terminals of the gate drive ICs. As a result, the average DC voltage of the individual wiring lines on the substrate SUB1 can be arranged to monotonously change inward from the frame periphery without being restricted by the order of the input terminals of the gate drive ICs, thereby to prevent the migration between the wiring patterns under a high moisture circumstance and to reduce the electromagnetic interference between the wiring lines. As to the wiring line width, the Vss power supply line is thickened while considering the flowing current capacity. Moreover, the wiring gaps are equalized in the present embodiment but could be widened in case the voltage difference between the wiring lines is high.

With the construction thus far described, the totally eight signals necessary for driving the gate drivers are transmitted to the 1 to 4 terminals (as shown in FIG. 8) of the JN3 and JN4 of the gate driver substrate FPC1 through the 1 to 4 terminals (as shown in FIG. 9) of the JN3 of the drain driver substrate FPC2 and the 1 to 4 terminals (as shown in FIG. 10) of the JN4 of the substrate FPC3.

<<Rubber Cushions GC>>

Figure 17:
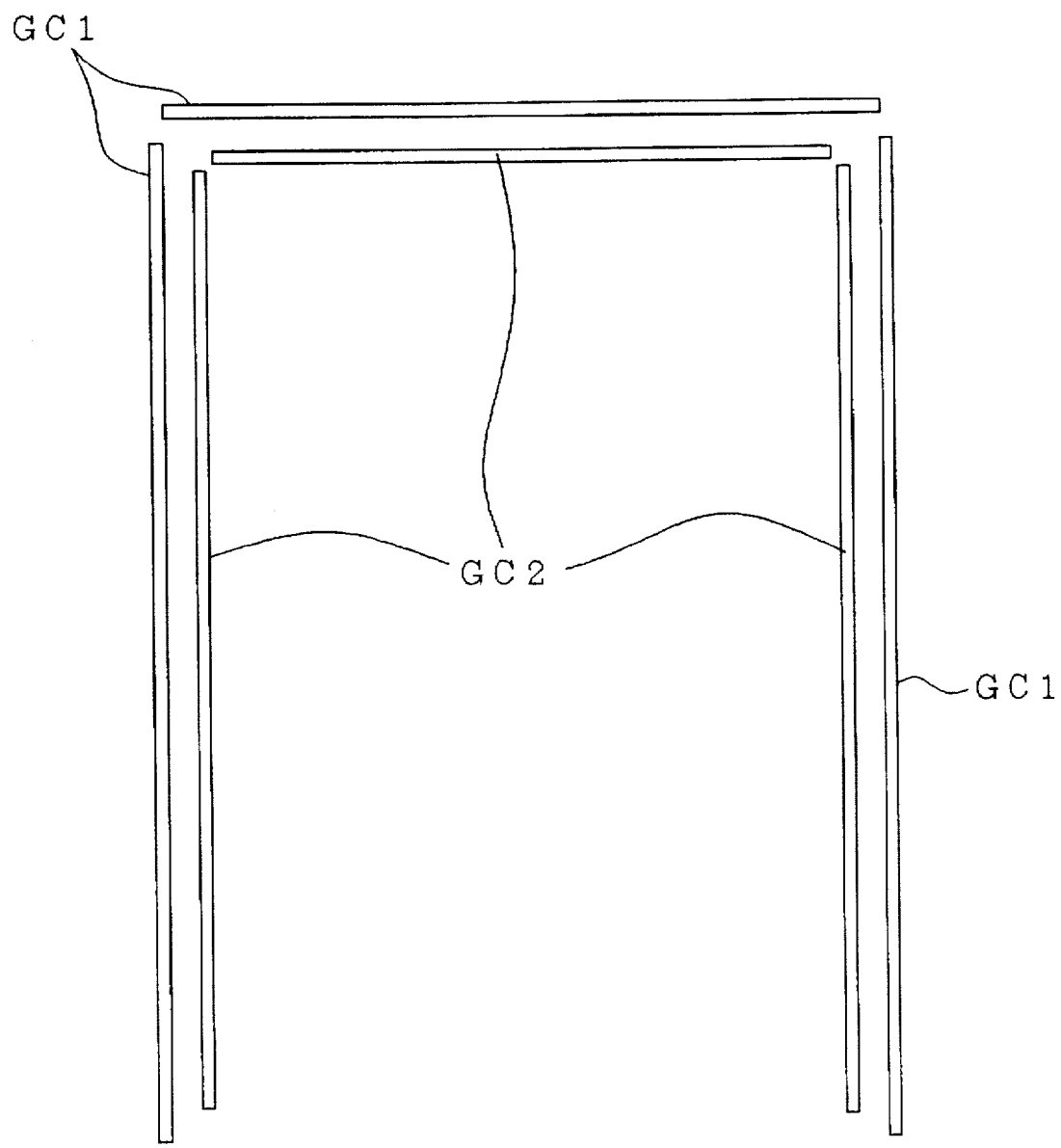
FIG. 17 is a top plan view of rubber cushions.
Figure 20A:
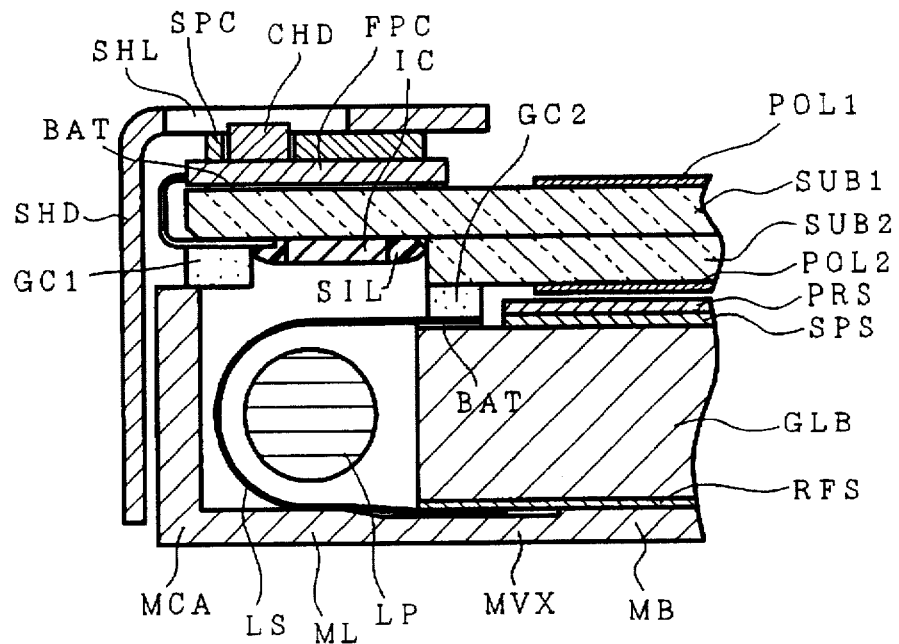
FIG. 20A is a section taken along line A—A of the assembled liquid crystal display module of FIG. 2 and shows the positional relations among the shield casing, the folded portion of the multi-layered flexible substrate, the mounted driver ICs, the rubber cushion, the back light and the lower casing.

FIG. 17 is a top plan view of the rubber cushions GC1 and GC2, and the perspective view, as taken obliquely from above the rubber cushions, is presented in FIG. 1. FIG. 20A is a section of the liquid crystal module MDL of FIG. 2, as taken from line A—A.

Figure 20B:
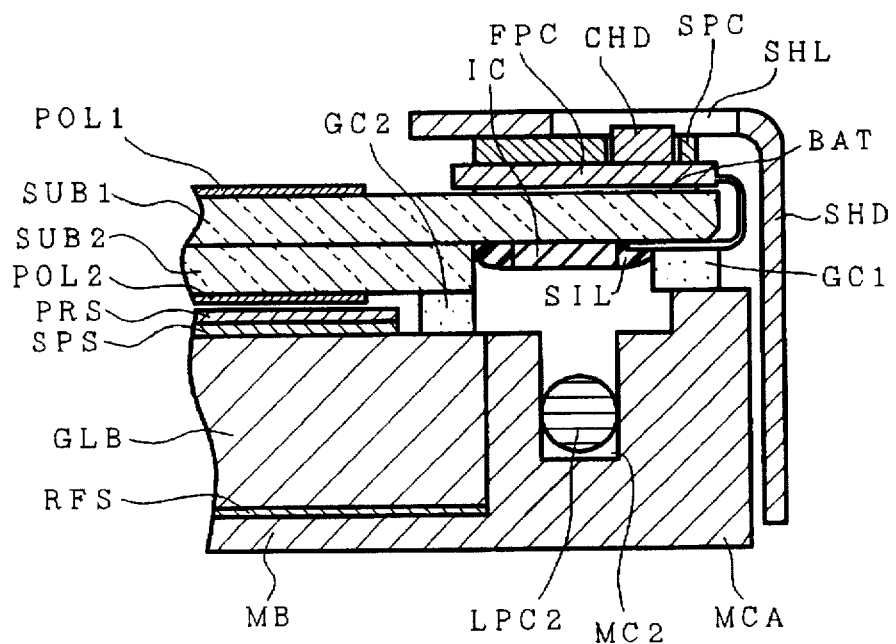
FIG. 20B is a section taken along line B—B of the assembled liquid crystal display module of FIG. 2 and shows the positional relation of a lamp cable and other parts.

The rubber cushion GC1 is sandwiched, as shown in FIGS. 20A and 20B, between the flexible substrate FPC on the frame periphery of the substrate SUB1 of the display panel PNL and the lower case MCA. As a result, the pressure is applied to fix the two or less conductor layers' portions FSL to improve the connection reliability of the substrate SUB1 with the input wiring pattern. Moreover, the rubber cushions take the role of preventing the drive ICs from being mechanically damaged by contacting with the lower casing MCA.

The rubber cushion GC2 is sandwiched between the substrate SUB2 of the display panel PNL and the reflective sheet LS or the light guide plate GLB. By pushing the shield casing SHD into the device while using the elasticity of the rubber cushion GC2, the fixing hooks HK are caught by the fixing projections HP. Then, the fixing pawls NL are folded and inserted into the fixing recesses NR so that these fixing members function as stoppers to fix the shield casing SHD and the lower casing MCA. As a result, the module is firmly held in its entirety while requiring no other fixing members. Thus, the assembling can be facilitated to reduce the production cost. Moreover, the device can have its mechanical strength and its anti-vibration/impact enhanced to improve the reliability. Incidentally, the rubber cushions GC1 and GC2 have their one sides wetted with an adhesive and are adhered to predetermined portions of the flexible substrate FPC and the substrate SUB2.

<<Back Light>>

Figure 18A:
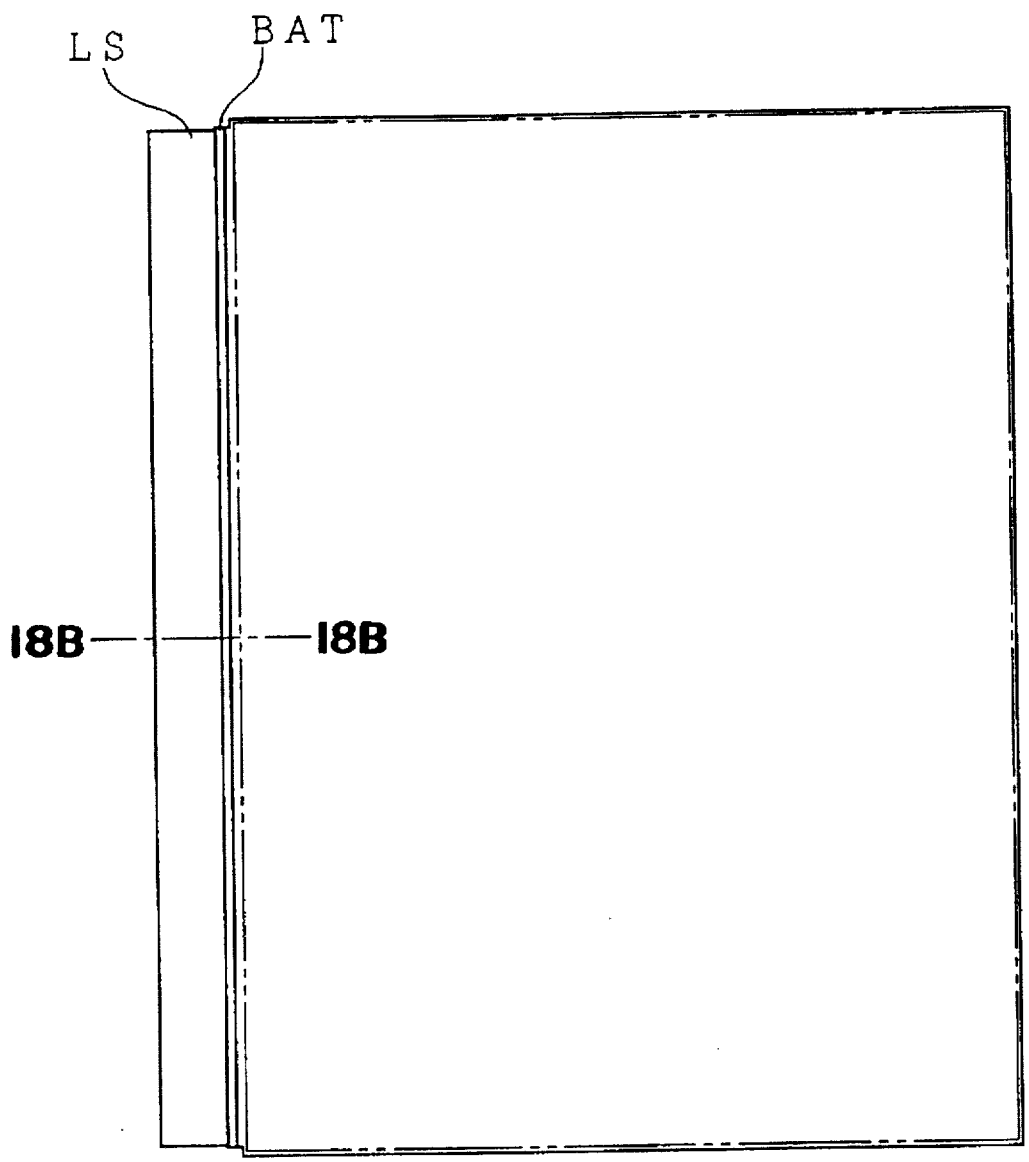
FIG. 18A presents a top plan view of a back light, as composed of a light guide, a prism sheet, a diffusive sheet and a reflective sheet, while being assembled, before FIG. 18B a fluorescent tube is built in, and a section taken along line 18B—18B.
Figure 18B:
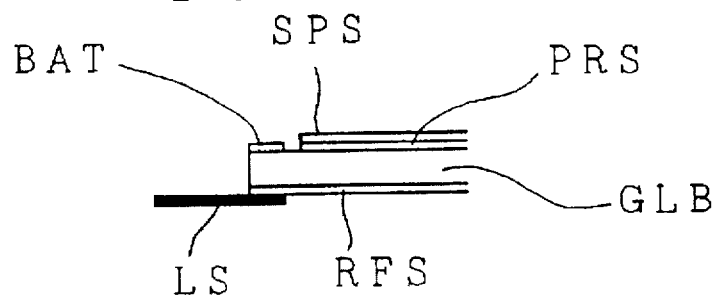

FIG. 18 presents a top plan view and a section, as taken along line A—A, of the side light type back light BL before the fluorescent tube LP is assembled in, and the assembly of the reflective sheet LS, the diffusive sheet SPS, the prism sheet PRS, the light guide plate GLB and the reflective Sheet RFS.

The side light type back light BL for illuminating the display panel PNL from the back is composed of the one cold-cathode fluorescent tube LP, the lamp cable LPC of the fluorescent tube LP, the rubber bush GB for retaining the fluorescent tube LP and the lamp cable LPC, the light guide plate GLB, the diffusive sheet SPS arranged in contact with the whole surface of the light guide plate GLB, the reflective sheet RFS arranged over the bottom face of the light guide plate GLB, and the prism sheet PRS arranged in contact with the whole surface of the diffusive sheet SPS.

The reflective sheet LS is prepared by arranging the fluorescent tube LP over the reflective sheet LP, by rounding and folding it by 180 degrees and by adhering its end to an adhesive BAT.

In the module MDL, the slender fluorescent tube LP is arranged in the space (as shown in FIG. 20) below the drain side flexible substrate FPC2 and the drain side drive IC, which are packaged in one longer side of the liquid crystal display panel PNL. As a result, the exterior size of the module MDL can be reduced to reduce the size and weight of the module MDL so that the production cost can be lowered.

<<Diffusive Sheet SPS>>

The diffusive sheet SPS is placed on the light guide plate GLB to diffuse the light emitted from the upper surface of the light guide plate GLB thereby to irradiate the liquid crystal display panel PNL uniformly.

<<Prism Sheet PRS>>

The prism sheet PRS is placed on the diffusive sheet SPS and has a smooth lower face and a prism up per surface. This prism face is formed of a plurality of grooves arrayed straight in parallel and having a V-shaped section. The prism sheet PRS is enabled to improve the brightness of the back light BL by condensing the light, which is diffused over a wide angular range from the diffusive sheet SPS, in the normal direction of the prism sheet PRS. As a result, the back light BL can have its power consumption reduced so that the module MDL can be reduced in its size and weight to lower the production cost.

<<Reflective Sheet RFS>>

The reflective sheet RFS is arranged below the light guide plate GLB to reflect the light which is emitted from the lower face of the light guide plate GLB.

<<Lower Casing MCA>>

FIG. 19 presents the top plan, upper side, rear side, right side and left side of the lower casing MCA.

The lower casing MCA, as molded is a back light accommodating casing, i.e., a holding member for the fluorescent tube LP, the lamp cable LPC, the light guide plate GLB and so on, as shown in FIG. 1, and is monolithically molded of a synthetic resin by one mold. The lower casing MCA is firmly united with the metallic shield casing SHD by the actions of the individual fixing members and elastic members so that the module MDL can have its vibratory impulse resistance and thermal impulse resistance improved to improve the reliability.

The lower casing MCA is formed, in its bottom face at the central portion excepting the peripheral frame portion, with a large opening MO occupying a half or more area of the bottom face. As a result, after the module MDL has been assembled, the lower casing MCA can be prevented, by the repulsive force of the rubber cushion GC2 (of FIG. 20) between the liquid crystal display panel PNL and the light guide plate, from having its bottom face bulged by the vertical force applied downward to the bottom face of the lower casing MCA, thereby to suppress the maximum thickness. This makes it unnecessary to increase the thickness of the lower casing so as to suppress the bulging, so that the lower casing can be made thin to reduce the thickness and weight of the module MDL.

Letters MCL designate a notch (including the notch for connecting the connector CT, as shown in FIG. 11), which is so formed in the lower casing MCA as to correspond to the exothermic parts of the interface circuit board PCB, i.e., a packaged portion such as the hybrid IC power source circuit (e.g., a DC—DC converter) in the present embodiment. Thus, the heat liberation of the exothermic portions of the interface circuit board PCB can be improved not by covering the exothermic portion of the circuit board PCB with the lower casing MCA but by forming that notch. Specifically, at present, the multiple gray-scales and the single power source are demanded for improving the performance and the facility of the liquid crystal display device using the thin film transistors TFT. The circuit for realizing these demands consumes a high power. If the circuit means is to be packaged in compact, the packaging becomes so highly dense to raise the problem of the heat generation. As a result, the dense packaging and the compactness of the circuit can be improved by forming the lower casing MCA with the notch MCL corresponding to the exothermic portions. On the other hand, the signal source integrated circuit TCON is also considered as the exothermic parts, above which the lower casing MCA may be notched.

Letters MH1 to MH4 designate four mounting holes for mounting that module MDL in the appliance such as a personal computer. The metallic shield casing SHD is also formed with the mounting holes SH1 to SH4 a ligned with the mounting holes MH1 to MH4 of the lower casing MCA, so that it can be fixed and packaged in the appliance.

The rubber bush GB retaining the fluorescent tube LP and the lamp cable LPC is fitted in an accommodating portion MG formed so, and the fluorescent tube LP is accommodated out of contact with the lower casing MCA in an accommodating portion ML.

Letters MB designate a retaining portion of the light guide plate GLB, and letters PJ designate a positioning portion. Letters ML designate an accommodating portion for the fluorescent tube LP; letters MG designate an accommodating portion of the rubber bush GB; and letters MVX designate a groove portion for fitting the overlapped portions of the reflective sheet LS and the light guide plate GLB around the fluorescent tube LP. Characters MC1 designate an accommodating portion for the lamp cable LPC1, and characters MC2 designate an accommodating portion for the lamp cable LPC2.

<<Accommodation of Lamp Cable LPC in Lower casing MCA>>

In the present embodiment, the wiring of the lamp cable LPC is devised to make a compact packaging and to eliminate the adverse effects upon the EMI noises.

FIG. 20B is a section of the liquid crystal module MDL of FIG. 2, as taken along line B—B.

Specifically, of the two lamp cables LPC, the cable LPC2 at the ground voltage side is so accommodated in the accommodating portion MC2 grooved in the lower casing MCA as to follow the external shapes of the, at least, three sides other than the accommodating portion of the fluorescent tube LP. The higher voltage side cable LPC1 is wired shortly close to the portion connected with an inverter IV and is accommodated in a grooved accommodating portion MC1. As a result, only the ground voltage wiring lines take a long path so that the adverse effects upon the EMI noises are unchanged from the prior art. As a result, no lamp cable LPC2 is present at the side of the fluorescent tube LP, as shown in FIG. 20A, to reduce the wiring area by 1.5 to 2 mm, as compared with the case in which the two lamp cables LPC1 and LPC2 are led out from one side. In the present embodiment, as shown in FIG. 20B, the lamp cable LPC2 is arranged inside of the transparent insulating substrate SUB1 and just below the drive IC thereby to make a compact design. In case the drain drivers are led out at the two sides, this wiring method is especially proper for the compact liquid crystal module.

With the leading end portions of the lamp cables LPC1 and LPC2, there is connected the inverter IV. This inverter IV is accommodated in its accommodating portion MI. In case the module MDL is thus assembled in an appliance such as the personal computer, neither the lamp cable LPC runs along the outer sides of the module, nor protrudes the inverter IV to the outside of the module MDL. As a result, the back light BL can have its fluorescent tube LP, lamp cable LPC, rubber bush GB and inverter IV accommodated and packaged in compact to reduce the size and weight of the module MDL thereby to lower the production cost.

Incidentally, the fluorescent tube LP can be placed at the shorter side of the light guide plate GLB.

<<Division of Display Control Integrated Circuit Element TCON>>

On the basis of the embodiment of the liquid crystal display device of the present invention, here will be described the method of dividing the display control integrated circuit TCON.

First of all, the TFT liquid crystal display module of the present embodiment will be summarized in the following.

Figure 21:
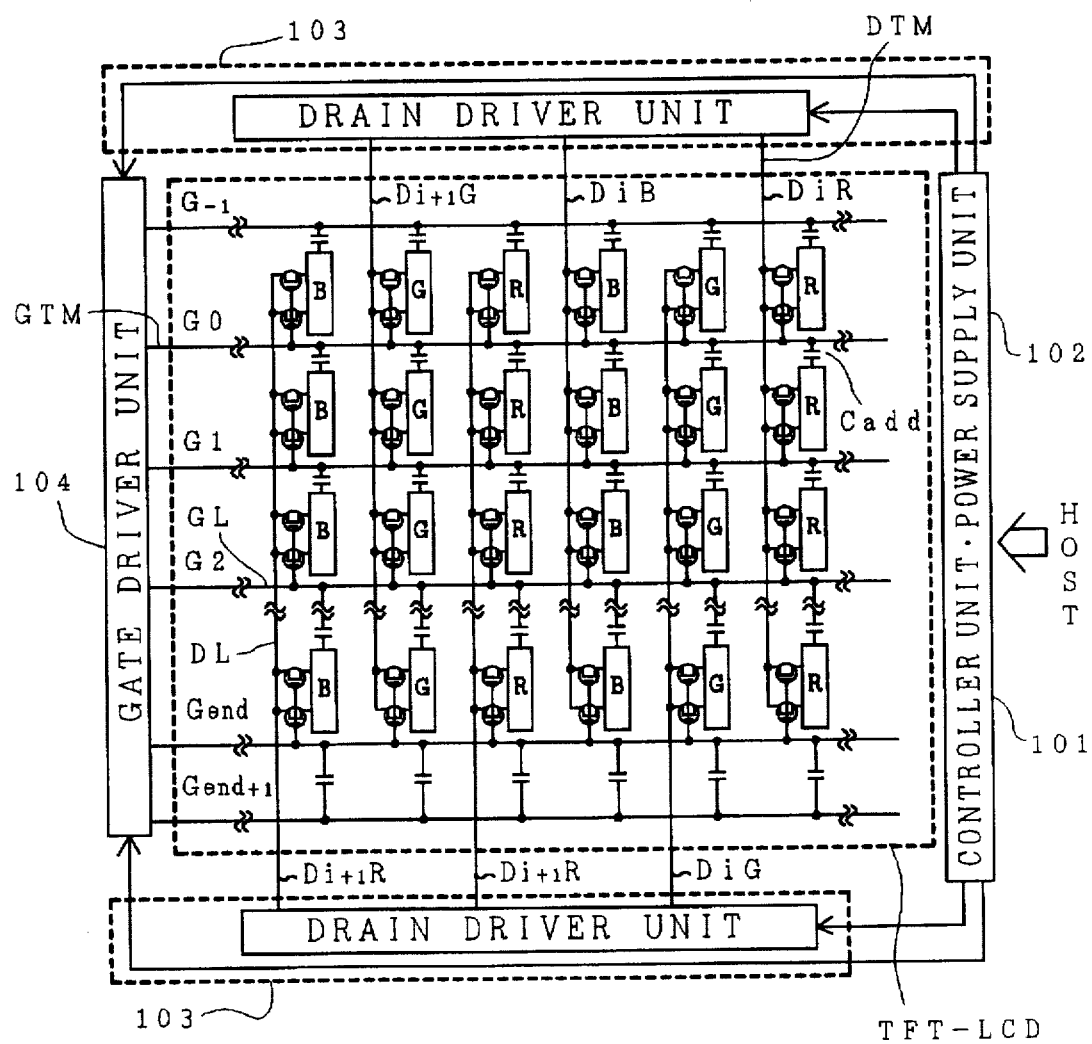
FIG. 21 is a block diagram showing an equivalent circuit of a TFT liquid crystal display module according to the present embodiment.

FIG. 21 is a block diagram showing the TFT liquid crystal display panel and the circuits arranged around the former. The drain driver unit 103 is arranged at the top and bottom sides of the TFT liquid crystal display panel (TFT-LCD), and the gate driver unit 104, and the controller unit 101 and the power supply unit 102 are arranged at the right and left sides of the liquid crystal display panel (TFT-LCD) which has the XGA specifications composed of 1,024×3×768 dots.

The drain driver unit 103 and the gate driver unit 104 can be designed in sufficient compact by folding by 180 degrees and packaging the multi-layered flexible substrate, as described hereinbefore.

The controller unit 101 and the power supply unit 102 are packaged in the multi-layered printed board PCB. The interface substrate PCB thus having the controller unit 101 and the power supply unit 102 mounted thereon is so arranged around the shorter side of the seal port of the liquid crystal panel PNL as to confront the gate driver unit 104, so that the substrate PCB has to be narrowed as much as possible.

FIG. 22 is a diagram showing an equivalent circuit of the TFT liquid crystal display panel (TFT-LCD) of FIG. 21.

As shown in FIG. 22, the thin film transistors TFT are arranged in the intersection areas between two adjacent drain signal lines D and two adjacent gate signal lines G.

The drain electrodes and gate electrodes of the thin-film transistors TFT are connected with the drain signal lines D and the gate signal lines G, respectively.

The source electrodes of the thin-film transistors TFT are connected with pixel electrodes, and a liquid crystal layer is provided between the pixel electrode and the common electrode, so that a liquid crystal capacitance CLC is equivalently connected between the common electrode and the source electrode of the thin-film transistor TFT.

The thin-film transistors are turned ON when a positive bias voltage is applied to its gate electrodes, and turned OFF when a negative bias voltage is applied to the same.

A holding capacitance Cadd is connected between the source electrode of the thin-film transistor TFT and the previous gate signal line.

The source electrode and the drain electrode are theoretically determined by the bias polarity between them, so that their bias polarity in this liquid crystal display device is reversed during operation. It is, therefore, understood that the source electrode and the drain electrode are switched during operation. In the following description, however, the electrode polarity is fixed for convenience, with one of the electrodes taken to be a source electrode and the other a drain electrode.

In the equivalent circuit of one pixel of the TFT liquid crystal display panel (TFT-LCD) of FIG. 22, there are stray capacitors Cgd and Cgs between the drain and gate and between the gate and source of the thin-film transistor TFT.

Figure 23:
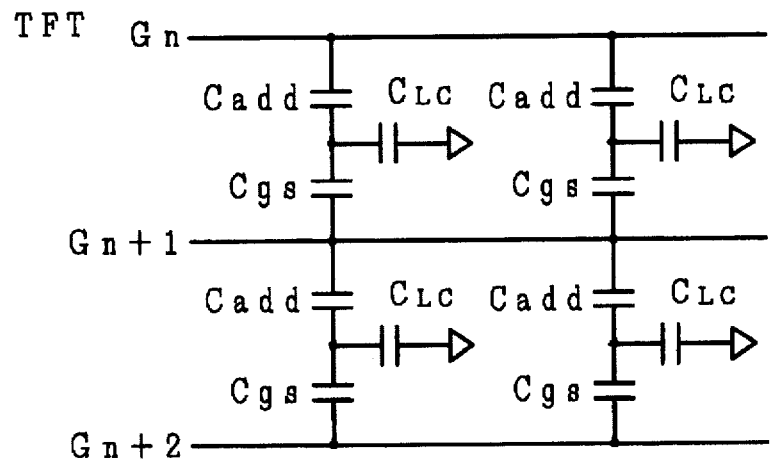
FIG. 23 is a diagram showing the capacitors which are connected with the individual gate signal lines of the equivalent circuit of one pixel of the TFT liquid crystal display panel shown in FIG. 21.

Hence, as shown in FIG. 23, a series circuit of Cadd and Cgs is connected between the gate signal lines.

The holding capacitor Cadd acts to reduce the influences to be exerted by the gate potential change upon the pixel electrode potential, as well known in the art, when the thin-film transistor (TFT) switches. Moreover, the holding capacitor Cadd further acts to elongate the discharge time period thereby to store the video data for a long time after the thin-film transistor TFT is turned OFF.

In the present embodiment, in order to prevent the holding capacitor Cadd of the first gate line from having its other terminal opened, the dummy gate signal line (G0) is disposed outside of the gate signal line (G1), and the holding capacitor Cadd of the first gate line has its other terminal connected with the dummy gate signal line (G0).

Moreover, since no gate signal line is present outside of the final gate signal line (G768), the capacities of the capacitors to be connected between the gate signal lines of G768 and G769 can be different from the capacities between the other gate signal lines (G1 to G768). In the TFT liquid crystal display module of the present embodiment, therefore, the dummy gate signal line (G769) is disposed outside of the final gate signal line (G768) so as to equalize the capacities of the capacitors to be connected with the gate signal lines.

In the present embodiment, the applications of one gate pulse for one horizontal period are started from the gate signal line G0 and continued to the normal gate signal lines (G1 to G768). On the other hand, the pulses at the gate OFF are applied to the dummy gate signal lines (G-1 and G769) which are disposed at the two sides of the gate signal lines (G0 and G768).

FIG. 24 is a top plan view showing the gate and drain wiring lines of the liquid crystal display panel of the present embodiment and the construction of the periphery of the wiring line lead-out portion.

As described before, the present embodiment adopts the two-side lead-out construction so as to expand the drain pitch. Specifically, the wiring lines of odd numbers such as drain lines D1 and D3 are led out upward, and the wiring lines of even numbers such as drain lines D2 and D4 are led out downward. The grouped one hundred and ninety two drain lines are electrically connected with the output of one drive IC.

The dummy gate signal lines (G-1, G0 and G769) are also effective to prevent the static electricity from invading during the manufacture process.

The dummy gate signal lines (G-1 and G769) are directly fed with the gate OFF voltage through the pattern of the multi-layered flexible substrate FPC1. The gate signal lines (G0 to G768) have their individual one hundred wiring line groups connected electrically with the output of one gate drive IC. AS a result, the final gate drive IC8 has only its output terminals X1 to X69 (as shown in FIG. 37) connected with the gate signal lines (G700 to G768) while leaving its remaining thirty one output terminals open.

Figure 25:
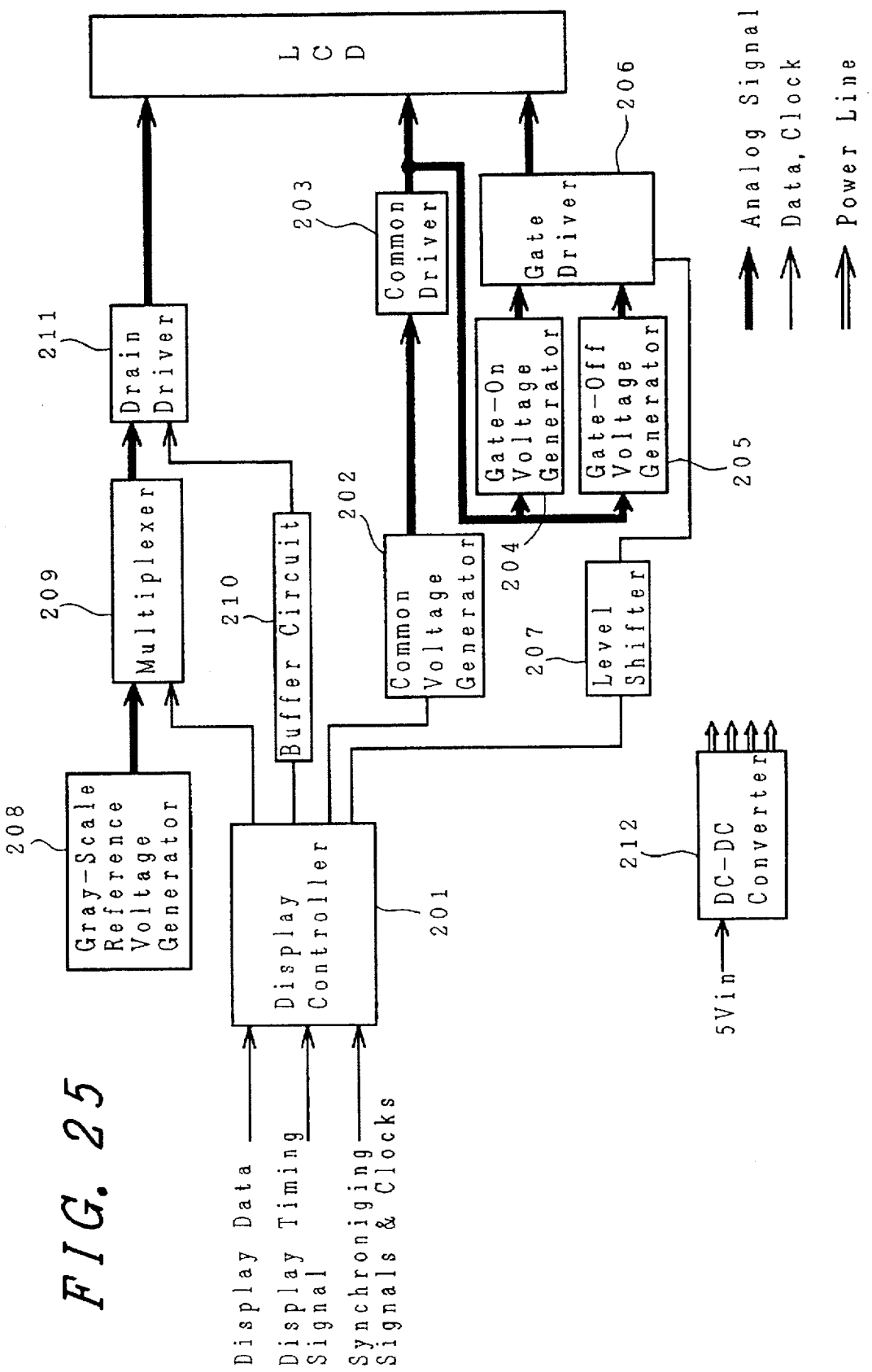
FIG. 25 is a block diagram showing the schematic construction of the individual drivers of the TFT liquid crystal display module of the present embodiment and the flows of signals.

FIG. 25 is a block diagram showing the schematic construction and signal flows of the drivers (i.e., the drain driver, gate driver and common driver) in the TFT liquid crystal display module of the present embodiment.

In FIG. 25: a display controller 201 and a buffer circuit 210 are installed in the controller unit 101 of FIG. 21; a drain driver 211 is provided in the drain driver unit 103 of FIG. 21; and a gate driver 206 is provided in the gate driver unit 104 of FIG. 21.

The drain driver 211 is composed of a data latch unit for display data and an output voltage generation circuit.

A gray-scale reference voltage generator 208, a multiplexer 209, a common voltage generator 202, a common driver 203, a level shifter 207, a gate-on voltage generator 204, a gate-off voltage generator 205 and a DC—DC converter 212 are provided in the power supply unit 102 of FIG. 21.

FIG. 26 illustrates the levels and waveforms of the common voltage to be applied to the common electrode, the drain voltage to be applied to the drain electrode, and the gate voltage to be applied to the gate electrode. Incidentally, the drain waveforms indicate those of the instant when the black is displayed.

Figure 27:
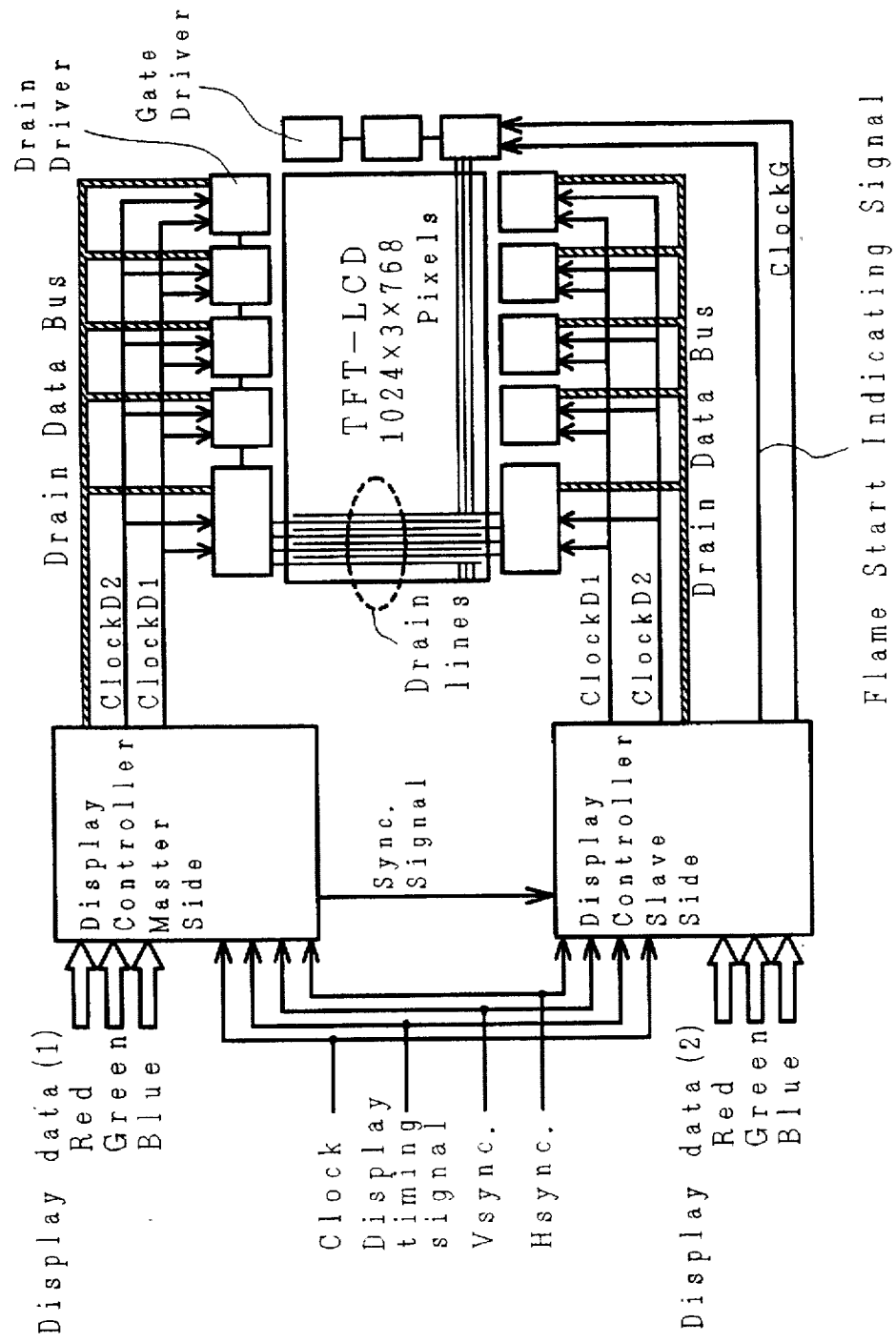
FIG. 27 is a diagram showing the flows of the display data and clock signals from the display controller to the gates and the drain driver in the TFT liquid crystal display module in the present embodiment.

FIG. 27 is a diagram showing the flows of display data and clock signals for the gate driver 206 and the drain driver 211 in the TFT liquid crystal display module of the present embodiment. On the other hand, FIG. 32 is a timing chart showing the display data to be inputted from the host computer to the display controller 201, and the signals to be outputted from the display controller 201 to the drain and gate drivers.

In response to the control signals (e.g., clocks, display timing signals and synchronizing signals) from the host computer, the display controller 201 generates not only a clock D1 (CL1), a shift clock D2 (CL2) and display data as the control signals to the drain driver 211 but also a frame start indicating signal FLM, a clock G (CL3) and display data as the control signals to the gate driver 206.

Moreover, the carry output of the drain driver 211 is fed directly to the carry input of the next drain driver 211.

Figure 28:
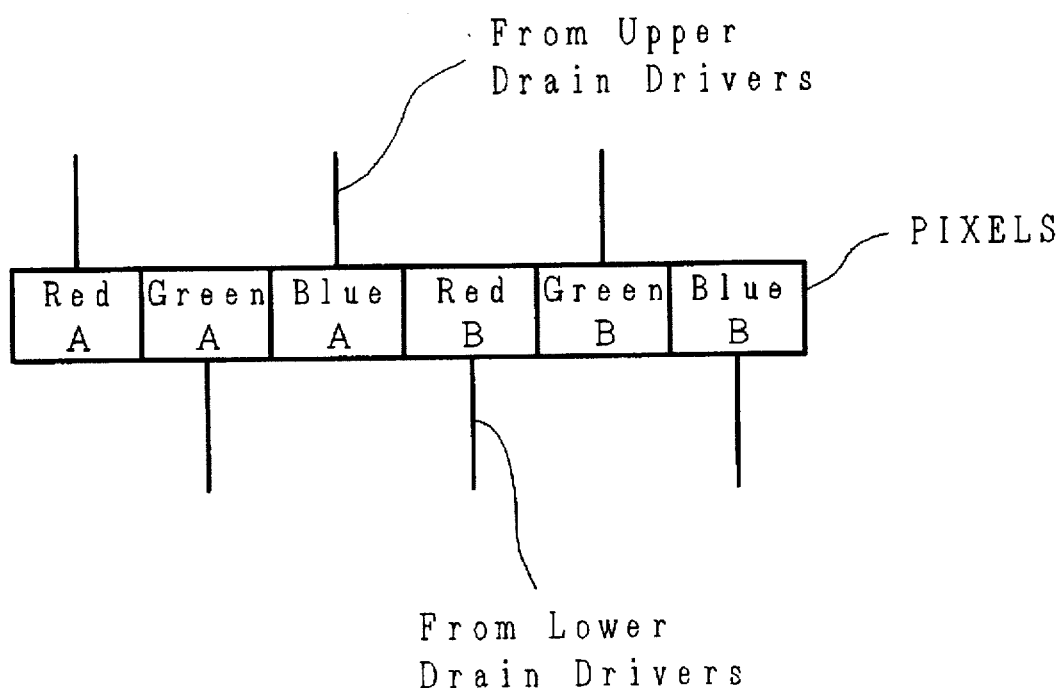
FIG. 28 is a diagram illustrating the corresponding relations between the input display data and the red, green and blue dots in two pixels in the TFT liquid crystal display module of the present embodiment.

FIG. 28 is a construction diagram showing the relations between the input display data and the pixels.

In the case of a single display controller, the display data for two pixels are inputted to the display controller so that they are divided and outputted for the upper drain driver and the lower drain driver. In the present embodiment, the input display data for two pixels from the host computer are inputted in parallel to the interface I/F1 and are divided in the wiring lines in the substrate PCB into the individual data for one pixel until they are inputted to the individual input terminals of the two display controllers.

Figure 35:
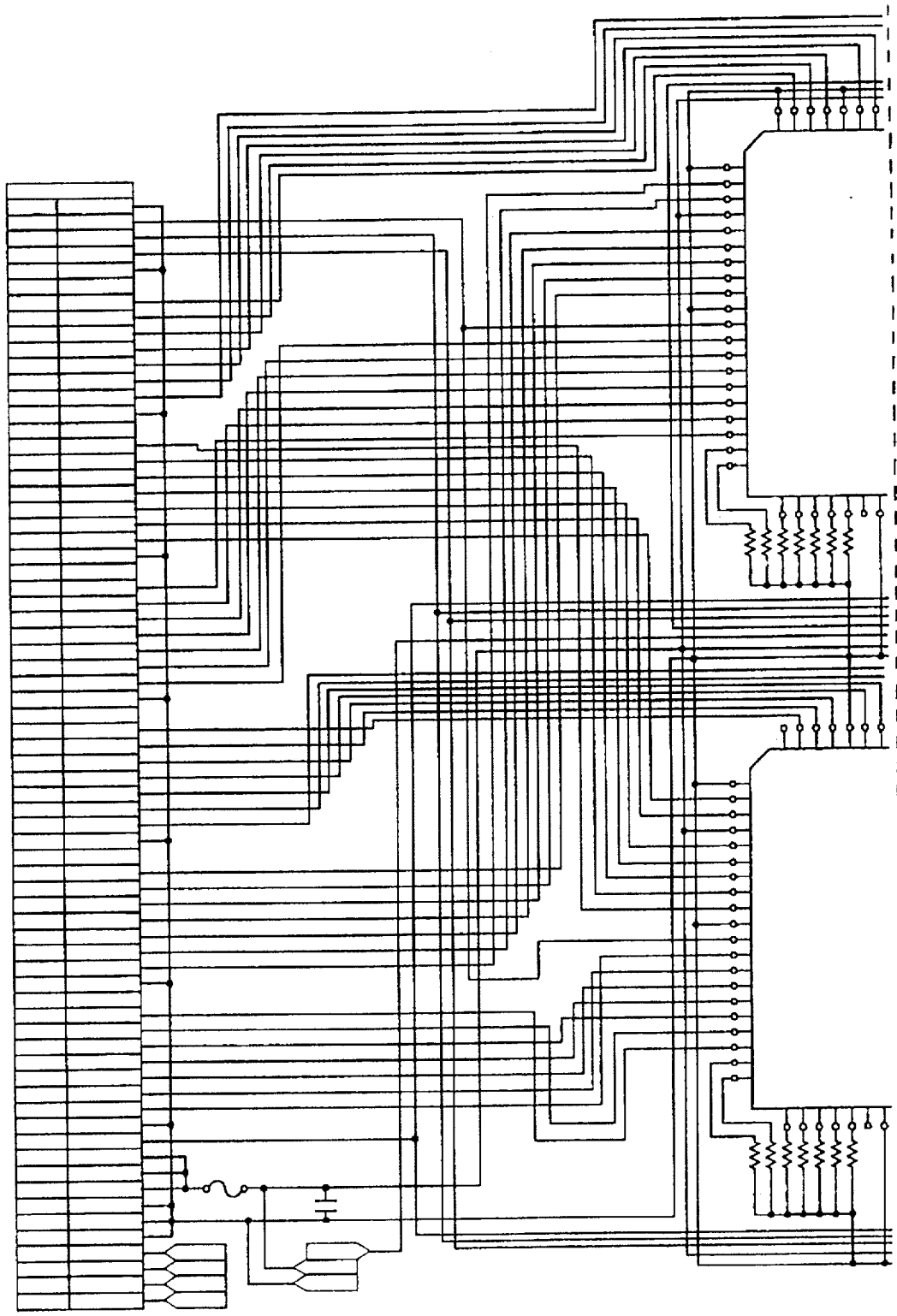
FIG. 35 is a diagram showing the connecting portion between the display control integrated circuit element TCON and an interface I/F1 at the Host side in the TFT liquid crystal display module of the present embodiment.
Figure 36:
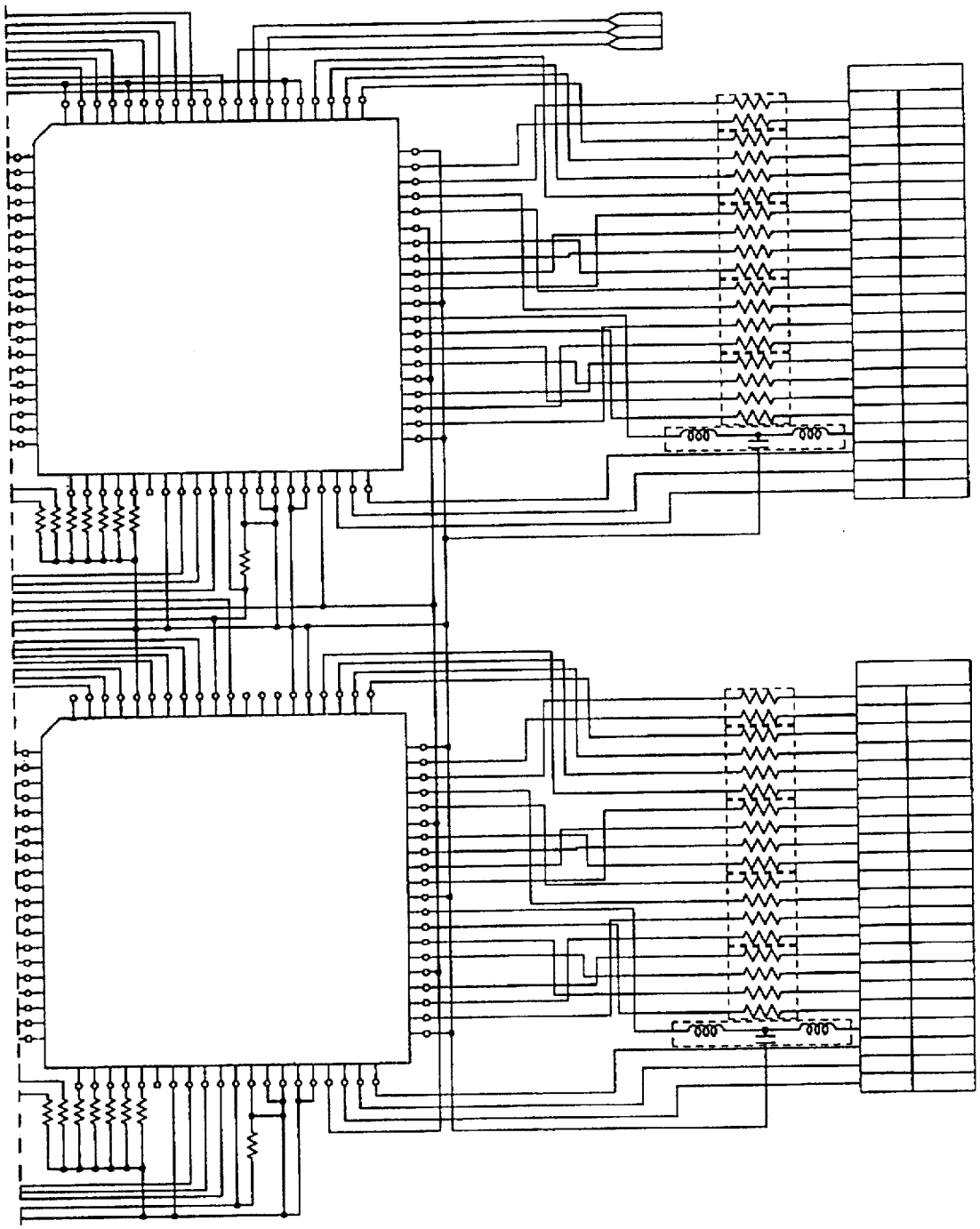
FIG. 36 is a diagram showing the connecting portion between the display control integrated circuit element TCON and the interface I/F1 at the Host side in the TFT liquid crystal display module of the present embodiment.

FIGS. 35 and 36 show the display controllers and the input/output wiring lines at their peripheral portions.

From the host computer, the maximum 7 bits for each dot can be inputted from the I/F1 to the upper display control integrated circuit element TCON (as will defined to the master side). Specifically, the display data inputted are: data RA0 to RA6 for the red dot of the first pixel; data BA0 to BA6 for the blue dot of the first pixel; and data GB0 to GB6 for the green dot of the second pixel. The display control integrated circuit element TCON converts those data and outputs the display data of 6 bits R00 to R05, B00 to B05 and G10 to G15. These display data of 6 bits are prepared because a drain driver for displaying 7 bits is difficult at present to acquire and because the drain drive ICs for displaying 6 bits pattern is less expensive.

The least significant input display data RA0, BA0 and GA0 are connected with the RFRC, BFRC and GFRC of the display control integrated circuit element TCON so that they are used as the inputs for the frame rate control (as will be shortly referred to as "FRC"). This FRC method is an existing technique in the simple matrix liquid crystal for displaying in multiple colors by controlling the display data for each designated frame and by controlling the effective value to be applied to a liquid crystal cell Clc. An example, as applied to the TFT liquid crystal, is disclosed in "Multi-Color Display Control Method for TFT-LCD", SID 91 DIGEST, 547(1991) by Hiroyuki Mano, Tsutomu Furuhashi, and Toshio Tanaka et al.

By designating the least significant bit, therefore, the FRC drive can be set and reset to display about one hundred and twenty eight gray-scales at the maximum for each color.

To the lower display controller (as will be defined to the slave side), on the other hand, there are inputted the display data of data GA0 to GA6 for the green dot of the first pixel, the data RB0 to RB6 for the red dot of the second pixel and the data BB0 to BB6 for the blue dot of the 2nd pixel, so that the data B10 to B15, G01 to G05 and R10 to R15 are outputted. The least significant input display data GA0, RB0 and BB0 are connected with the GFRC, RFRC and BFRC.

While thus premising the sixty four gray-scale display or the one hundred twenty eight gray-scale display of the FRC method for each color, the TFT liquid crystal display module of the present embodiment is constructed such that the display data sent from the host computer are inputted by 7 bits or 6 bits for each color and such that the drain driver can process 6 bits for each color. This display controller is constructed to have its input and output pixel numbers equalized so that the period (DCLK) of the input clock and the output period (CL2) are identical. Moreover, the input data received are outputted, if it is not necessary to process these input data, to the drain driver.

Figure 29:
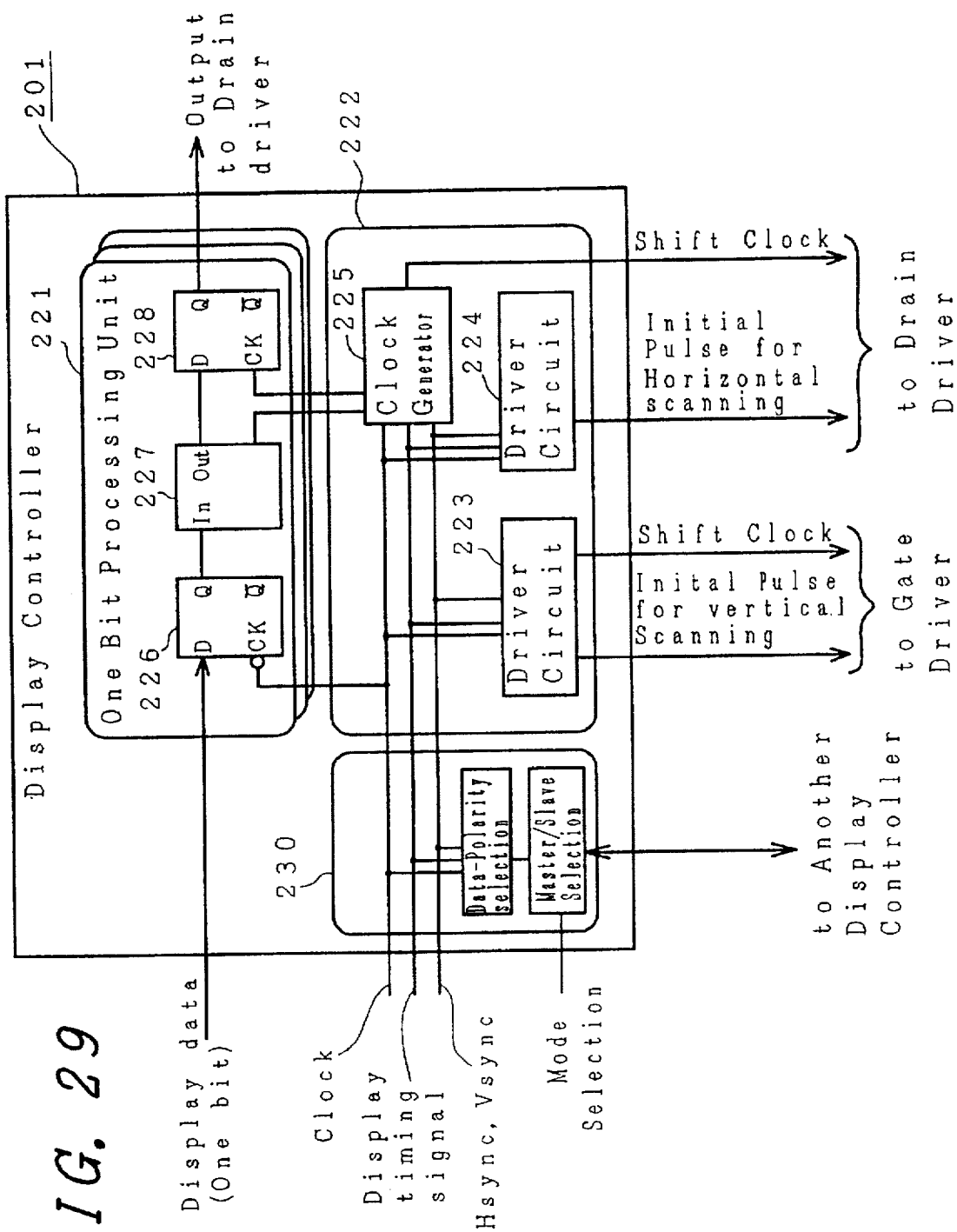
FIG. 29 is a block diagram showing a schematic construction of the display controller shown in FIG. 27.

FIG. 29 is a block diagram showing a schematic construction of the two display control integrated circuit elements TCON.

Each display controller 201 is composed of a one bit processing unit 221, a period processing unit 230 and a control signal generator 222.

A one bit processing unit 221 has a D-type flip-flop 226, a logic processor 227 and a D-type flip-flop 228 connected as slaves, and receives the display data from the host computer to output them to the drain driver 211 on the basis of the clock signals coming from the control signal generator 222. Because of the construction of 6 bits for each color, the present embodiment is constructed of totally eighteen units 221 for three dots so that the display data for one pixel can be processed in parallel.

The logic processor 227 of the data processor 221 is inserted to invert the display data. Specifically, the drain waveform at the black level, for example, is changed every horizontal period (1H), as shown in FIG. 26, the logic is inverted one bit by one bit in the logic processor and is inputted to the drain driver.

As is evident from FIG. 32, the shift clock D2 (CL2) for the drain driver has the same frequency as the clock signal (DCLK) and the display data fed from the host computer. The display data, as taken into the D-type flip-flop 226 in synchronism with the clock signal of the same frequency as the clock signal from the host computer is outputted to the data bus from the D-type flip-flop 228 in response to the clock signal, thus outputting a single row of display data from the host computer to the data bus.

The display controller 201 generates the control signals for driving the driver from the control signals coming from the host computer so that the output clocks are not out of phase between the two display controllers. However, the signals to be generated from the internal initial (or infinite) value or from the reset released state may disagree in their synchronism and polarities. With no synchronism, the XGA panel of the present embodiment has a problem in the phenomenon that the black and white voltage levels are inverted between the upper drain driver and the lower drain driver.

In order to solve the above-specified problem, according to the present embodiment, the period processing unit 230 is arranged in the display controller 201.

Figure 30:
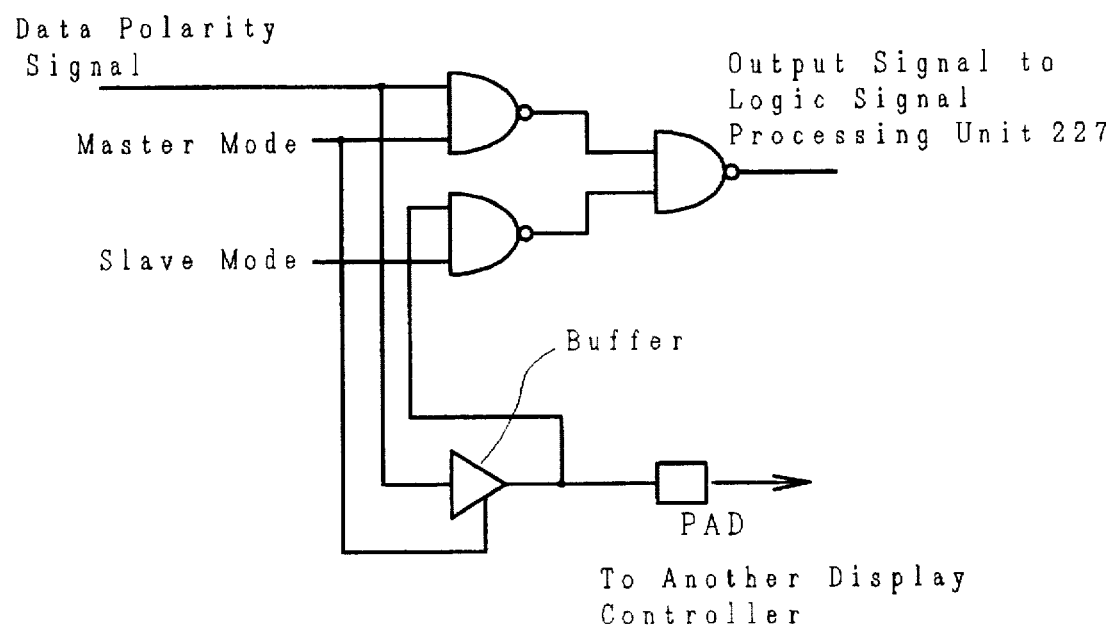
FIG. 30 is a circuit diagram showing an essential portion of a period processing circuit of the display controller shown in FIG. 29.

FIG. 30 shows a construction of an essential circuit of the period processing unit 230.

The synchronizing signal is sent from the master side to the slave side, at which it is used for the internal processing. In the present embodiment, the indication of the inversion/non-inversion of the data of the drain driver corresponds to the synchronization between the two.

The master mode and the slave mode are selected from the mode setting terminal.

In case the display controller 201 is located at the master side, the master mode terminal takes the High level whereas the slave mode terminal takes the Low level, so that the data polarity signal is actually used as it is in the circuit and is inputted as the clock to the logic processor 227. Moreover, the data polarity signal is inputted from the output buffer through an output pad PAD to the display controller 201 at the slave side so that it acts as the synchronizing signal.

In case the display controller 201 is at the slave side, the master mode terminal takes the Low level whereas the slave mode terminal takes the High level so that the output buffer does not act any more. In this state, the data polarity signal coming from the master side output buffer through the output pad PAD is applied as an input to the PAD of the slave side display controller 201. This data polarity signal from the master side is actually used as it is in the circuit and is inputted as the clock of the logic processor 227 of the slave side display controller 201. As a result, the output clocks do not go out of phase between the two display controllers.

FIGS. 35 and 36 are connection diagrams around the display control integrated circuit element TCON and show the terminal names.

The data polarity signal, as fed from the master side output buffer through the output pad PAD, is transmitted from the terminal DDT to the terminal DDT of the slave side input pad PAD.

Without any necessity for the inversion of the display data, moreover, the logic processor 227 need not be provided.

Specifically, in order to change the drain waveform of the black level of FIG. 26 every horizontal period (1H), for example, in the gray-scale reference voltage generator of FIG. 25, a power supply inverter changing every horizontal period (1H) and a ladder-type resistance circuit connected directly to the transistor are combined to generate two kinds of gray-scale reference voltages synchronized every horizontal period (1H) are selected by the multiplexer 209 and inputted to the same gray-scale reference voltage feed line of the drain driver. According to this method, there is required synchronization means for the power source inversion circuit means and the multiplexer 209 so that the circuit design is generally more difficult than the logic inversion method. According to the present method, however, the two display controllers TCON need not the logic processor 227, and one of the D-flip-flops 226 and 228 can be omitted to make an advantage for the area reduction.

FIG. 33 presents top plan views showing the external shapes of three kinds of constructions of the display control integrated circuit element TCON.

Figure 33A:
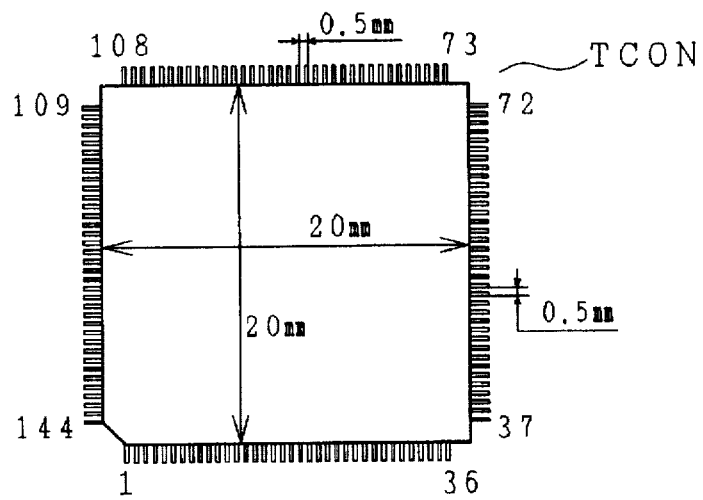
FIGS. 33A to 33C are top plan views showing the exteriors of a display control integrated circuit element TCON.

FIG. 33A shows the external size of the case in which the XGA liquid crystal panel of the present embodiment is controlled by the single display control integrated circuit element TCON. Only the display data terminals required are [7 bits (inputs)+6 bits (outputs)]×3 (RGB dots)×2 pixels (upper/lower drain drivers)=78 terminals at the minimum. In addition, the control signals to be outputted to the drain and gate drivers are doubled to increase the total terminal number to 144. The external shape takes a square of about 20 mm for the inter-terminal pitch of 0.5 mm.

Figure 33B:
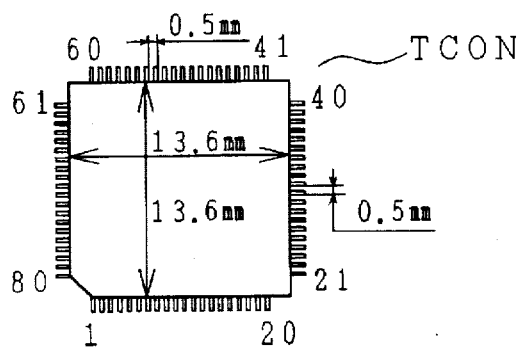

FIG. 33B shows the external size of the case in which the data are controlled by the two display control integrated circuit elements TCON at the master and slave sides. FIG. 11 shows the package which is made by actually preparing the display control integrated circuit elements TCON according to that construction and by packaging them on the substrate PCB. The display data terminals are reduced to one half, i.e., [7 bits (inputs)+6 bits (outputs)]×3 (RGB dots)=39 terminals. In addition, the signals to be outputted to the drain and gate drivers are also halved so that the total terminal number is 80. For the inter-terminal pitch of 0.5, the external shape is a square of about 13.6 mm. The terminals cannot be completely halved, because the synchronizing signals for setting the modes and from the host computer and the display timing signals cannot be halved. With the mode set terminals, however, this construction can cover not only the XGA panel but also the VGA panel (640×3×480 dots) and the SVGA panel (800×3×600 dots).

Figure 33C:
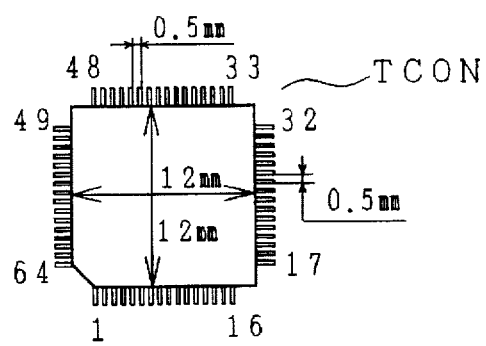

FIG. 33C shows the external size of the case in which the data are controlled by the two display control integrated circuit elements TCON and in which it is dedicated especially to the XGA panel to omit the mode setting terminals. As a result, the total number of terminals can be drastically reduced to 64, and the external shape can also be reduced to a square of 12 mm.

<<Data Processing Device with Packaged Liquid Crystal Display Module MDL>>

Figure 34:
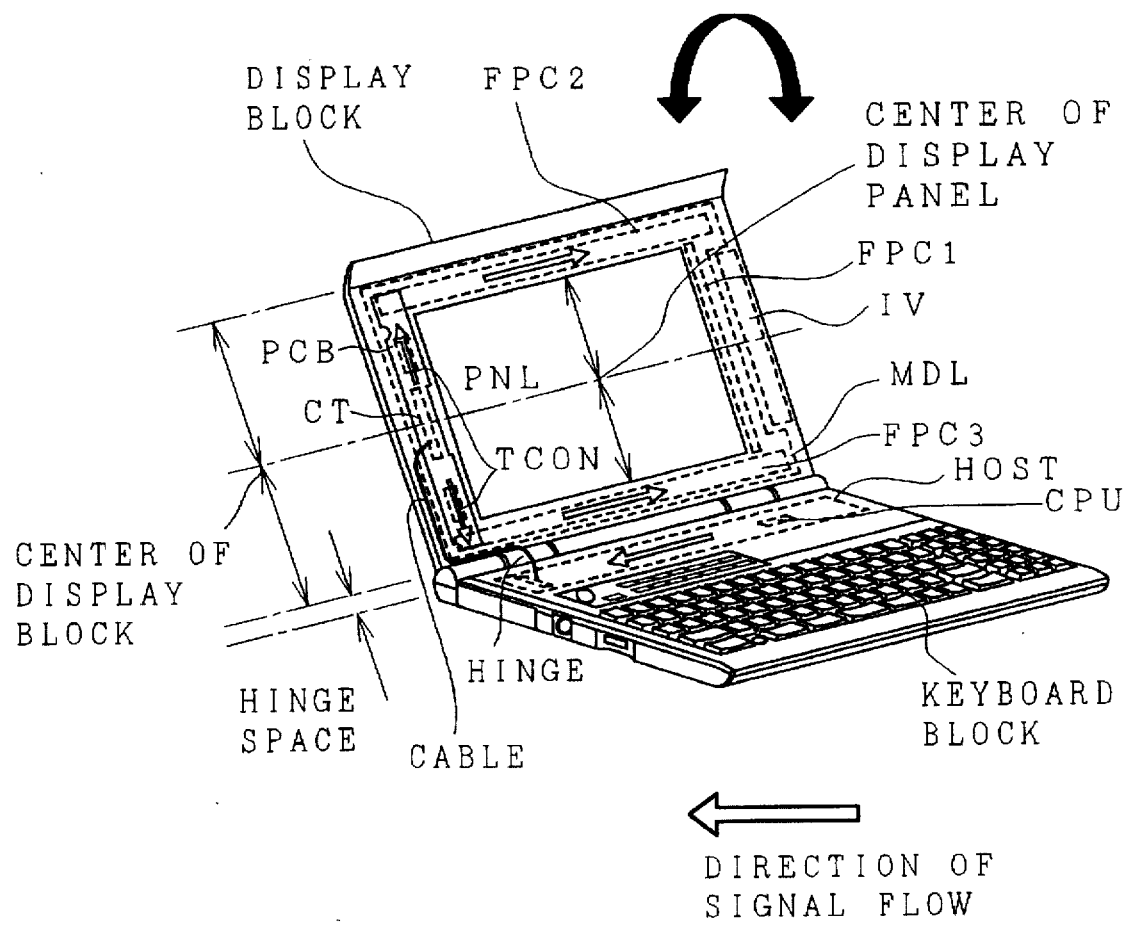
FIG. 34 is a perspective view showing a notebook personal computer or word processor in which is mounted the liquid crystal display module of the present embodiment.

FIG. 34 is a perspective view showing a notebook type personal computer or word processor having the liquid crystal display module MDL packaged therein.

Thanks to both the COG packaging of the drive IC according to the embodiment of the present invention in the liquid crystal panel PNL and the folding packaging of the multi-layered flexible substrate as the drain and gate driver peripheral circuits of the outer peripheral portion, the external size can be drastically reduced more than the prior art. As a result, the drain driver peripheral circuits can be arranged symmetrically above and below the display block over the hinge of the data device so that the center of the display block can be easily aligned with the center of the liquid crystal panel PNL.

The signals from the data device flow at first from the connector CT, as located at the central portion of the left interface substrate PCB, to the two display control integrated circuit elements TCON, in which they are converted into display data, and these display data are vertically divided to flow the drain driver peripheral circuits. By thus using a plurality of display control integrated circuit elements TCON, the external shape of the data device can be released from its restriction upon its width thereby to provide a small-sized and low power consumption data device.

Figure 44:
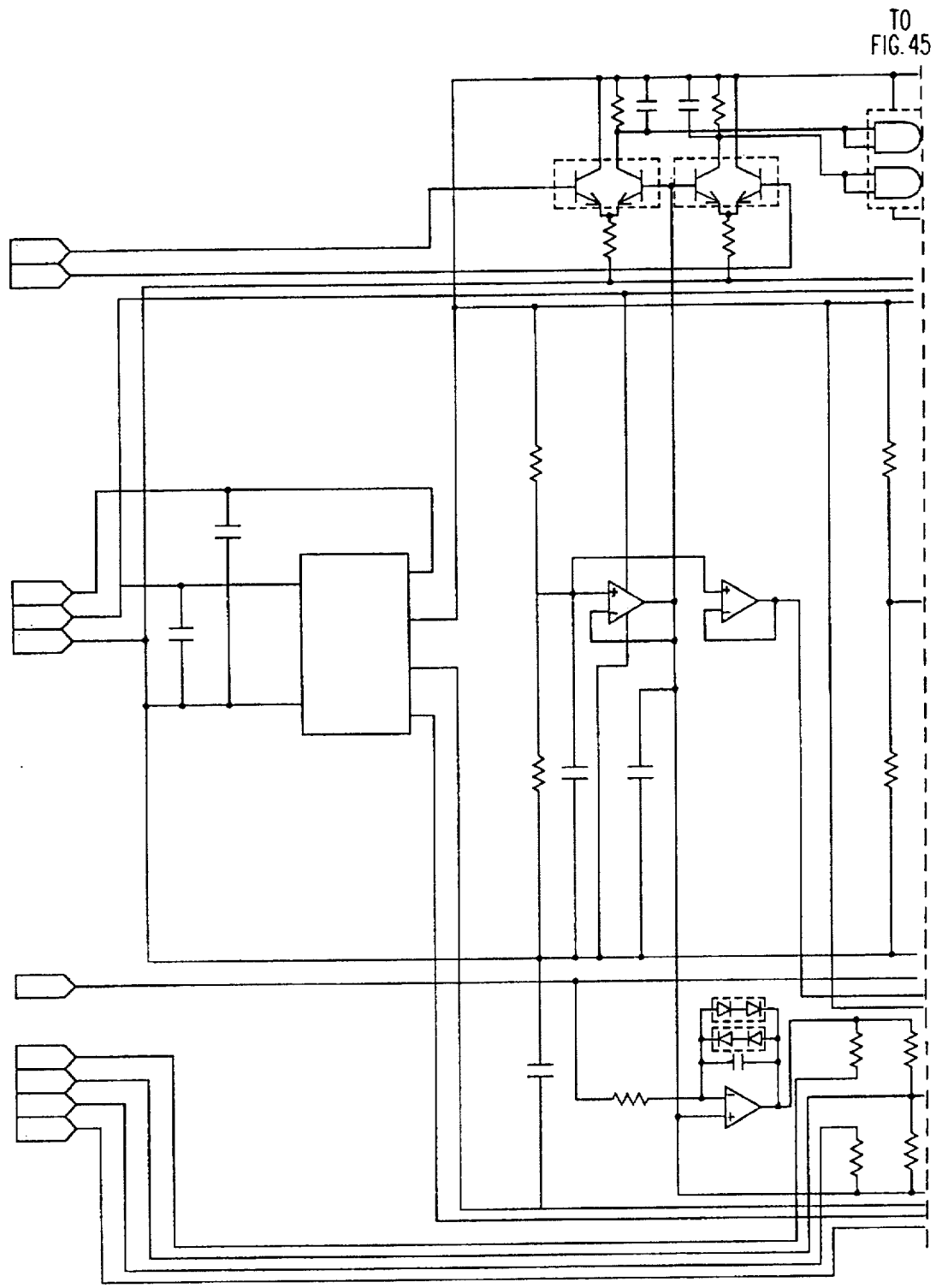
FIG. 44 is a diagram showing the connecting portion between the input interface at the host side and the output interface to the drain driver substrate and a circuit construction of the actual liquid crystal driver.
Figure 45:
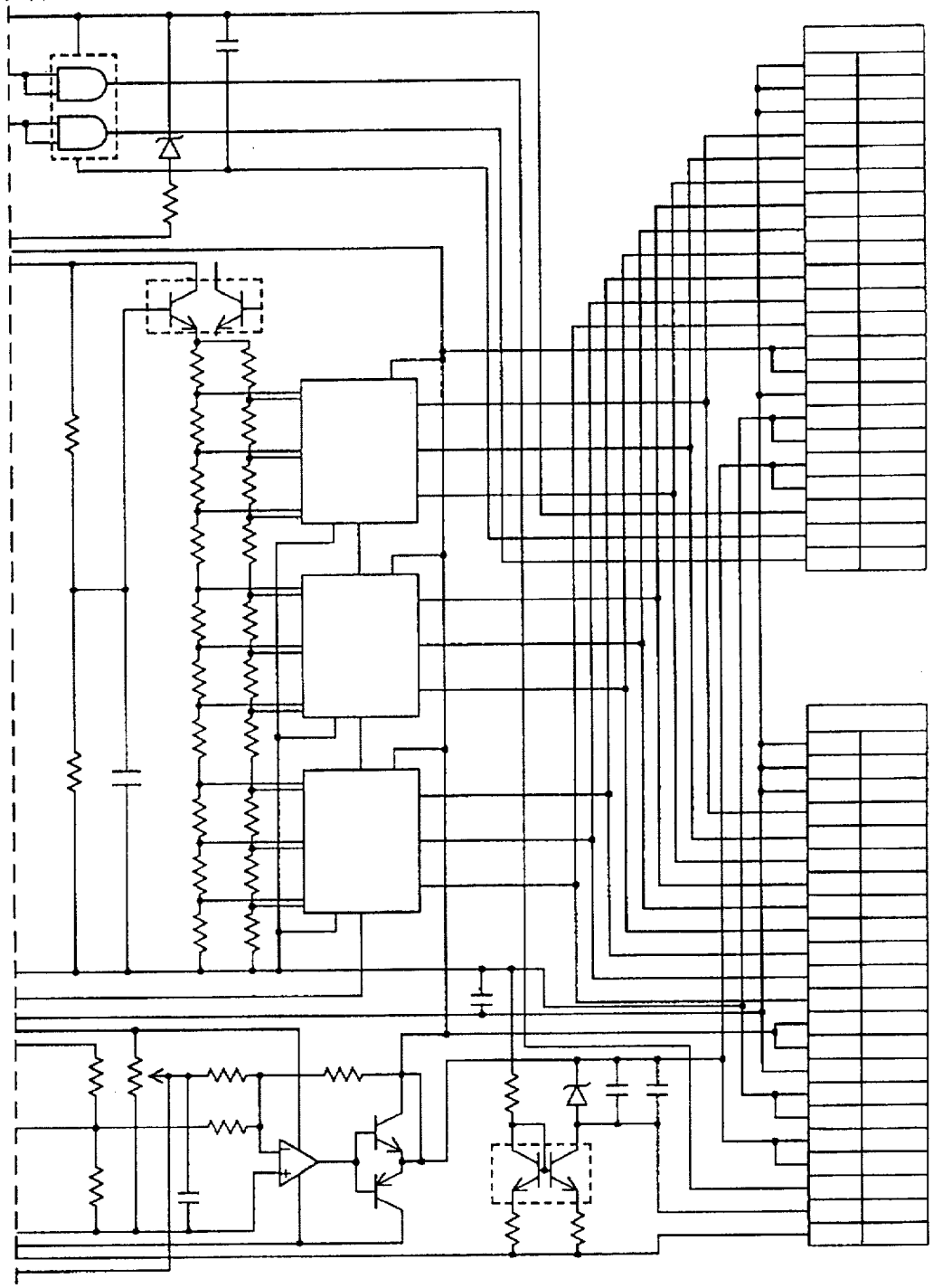
FIG. 45 is a diagram showing the connecting portion between the input interface at the host side and the output interface to the drain driver substrate in the TFT liquid crystal display module of the present embodiment, and a circuit construction of the actual liquid crystal driver.

FIGS. 35 and 36 show the controller unit 101 of FIG. 22; FIGS. 37 and 38 show the gate driver unit 104 of FIG. 22; FIGS. 39 to 43 show the drain driver unit 103 of FIG. 22; and FIGS. 44 and 45 show the circuits of the individual drivers of FIG. 26.

Although the present invention has been specifically described in connection with its embodiments, it should not be limited to them but can naturally be modified in various manners without departing from the gist thereof.

The effects to be obtained by the representative aspects of the invention disclosed herein will be briefly described in the following.

(1) The liquid crystal display device is constructed to comprise the chip-on-glass type liquid crystal panel having the drive ICs mounted on the transparent insulating substrate, and the foldable multi-layered flexible substrate arranged in the periphery of the liquid crystal panel and having two or more layers of the drive IC substrates. As a result, the liquid crystal display device can have its peripheral drivers small-sized to reduce its external size even if the pixel number and the display color number are increased to increase the wiring line number.

(2) The multi-layered flexible substrate has its surface conductor layer covered with the solid or mesh-shaped pattern portion fixed at a DC power supply voltage, such as 5 volt or at the ground. As a result, it is possible to provide a data processing device which has a liquid crystal display device having a low EMI level and an excellent environmental resistance, even if the pixel number and the display color number are increased to raise the frequencies of the necessary signals.

(3) Thanks to the combination of the chip-on-glass type liquid crystal panel and the foldable multi-layered flexible substrate, the tape carrier package (TCP) of the prior art can be eliminated, and the connections between the peripheral drivers can be used as the wiring lines on the transparent insulating substrate thereby to reduce the parts number.

(4) The anisotropic conductive film is used for connecting the peripheral drivers which are positioned by the alignment marks on the multi-layered flexible substrate so that the substrates can be highly reliably connected even if the pixel number and the display color number are increased to increase the wiring line number.

(5) The liquid crystal display block has its display control integrated circuit elements composed of two or more packaged display controllers so that it is excellent in temperature resistance and advantageous in compact structure.

(6) The drive ICs chip-on-glass packaged on the two sides, usually, the two longer sides of the liquid crystal display panel are driven in parallel by the two display controllers to improve the temperature resistance and to take an advantage in the compact structure. The sides arranged with the video signal line driving circuit boards are uniformly distributed to the upper and lower sides of the screen so that the screen can be properly positioned in the vertical direction.

(7) In the liquid crystal display device, the peripheral circuit board positioned in the outer periphery of the seal port is recessed to avoid the projection of the seal port so that the projection can be generally narrowed by about 1 mm.

(8) The lamp cable for the slender fluorescent tube is arranged around the four sides in the space below the multi-layered flexible substrate mounted in the outer periphery of the liquid crystal display element, so that the lamp cable can be accommodated by using the space efficiently. As a result, the device can have its external shape reduced to a small size and a light weight.

We claim:

1. A liquid crystal display device comprising: drive ICs mounted on one of two superposed insulating substrates, wherein at least one of the substrates is transparent; and at least one multi-layered flexible substrate is arranged in an outer periphery of at least one side of the at least one of the substrates and having a pattern portion of three or more conductor layers;

wherein a pattern portion made of either one conductor layer or two conductor layers of the at least one multi-layered flexible substrate is electrically connected with an input terminal pattern of the drive ICs, which is formed on and in a direction substantially normal to the at least one side of the at least one of the substrates;

wherein an anisotropic conductive film is used both for mounting the drive ICs on the at least one of the substrates, and for connecting the pattern portion made of either one conductor layer or two conductor layers of the at least one multi-layered flexible substrate with the input terminal pattern; and wherein the at least one multi-layered flexible substrate is folded by approximately 180 degrees at a foldable portion having one conductor layer or two conductor layers.

2. A liquid crystal display device comprising: drive ICs mounted on one of two superposed insulating substrates, wherein at least one of the substrates is transparent; and multi-layered flexible substrates are arranged in an outer periphery of two adjacent sides of four sides of the at least one of the substrates and at least one of the multi-layered flexible substrates has a pattern portion of three or more conductor layers;

wherein a pattern portion made of either one conductor layer or two conductor layers of each of the multi-layered flexible substrates is electrically connected with an input terminal pattern of the drive ICs, which is formed on and in a direction substantially normal to at least one side of the at least one of the substrates;

wherein an anisotropic conductive film is used both for mounting the drive ICs on the at least one of the substrates, and for connecting the pattern portion made of either one conductor layer or two conductor layers of the at the at least one of the multi-layered flexible substrates with the input terminal pattern; and wherein at least one of the multi-layered flexible substrates is folded by approximately 180 degrees at a foldable portion having one conductor layer or two conductor layers.

3. A liquid crystal display device comprising: drive ICs mounted on one of two superposed transparent insulating substrates, wherein at least one of the substrates is transparent; and multi-layered flexible substrates arranged in an outer periphery of two opposed longer sides and one shorter side of four sides of the at least one of the substrates and at least one of the multi-layered flexible substrates having a pattern portion of three or more conductor layers, wherein a pattern portion made of either one conductor layer or two conductor layers of each of the multi-layered flexible substrates is electrically connected with an input terminal pattern of the drive ICs, which is formed on and in a direction substantially normal to aside of the at least one of the substrates;

wherein an anisotropic conductive film is used both for mounting the drive ICs on the at least one of the substrates, and for connecting the pattern portion made of either one conductor layer or two conductor layers of each of the multi-layered flexible substrates with the input terminal pattern; and wherein at least one of the multi-layered flexible substrates is folded by approximately 180 degrees at a foldable portion having one conductor layer or two conductor layers.

4. A liquid crystal display device according to claim 1, 2 or 3, wherein at least one of the multi-layered flexible substrates has its pattern portion made of a single conductor which is electrically connected with the input terminal pattern of said drive ICs through an anisotropic conductive film, and is folded by approximately 180 degrees.

5. A liquid crystal display device according to claim 1, 2 or 3, further comprising a multi-layered rigid printed board having wiring lines for a display control circuit and a power supply circuit.

6. A liquid crystal display device according to claim 1, 2 or 3, wherein the pattern portion of three or more conductor layers of said multi-layered flexible substrate is adhered to the back of one substrate.

7. A liquid crystal display device according to claim 1, 2 or 3, wherein electronic parts are mounted on one side of the portion of said multi-layered flexible substrate, which has three or more conductor layers.

8. A liquid crystal display device according to claim 7, wherein electronic parts mounted only one side at the portion of said multi-layered flexible substrate, which has two or more conductor layers, are positioned in an opening of a shield casing.

9. A liquid crystal display device according to claim 1, 2 or 3, wherein electronic parts are mounted only on a surface of an uppermost conductor layer side of the portion of three or more conductor layers of said folded multi-layered flexible substrate, and wherein a surface of a lowermost conductor layer is adhered to the back of the at least one of the substrates.

10. A liquid crystal display device according to claim 1, 2 or 3, wherein said portion of one conductor layer or two conductor layers is projected separately to the individual drive ICs.

11. A liquid crystal display device according to claim 10, wherein said projected portion is formed therein with marks for alignment with said input terminal pattern.

12. A liquid crystal display device according to claim 1, 2 or 3, wherein said at least one multi-layered flexible substrate includes a conductor layer having a solid or mesh-shaped pattern portion fixed at a DC power supply voltage or at the ground in the portion of three or more conductor layers of said folded at least one multi-layered flexible substrate.

13. A liquid crystal display device according to claim 12, wherein said solid or mesh-shaped portion of said at least one multi-layered flexible substrate, and a solid or mesh-shaped pattern portion of a multi-layered wiring substrate for a display data controller and a power supply unit are fixed at the ground connected electrically with the ground pads of a common metallic shield casing.

14. A liquid crystal display device according to claim 2 or 3, wherein a plurality of multi-layered flexible substrates or peripheral drivers have their wiring lines electrically connected with each other through a metallic wiring pattern on said substrate.

15. A liquid crystal display device according to claim 5, wherein the multi-layered flexible substrate of a peripheral driver and the multi-layered for the display controller and the power supply unit are electrically connected through an anisotropic conductive film.

16. A liquid crystal display device comprising:

drive ICs mounted on one of two superposed insulating substrates, wherein at least one of the substrates is transparent, and at least one multi-layered flexible substrate is arranged in an outer periphery of at least one side of the at least one of the substrates and having a pattern portion of three or more conductor layers, wherein a pattern portion made of either one conductor layer or two conductor layers of the at least one multi-layered flexible substrate is electrically connected with an input terminal pattern of the drive ICs, which is formed on and in a direction substantially normal to the at least one side of the at least one substrate, wherein an anisotropic conductive film is used for connecting the pattern portion made of either one or two conductor layers of the at least one multi-layered flexible substrate with the input terminal pattern, and wherein the at least one multi-layered flexible substrate is folded at a foldable portion having one conductor layer or two conductor layers.

17. A liquid crystal display device comprising:

drive ICs mounted on one of two superposed insulating substrates, wherein at least one of the substrates is transparent, and at least one multi-layered flexible substrate is arranged in an outer periphery of at least one side of the at least one of the substrates and having a pattern portion of three or more conductor layers, wherein a pattern portion made of either one conductor layer or two conductor layers of the at least one multi-layered flexible substrate is electrically connected with an input terminal pattern of the drive ICs, which is formed on and in a direction substantially normal to the at least one side of the at least one substrate, wherein an anisotropic conductive film is used both for mounting the drive ICs on the at least one side of the substrate, and for connecting the pattern portion made of either one or two conductor layers of the at least one multi-layered flexible substrate with the input terminal pattern, and wherein the at least one multi-layered flexible substrate is folded at a foldable portion having one conductor layer or two conductor layers in the form that the edge of the pattern portion of three or more conductor layers is positioned inside the at least one of the substrates in a plane view.

\* \* \* \* \*